(12) United States Patent
Hakim et al.

(10) Patent No.: US 12,503,510 B2
(45) Date of Patent: Dec. 23, 2025

(54) SMALL SHEDDING BLOCKING AGENTS

(71) Applicant: BIOND BIOLOGICS LTD., Misgav (IL)

(72) Inventors: Motti Hakim, Kibbutz Gazit (IL); Anna Fridman-Dror, Kibbutz Dalia (IL); Dror Alishekevitz, Kiryat Tivon (IL); Edna Meilin, Kfar Vradim (IL); Ilana Mandel, Manof (IL); Tehila Ben-Moshe, Tel Aviv (IL); Avidor Shulman, Rakefet (IL); Yair Sapir, Manof (IL)

(73) Assignee: BIOND BIOLOGICS LTD., Misgav (IL)

( * ) Notice: Subject to any disclaimer, the term of this patent is extended or adjusted under 35 U.S.C. 154(b) by 1100 days.

(21) Appl. No.: 17/439,065

(22) PCT Filed: Mar. 12, 2020

(86) PCT No.: PCT/IL2020/050297
§ 371 (c)(1),
(2) Date: Sep. 14, 2021

(87) PCT Pub. No.: WO2020/183473
PCT Pub. Date: Sep. 17, 2020

(65) Prior Publication Data
US 2022/0169732 A1 Jun. 2, 2022

Related U.S. Application Data

(60) Provisional application No. 62/954,802, filed on Dec. 30, 2019, provisional application No. 62/942,240, filed on Dec. 2, 2019, provisional application No. 62/818,351, filed on Mar. 14, 2019.

(51) Int. Cl.
*C07K 16/28* (2006.01)
*A61K 39/00* (2006.01)
*A61P 35/00* (2006.01)

(52) U.S. Cl.
CPC .......... *C07K 16/2818* (2013.01); *A61P 35/00* (2018.01); *A61K 2039/507* (2013.01); *C07K 2317/22* (2013.01); *C07K 2317/24* (2013.01); *C07K 2317/569* (2013.01)

(58) Field of Classification Search
None
See application file for complete search history.

(56) References Cited

U.S. PATENT DOCUMENTS

2008/0038273 A1  2/2008  Soulillou et al.

FOREIGN PATENT DOCUMENTS

| CN | 100509849 C | 7/2009 |
|---|---|---|
| EP | 1378520 A1 | 1/2004 |
| JP | 2010195797 A | 9/2010 |
| JP | 2011528551 A | 11/2011 |
| WO | 2004096139 A2 | 11/2004 |
| WO | 2010009391 A1 | 1/2010 |
| WO | 2019175885 A1 | 9/2019 |

OTHER PUBLICATIONS

Hakim et al., In: Proceedings of the American Association for Cancer Research Annual Meeting 2022; Apr. 8-13, 2022. Philadelphia (PA): Aacr; Cancer Res 2022;82(12_Suppl): Abstract nr 654 (Year: 2022).*
Piche-Nicholas et al., MAbs. 2018; 10: 81-94. doi: 10.1080/19420862. 2017.1389355 (Year: 2018).*
Murray ME, Gavile CM, Nair JR, Koorella C, Carlson LM, Buac D, Utley A, Chesi M, Bergsagel PL, Boise LH, Lee KP. CD28-mediated pro-survival signaling induces chemotherapeutic resistance in multiple myeloma. Blood. Jun. 12, 2014;123(24):3770-9. doi: 10.1182/blood-2013-10-530964. Epub Apr. 29, 2014. PMID: 24782505; PMCID: PMC4055924.
Danquah W, Meyer-Schwesinger C, Rissiek B, Pinto C, Serracant-Prat A, Amadi M, Iacenda D, Knop JH, Hammel A, Bergmann P. Schwarz N, Assunção J, Rotthier W, Haag F, Tolosa E, Bannas P. Boué-Grabot E, Magnus T, aeremans T, Stortelers C, Koch-Nolte F. Nanobodies that block gating of the P2X7 ion channel ameliorate inflammation. Sci Transl Med. Nov. 23, 2016;8(366):366ra162. doi: 10.1126/scitranslmed.aaf8463. PMID: 27881823.
Magistrelli G, Jeannin P, Elson G, Gauchat JF, Nguyen TN, Bonnefoy JY, Delneste Y. Identification of three alternatively spliced variants of human CD28 mRNA. Biochem Biophys Res Commun. May 27, 1999;259(1):34-7. doi: 10.1006/bbrc.1999.0725. PMID: 10334911.
Hebbar M, Jeannin P, Magistrelli G, Hatron PY, Hachulla E, Devulder B, Bonnefoy JY, Delneste Y. Detection of circulating soluble CD28 in patients with systemic lupus erythematosus, primary Sjogren's syndrome and systemic sclerosis. Clin Exp Immunol. May 2004;136(2):388-92. doi: 10.1111/j.1365-2249.2004.02427.x. PMID: 15086406; PMCID: PMC1809021.
Sun Z, Yi L, Tao H, Huang J, Jin Z, Xiao Y, Feng C, Sun J. Enhancement of soluble CD28 levels in the serum of Graves' disease. Cent Eur J Immunol. 2014;39(2):216-22. doi: 10.5114/ceji. 2014.43726. Epub Jun. 27, 2014. PMID: 26155127; PMCID: PMC4440026.
Wong CK, Lit LC, Tam LS, Li EK, Lam CW. Aberrant production of soluble costimulatory molecules CTLA-4, CD28, CD80 and CD86 in patients with systemic lupus erythematosus. Rheumatology (Oxford). Aug. 2005;44(8):989-94. doi: 10.1093/rheumatology/keh663. Epub May 3, 2005. PMID: 15870153.

(Continued)

*Primary Examiner* — Christina M Borgeest
(74) *Attorney, Agent, or Firm* — The Roy Gross Law Firm, LLC; Roy D. Gross

(57) ABSTRACT

Agents that are less than 100 kilodaltons, bind a membranal immune receptor on a surface of a cell and inhibit proteolytic cleavage of the immune receptor are provided. Methods of treating cancer and improving immunotherapy comprising administering the agents are also provided.

20 Claims, 27 Drawing Sheets
Specification includes a Sequence Listing.

(56) References Cited

OTHER PUBLICATIONS

Hamzaoui K, Hamzaoui A, Bouajina L, Houman H. Circulating soluble CD28 in patients with Behçet's disease: relationship to clinical manifestations. Clin Exp Rheumatol. Jul.-Aug. 2005;23(4 Suppl 38):S49-52. PMID: 16273764.
Daniel et al., Costimulation With Agonistic ANTI-CD28 Antibodies Prevents T Cell Apoptosis and is Required for Efficient Immunotherapy With CD3xI9 Bispecific Antibodies in B Cell Lymphoma. Free communications and posters, Article 97, S42, 1997.
Hedemann N, Rogmans C, Sebens S, Wesch D, Reichert M, Schmidt-Arras D, Oberg HH, Pecks U, van Mackelenbergh M, Weimer J, Arnold N, Maass N, Bauerschlag DO. ADAM17 inhibition enhances platinum efficiency in ovarian cancer. Oncotarget. Mar. 23, 2018;9(22):16043-16058. doi: 10.18632/oncotarget.24682. PMID: 29662625; PMCID: PMC5882316.
Huang Y, Benaich N, Tape C, Kwok HF, Murphy G. Targeting the sheddase activity of ADAM17 by an anti-ADAM17 antibody D1(A12) inhibits head and neck squamous cell carcinoma cell proliferation and motility via blockage of bradykinin induced HERs transactivation. Int J Biol Sci. Jun. 21, 2014;10(7):702-14. doi: 10.7150/ijbs.9326. PMID: 25013379; PMCID: PMC4081605.
Isitmangil G, Gurleyik G, Aker FV, Coskun C, Kucukhuseyin O, Arikan S, Turan S, Talu CK, Dogan MB, Farooqi AA, Yaylim I. Association of CTLA4 and CD28 Gene Variants and Circulating Levels of Their Proteins in Patients with Breast Cancer. In Vivo. Jul.-Aug. 2016;30(4):485-93. PMID: 27381613.
Nang H, Wang K, Zhong X, Dai Y, Wu A, Li Y, Hu X. Plasma sCD28, sCTLA-4 levels in neuromyelitis optica and multiple sclerosis during relapse. J Neuroimmunol. Feb. 29, 2012;243(1-2):52-5. doi: 10.1016/j.jneuroim.2011.11.010. Epub Dec. 15, 2011. PMID: 22177277.
Igawa T, Haraya K, Hattori K. Sweeping antibody as a novel therapeutic antibody modality capable of eliminating soluble antigens from circulation. Immunol Rev. Mar. 2016;270(1):132-51. doi: 10.1111/imr.12392. PMID: 26864109.
Ip WK, Wong CK, Leung TF, Lam CW. Plasma concentrations of soluble CTLA-4, CD28, CD80 and CD86 costimulatory molecules reflect disease severity of acute asthma in children. Pediatr Pulmonol. Jul. 2006;41(7):674-82. doi: 10.1002/ppul.20432. PMID: 16703581.
Schröter C, Günther R, Rhiel L, Becker S, Toleikis L, Doerner A, Becker J, Schönemann A, Nasu D, Neuteboom B, Kolmar H, Hock B. A generic approach to engineer antibody pH-switches using combinatorial histidine scanning libraries and yeast display. MAbs. 2015;7(1):138-51. doi: 10.4161/19420862.2014.985993. PMID: 25523975; PMCID: PMC4622719.
Yang D, Giragossian C, Castellano S, Lasaro M, Xiao H, Saraf H, Hess Kenny C, Rybina I, Huang ZF, Ahlberg J, Bigwarfe T, Myzithras M, Waltz E, Roberts S, Kroe-Barrett R, Singh S. Maximizing in vivo target clearance by design of oH-dependent target binding antibodies with altered affinity to FcRn. MAbs. Oct. 2017;9(7):1105-1117. doi: 10.1080/19420862.2017.1359455. Epub Aug. 8, 2017. PMID: 28786732; PMCID: PMC5627591.
Kamphorst AO, Wieland A, Nasti T, Yang S, Zhang R, Barber DL, Konieczny BT, Daugherty CZ, Koenig L, Yu K, Sica GL, Sharpe AH, Freeman GJ, Blazar BR, Turka LA, Owonikoko TK, Pillai RN, Ramalingam SS, Araki K, Ahmed R. Rescue of exhausted CD8 T cells by PD-1-targeted therapies is CD28-dependent. Science. Mar. 31, 2017;355(6332):1423-1427. doi: 10.1126/science.aaf0683. Epub Mar. 9, 2017. PMID: 28280249; PMCID: PMC5595217.
Hui E, Cheung J, Zhu J, Su X, Taylor MJ, Wallweber HA, Sasmal DK, Huang J, Kim JM, Mellman I, Vale Rd. T cell costimulatory receptor CD28 is a primary target for PD-1-mediated inhibition. Science. Mar. 31, 2017;355 (6332):1428-1433. doi: 10.1126/science.aaf1292. Epub Mar. 9, 2017. PMID: 28280247; PMCID: PMC6286077.

\* cited by examiner

SEQUENCE LISTING

```
<160> NUMBER OF SEQ ID NOS: 49

<210> SEQ ID NO 1
<211> LENGTH: 220
<212> TYPE: PRT
<213> ORGANISM: Homo sapiens

<400> SEQUENCE: 1

Met Leu Arg Leu Leu Leu Ala Leu Asn Leu Phe Pro Ser Ile Gln Val
1               5                   10                  15

Thr Gly Asn Lys Ile Leu Val Lys Gln Ser Pro Met Leu Val Ala Tyr
            20                  25                  30

Asp Asn Ala Val Asn Leu Ser Cys Lys Tyr Ser Tyr Asn Leu Phe Ser
        35                  40                  45

Arg Glu Phe Arg Ala Ser Leu His Lys Gly Leu Asp Ser Ala Val Glu
    50                  55                  60

Val Cys Val Val Tyr Gly Asn Tyr Ser Gln Gln Leu Gln Val Tyr Ser
65                  70                  75                  80

Lys Thr Gly Phe Asn Cys Asp Gly Lys Leu Gly Asn Glu Ser Val Thr
                85                  90                  95

Phe Tyr Leu Gln Asn Leu Tyr Val Asn Gln Thr Asp Ile Tyr Phe Cys
            100                 105                 110

Lys Ile Glu Val Met Tyr Pro Pro Pro Tyr Leu Asp Asn Glu Lys Ser
        115                 120                 125

Asn Gly Thr Ile Ile His Val Lys Gly Lys His Leu Cys Pro Ser Pro
    130                 135                 140

Leu Phe Pro Gly Pro Ser Lys Pro Phe Trp Val Leu Val Val Val Gly
145                 150                 155                 160

Gly Val Leu Ala Cys Tyr Ser Leu Leu Val Thr Val Ala Phe Ile Ile
                165                 170                 175

Phe Trp Val Arg Ser Lys Arg Ser Arg Leu Leu His Ser Asp Tyr Met
            180                 185                 190

Asn Met Thr Pro Arg Arg Pro Gly Pro Thr Arg Lys His Tyr Gln Pro
        195                 200                 205

Tyr Ala Pro Pro Arg Asp Phe Ala Ala Tyr Arg Ser
    210                 215                 220

<210> SEQ ID NO 2
<211> LENGTH: 202
<212> TYPE: PRT
<213> ORGANISM: Homo sapiens

<400> SEQUENCE: 2

Asn Lys Ile Leu Val Lys Gln Ser Pro Met Leu Val Ala Tyr Asp Asn
1               5                   10                  15

Ala Val Asn Leu Ser Cys Lys Tyr Ser Tyr Asn Leu Phe Ser Arg Glu
            20                  25                  30
```

```
Phe Arg Ala Ser Leu His Lys Gly Leu Asp Ser Ala Val Glu Val Cys
        35                  40                  45

Val Val Tyr Gly Asn Tyr Ser Gln Gln Leu Gln Val Tyr Ser Lys Thr
 50                  55                  60

Gly Phe Asn Cys Asp Gly Lys Leu Gly Asn Glu Ser Val Thr Phe Tyr
 65                  70                  75                  80

Leu Gln Asn Leu Tyr Val Asn Gln Thr Asp Ile Tyr Phe Cys Lys Ile
                 85                  90                  95

Glu Val Met Tyr Pro Pro Tyr Leu Asp Asn Glu Lys Ser Asn Gly
                100                 105                 110

Thr Ile Ile His Val Lys Gly Lys His Leu Cys Pro Ser Pro Leu Phe
                115                 120                 125

Pro Gly Pro Ser Lys Pro Phe Trp Val Leu Val Val Val Gly Gly Val
        130                 135                 140

Leu Ala Cys Tyr Ser Leu Leu Val Thr Val Ala Phe Ile Ile Phe Trp
145                 150                 155                 160

Val Arg Ser Lys Arg Ser Arg Leu Leu His Ser Asp Tyr Met Asn Met
                165                 170                 175

Thr Pro Arg Arg Pro Gly Pro Thr Arg Lys His Tyr Gln Pro Tyr Ala
                180                 185                 190

Pro Pro Arg Asp Phe Ala Ala Tyr Arg Ser
        195                 200

<210> SEQ ID NO 3
<211> LENGTH: 663
<212> TYPE: DNA
<213> ORGANISM: Homo sapiens

<400> SEQUENCE: 3
atgctcaggc tgctcttggc tctcaactta ttcccttcaa ttcaagtaac aggaaacaag    60
attttggtga agcagtcgcc catgcttgta gcgtacgaca atgcggtcaa ccttagctgc   120
aagtattcct acaatctctt ctcaagggag ttccgggcat cccttcacaa aggactggat   180
agtgctgtgg aagtctgtgt tgtatatggg aattactccc agcagcttca ggtttactca   240
aaaacggggt tcaactgtga tgggaaattg gcaatgaat cagtgacatt ctacctccag   300
aatttgtatg ttaaccaaac agatatttac ttctgcaaaa ttgaagttat gtatcctcct   360
ccttacctag acaatgagaa gagcaatgga accattatcc atgtgaaagg aaaacacctt   420
tgtccaagtc ccctatttcc cggaccttct aagcccttt gggtgctggt ggtggttggt   480
ggagtcctgg cttgctatag cttgctagta acagtggcct ttattatttt ctgggtgagg   540
agtaagagga gcaggctcct gcacagtgac tacatgaaca tgactccccg ccgcccggg   600 cccacccgca agcattacca gccctatgcc ccaccacgcg acttcgcagc ctatcgctcc   660
tga                                                                 663

<210> SEQ ID NO 4
<211> LENGTH: 27
<212> TYPE: PRT
<213> ORGANISM: Homo sapiens

<400> SEQUENCE: 4

Phe Trp Val Leu Val Val Val Gly Gly Val Leu Ala Cys Tyr Ser Leu
 1               5                  10                  15

Leu Val Thr Val Ala Phe Ile Ile Phe Trp Val
                 20                  25
```

<210> SEQ ID NO 5
<211> LENGTH: 139
<212> TYPE: PRT
<213> ORGANISM: Homo sapiens

<400> SEQUENCE: 5

Met Leu Arg Leu Leu Ala Leu Asn Leu Phe Pro Ser Ile Gln Val
1               5                   10                  15

Thr Gly Asn Lys Ile Leu Val Lys Gln Ser Pro Met Leu Val Ala Tyr
            20                  25                  30

Asp Asn Ala Val Asn Leu Ser Cys Lys Tyr Ser Tyr Asn Leu Phe Ser
        35                  40                  45

Arg Glu Phe Arg Ala Ser Leu His Lys Gly Leu Asp Ser Ala Val Glu
    50                  55                  60

Val Cys Val Val Tyr Gly Asn Tyr Ser Gln Gln Leu Gln Val Tyr Ser
65                  70                  75                  80

Lys Thr Gly Phe Asn Cys Asp Gly Lys Leu Gly Asn Glu Ser Val Thr
                85                  90                  95

Phe Tyr Leu Gln Asn Leu Tyr Val Asn Gln Thr Asp Ile Tyr Phe Cys
            100                 105                 110

Lys Ile Glu Val Met Tyr Pro Pro Pro Tyr Leu Asp Asn Glu Lys Ser
        115                 120                 125

Asn Gly Thr Ile Ile His Val Lys Gly Glu Glu
    130                 135

<210> SEQ ID NO 6
<211> LENGTH: 121
<212> TYPE: PRT
<213> ORGANISM: Homo sapiens

<400> SEQUENCE: 6

Asn Lys Ile Leu Val Lys Gln Ser Pro Met Leu Val Ala Tyr Asp Asn
1               5                   10                  15

Ala Val Asn Leu Ser Cys Lys Tyr Ser Tyr Asn Leu Phe Ser Arg Glu
            20                  25                  30

Phe Arg Ala Ser Leu His Lys Gly Leu Asp Ser Ala Val Glu Val Cys
        35                  40                  45

Val Val Tyr Gly Asn Tyr Ser Gln Gln Leu Gln Val Tyr Ser Lys Thr
    50                  55                  60

Gly Phe Asn Cys Asp Gly Lys Leu Gly Asn Glu Ser Val Thr Phe Tyr
65                  70                  75                  80

Leu Gln Asn Leu Tyr Val Asn Gln Thr Asp Ile Tyr Phe Cys Lys Ile
                85                  90                  95

Glu Val Met Tyr Pro Pro Pro Tyr Leu Asp Asn Glu Lys Ser Asn Gly
            100                 105                 110

Thr Ile Ile His Val Lys Gly Glu Glu
        115                 120

<210> SEQ ID NO 7
<211> LENGTH: 538
<212> TYPE: DNA
<213> ORGANISM: Homo sapiens

<400> SEQUENCE: 7
atgctcaggc tgctcttggc tctcaactta ttcccttcaa ttcaagtaac aggaaacaag      60
attttggtga agcagtcgcc catgcttgta gcgtacgaca atgcggtcaa ccttagctgc     120

-continued

```
aagtattcct acaatctctt ctcaagggag ttccgggcat cccttcacaa aggactggat    180
agtgctgtgg aagtctgtgt tgtatatggg aattactccc agcagcttca ggtttactca    240 aaaacgggt tcaactgtga tgggaaattg gcaatgaat cagtgacatt ctacctccag     300
aatttgtatg ttaaccaaac agatatttac ttctgcaaaa ttgaagttat gtatcctcct    360
ccttacctag acaatgagaa gagcaatgga accattatcc atgtgaaagg tgaggagtaa    420
gaggagcagg ctcctgcaca gtgactacat gaacatgact ccccgccgcc ccgggcccac    480
ccgcaagcat taccagcccct atgccccacc acgcgacttc gcagcctatc gctcctga    538
```

<210> SEQ ID NO 8
<211> LENGTH: 110
<212> TYPE: PRT
<213> ORGANISM: Homo sapiens

<400> SEQUENCE: 8

Met Leu Val Ala Tyr Asp Asn Ala Val Asn Leu Ser Cys Lys Tyr Ser
1               5                   10                  15

Tyr Asn Leu Phe Ser Arg Glu Phe Arg Ala Ser Leu His Lys Gly Leu
            20                  25                  30

Asp Ser Ala Val Glu Val Cys Val Val Tyr Gly Asn Tyr Ser Gln Gln
        35                  40                  45

Leu Gln Val Tyr Ser Lys Thr Gly Phe Asn Cys Asp Gly Lys Leu Gly
    50                  55                  60

Asn Glu Ser Val Thr Phe Tyr Leu Gln Asn Leu Tyr Val Asn Gln Thr
65                  70                  75                  80

Asp Ile Tyr Phe Cys Lys Ile Glu Val Met Tyr Pro Pro Pro Tyr Leu
                85                  90                  95

Asp Asn Glu Lys Ser Asn Gly Thr Ile Ile His Val Lys Gly
            100                 105                 110

<210> SEQ ID NO 9
<211> LENGTH: 16
<212> TYPE: PRT
<213> ORGANISM: Homo sapiens

<400> SEQUENCE: 9

Gly Lys His Leu Cys Pro Ser Pro Leu Phe Pro Gly Pro Ser Lys Pro
1               5                   10                  15

<210> SEQ ID NO 10
<211> LENGTH: 19
<212> TYPE: PRT
<213> ORGANISM: Homo sapiens

<400> SEQUENCE: 10

His Val Lys Gly Lys His Leu Cys Pro Ser Pro Leu Phe Pro Gly Pro
1               5                   10                  15

Ser Lys Pro

<210> SEQ ID NO 11
<211> LENGTH: 7
<212> TYPE: PRT
<213> ORGANISM: Artificial Sequence
<220> FEATURE:
<223> OTHER INFORMATION: Synthetic

<400> SEQUENCE: 11

Gly Tyr Thr Leu Thr Asn Tyr

```
1               5

<210> SEQ ID NO 12
<211> LENGTH: 6
<212> TYPE: PRT
<213> ORGANISM: Artificial Sequence
<220> FEATURE:
<223> OTHER INFORMATION: Synthetic

<400> SEQUENCE: 12

Asn Thr Tyr Thr Gly Lys
1               5

<210> SEQ ID NO 13
<211> LENGTH: 9
<212> TYPE: PRT
<213> ORGANISM: Artificial Sequence
<220> FEATURE:
<223> OTHER INFORMATION: Synthetic

<400> SEQUENCE: 13

Gly Asp Ala Asn Gln Gln Phe Ala Tyr
1               5

<210> SEQ ID NO 14
<211> LENGTH: 11
<212> TYPE: PRT
<213> ORGANISM: Artificial Sequence
<220> FEATURE:
<223> OTHER INFORMATION: Synthetic

<400> SEQUENCE: 14

Lys Ala Ser Gln Asp Ile Asn Ser Tyr Leu Ser
1               5                   10

<210> SEQ ID NO 15
<211> LENGTH: 7
<212> TYPE: PRT
<213> ORGANISM: Artificial Sequence
<220> FEATURE:
<223> OTHER INFORMATION: Synthetic

<400> SEQUENCE: 15

Arg Ala Asn Arg Leu Val Asp
1               5

<210> SEQ ID NO 16
<211> LENGTH: 9
<212> TYPE: PRT
<213> ORGANISM: Artificial Sequence
<220> FEATURE:
<223> OTHER INFORMATION: Synthetic

<400> SEQUENCE: 16

Leu Gln Tyr Asp Glu Phe Pro Pro Thr
1               5

<210> SEQ ID NO 17
<211> LENGTH: 10
<212> TYPE: PRT
<213> ORGANISM: Artificial Sequence
<220> FEATURE:
<223> OTHER INFORMATION: Synthetic

<400> SEQUENCE: 17

Gly Phe Thr Phe Ser Ser Tyr Tyr Met Ser
1               5                   10
```

```
<210> SEQ ID NO 18
<211> LENGTH: 17
<212> TYPE: PRT
<213> ORGANISM: Artificial Sequence
<220> FEATURE:
<223> OTHER INFORMATION: Synthetic

<400> SEQUENCE: 18

Thr Ile Ser Asp Gly Gly Asp Asn Thr Tyr Tyr Ala Gly Thr Val Thr
1               5                   10                  15

Gly

<210> SEQ ID NO 19
<211> LENGTH: 9
<212> TYPE: PRT
<213> ORGANISM: Artificial Sequence
<220> FEATURE:
<223> OTHER INFORMATION: Synthetic

<400> SEQUENCE: 19

Ile His Trp Pro Tyr Tyr Phe Asp Ser
1               5

<210> SEQ ID NO 20
<211> LENGTH: 10
<212> TYPE: PRT
<213> ORGANISM: Artificial Sequence
<220> FEATURE:
<223> OTHER INFORMATION: Synthetic

<400> SEQUENCE: 20

Arg Ala Ser Ser Ser Val Ser Tyr Met Asn
1               5                   10

<210> SEQ ID NO 21
<211> LENGTH: 7
<212> TYPE: PRT
<213> ORGANISM: Artificial Sequence
<220> FEATURE:
<223> OTHER INFORMATION: Synthetic

<400> SEQUENCE: 21

Ala Thr Ser Asp Leu Ala Ser
1               5

<210> SEQ ID NO 22
<211> LENGTH: 9
<212> TYPE: PRT
<213> ORGANISM: Artificial Sequence
<220> FEATURE:
<223> OTHER INFORMATION: Synthetic

<400> SEQUENCE: 22

Gln Gln Trp Ser Ser His Pro Pro Thr
1               5

<210> SEQ ID NO 23
<211> LENGTH: 118
<212> TYPE: PRT
<213> ORGANISM: Artificial Sequence
<220> FEATURE:
<223> OTHER INFORMATION: Synthetic

<400> SEQUENCE: 23

Asp Val Lys Leu Val Glu Ser Gly Gly Gly Leu Val Lys Leu Gly Gly
```

```
1               5                   10                  15
Ser Leu Lys Leu Ser Cys Val Ala Ser Gly Phe Thr Phe Ser Ser Tyr
            20                  25                  30

Tyr Met Ser Trp Val Arg Gln Thr Pro Glu Lys Arg Leu Glu Trp Val
            35                  40                  45

Ala Thr Ile Ser Asp Gly Gly Asp Asn Thr Tyr Tyr Ala Gly Thr Val
            50                  55                  60

Thr Gly Arg Phe Thr Ile Ser Arg Asp Phe Ala Lys Asn Thr Leu Tyr
65                  70                  75                  80

Leu Gln Met Asn Ser Leu Thr Ser Glu Asp Thr Ala Val Tyr Tyr Cys
                85                  90                  95

Ala Arg Ile His Trp Pro Tyr Tyr Phe Asp Ser Trp Gly Gln Gly Thr
                100                 105                 110

Thr Leu Thr Val Ser Ser
            115
```

<210> SEQ ID NO 24
<211> LENGTH: 354
<212> TYPE: DNA
<213> ORGANISM: Artificial Sequence
<220> FEATURE:
<223> OTHER INFORMATION: Synthetic

<400> SEQUENCE: 24

```
gacgtgaagc tcgtggagtc tggggggaggc ttagtgaagc ttggagggtc cctgaaactc     60
tcctgtgtag cctctggatt cactttcagt agctattaca tgtcttgggt tcgccagact    120
ccggagaaga ggctggagtg ggtcgcgacc ataagtgatg gtggtgataa cacctactac    180
gcaggcactg tgacgggccg attcaccatc tccagagact tgccaagaa caccctgtac    240 ctgcaaatga acagtctgac ctctgaggac acagccgtgt attactgtgc aagaattcat    300
tggccttact attttgactc ctggggccaa ggcaccactc tcacagtctc ctca           354
```

<210> SEQ ID NO 25
<211> LENGTH: 106
<212> TYPE: PRT
<213> ORGANISM: Artificial Sequence
<220> FEATURE:
<223> OTHER INFORMATION: Synthetic

<400> SEQUENCE: 25

```
Gln Phe Val Leu Ser Gln Ser Pro Ala Ile Leu Ser Ala Ser Pro Gly
1               5                   10                  15

Glu Met Leu Thr Met Thr Cys Arg Ala Ser Ser Ser Val Ser Tyr Met
            20                  25                  30

Asn Trp Tyr Gln Gln Lys Pro Gly Ser Ser Pro Lys Pro Trp Ile Tyr
            35                  40                  45

Ala Thr Ser Asp Leu Ala Ser Gly Val Pro Ala Arg Phe Ser Gly Ser
            50                  55                  60

Gly Ser Gly Thr Ser Tyr Ser Leu Thr Ile Ser Arg Val Glu Ala Glu
65                  70                  75                  80

Asp Ala Ala Thr Tyr Tyr Cys Gln Gln Trp Ser Ser His Pro Pro Thr
                85                  90                  95

Phe Gly Gly Gly Thr Lys Leu Glu Ile Arg
                100                 105
```

<210> SEQ ID NO 26
<211> LENGTH: 318

-continued

<212> TYPE: DNA
<213> ORGANISM: Artificial Sequence
<220> FEATURE:
<223> OTHER INFORMATION: Synthetic

<400> SEQUENCE: 26

```
caatttgttc tctcccagtc tccagcaatc ctgtctgcat ctcccgggga gatgctcaca      60
atgacttgca gggccagctc aagtgtaagt tatatgaact ggtatcagca gaagccagga     120
tcttcccca aaccctggat ttatgccaca tccgacctgg cttctggagt ccctgctcgc     180
ttcagtggca gtgggtctgg gacctcttat tctctcacaa tcagcagagt ggaggctgaa     240
gatgctgcca cttattactg ccagcagtgg agtagtcacc cacccacgtt cggagggggg     300
accaagctgg aaataaga                                                   318
```

<210> SEQ ID NO 27
<211> LENGTH: 15
<212> TYPE: PRT
<213> ORGANISM: Homo sapiens

<400> SEQUENCE: 27

Lys Gly Lys His Leu Cys Pro Ser Pro Leu Phe Pro Gly Pro Ser
1               5                   10                  15

<210> SEQ ID NO 28
<211> LENGTH: 134
<212> TYPE: PRT
<213> ORGANISM: Homo sapiens

<400> SEQUENCE: 28

Asn Lys Ile Leu Val Lys Gln Ser Pro Met Leu Val Ala Tyr Asp Asn
1               5                   10                  15

Ala Val Asn Leu Ser Cys Lys Tyr Ser Tyr Asn Leu Phe Ser Arg Glu
                20                  25                  30

Phe Arg Ala Ser Leu His Lys Gly Leu Asp Ser Ala Val Glu Val Cys
            35                  40                  45

Val Val Tyr Gly Asn Tyr Ser Gln Gln Leu Gln Val Tyr Ser Lys Thr
        50                  55                  60

Gly Phe Asn Cys Asp Gly Lys Leu Gly Asn Glu Ser Val Thr Phe Tyr
65                  70                  75                  80

Leu Gln Asn Leu Tyr Val Asn Gln Thr Asp Ile Tyr Phe Cys Lys Ile
                85                  90                  95

Glu Val Met Tyr Pro Pro Pro Tyr Leu Asp Asn Glu Lys Ser Asn Gly
            100                 105                 110

Thr Ile Ile His Val Lys Gly Lys His Leu Cys Pro Ser Pro Leu Phe
        115                 120                 125

Pro Gly Pro Ser Lys Pro
    130

<210> SEQ ID NO 29
<211> LENGTH: 17
<212> TYPE: PRT
<213> ORGANISM: Artificial Sequence
<220> FEATURE:
<223> OTHER INFORMATION: Synthetic

<400> SEQUENCE: 29

Gly Lys His Leu Cys Pro Ser Pro Leu Phe Pro Gly Pro Ser Lys Pro
1               5                   10                  15

Lys

<210> SEQ ID NO 30
<211> LENGTH: 117
<212> TYPE: PRT
<213> ORGANISM: Artificial
<220> FEATURE:
<223> OTHER INFORMATION: Synthetic

<400> SEQUENCE: 30

```
Glu Val Gln Leu Val Glu Ser Gly Gly Gly Leu Val Gln Ala Gly Glu
1               5                   10                  15

Ser Leu Arg Leu Ser Cys Ala Ala Ser Gly Ser Ile Ala Ser Ile Asn
            20                  25                  30

Ala Met Gly Trp Tyr Arg Gln Ala Pro Gly Ser Gln Arg Glu Leu Val
        35                  40                  45

Ala Ala Ile Ser Gly Gly Gly Asp Thr Tyr Tyr Ala Asp Ser Val Lys
    50                  55                  60

Gly Arg Phe Thr Ile Ser Arg Asp Asn Ala Lys Thr Thr Val Tyr Leu
65                  70                  75                  80

Gln Met Asn Ser Leu Arg Pro Glu Asp Thr Ala Val Tyr Tyr Cys Val
                85                  90                  95

Val Asp Leu Tyr Gly Ser Asp Tyr Trp Asp Trp Gly Gln Gly Thr Gln
            100                 105                 110

Val Thr Val Ser Ser
        115
```

<210> SEQ ID NO 31
<211> LENGTH: 117
<212> TYPE: PRT
<213> ORGANISM: Artificial
<220> FEATURE:
<223> OTHER INFORMATION: Stnthetic

<400> SEQUENCE: 31

```
Glu Val Gln Leu Val Glu Ser Gly Gly Gly Leu Val Gln Ala Gly Gly
1               5                   10                  15

Ser Leu Arg Leu Ser Cys Ala Ala Ser Gly Ser Leu Phe Ser Ile Asn
            20                  25                  30

Ala Met Ala Trp Tyr Arg Gln Ala Pro Gly Lys Gln Arg Glu Leu Val
        35                  40                  45

Ala Ala Ile Thr Ser Ser Gly Ser Thr Asn Tyr Ala Asn Ser Val Lys
    50                  55                  60

Gly Arg Phe Thr Val Ser Arg Asp Asn Ala Lys Asn Thr Met Tyr Leu
65                  70                  75                  80

Gln Met Asn Ser Leu Lys Pro Glu Asp Thr Ala Val Tyr Tyr Cys Val
                85                  90                  95

Val Asp Glu Tyr Gly Ser Asp Tyr Trp Ile Trp Gly Gln Gly Thr Gln
            100                 105                 110

Val Thr Val Ser Ser
        115
```

<210> SEQ ID NO 32
<211> LENGTH: 117
<212> TYPE: PRT
<213> ORGANISM: Artificial
<220> FEATURE:
<223> OTHER INFORMATION: Synthetic

<400> SEQUENCE: 32

```
Gln Val Gln Leu Val Glu Ser Gly Gly Gly Leu Val Gln Ala Gly Gly
1               5                   10                  15

Ser Leu Arg Leu Ser Cys Ala Ala Ser Gly Ser Ile Phe Ser Ile Asn
            20                  25                  30

Ala Met Gly Trp Tyr Arg Gln Ala Pro Gly Lys Gln Arg Glu Arg Val
        35                  40                  45

Ala Ala Ile Thr Ser Gly Gly Ser Thr Asn Tyr Ala Asp Ser Val Lys
50                  55                  60

Gly Arg Phe Thr Ile Ser Arg Asp Asn Ala Lys Asn Thr Val Tyr Leu
65                  70                  75                  80

Gln Met Asn Asn Leu Glu Pro Arg Asp Ala Gly Val Tyr Tyr Cys Val
            85                  90                  95

Val Asp Leu Tyr Gly Glu Asp Tyr Trp Ile Trp Gly Gln Gly Thr Gln
            100                 105                 110

Val Thr Val Ser Ser
            115
```

```
<210> SEQ ID NO 33
<211> LENGTH: 5
<212> TYPE: PRT
<213> ORGANISM: Artificial
<220> FEATURE:
<223> OTHER INFORMATION: Synthetic

<400> SEQUENCE: 33

Ile Asn Ala Met Gly
1               5

<210> SEQ ID NO 34
<211> LENGTH: 16
<212> TYPE: PRT
<213> ORGANISM: Artificial
<220> FEATURE:
<223> OTHER INFORMATION: Synthetic

<400> SEQUENCE: 34

Ala Ile Ser Gly Gly Gly Asp Thr Tyr Tyr Ala Asp Ser Val Lys Gly
1               5                   10                  15

<210> SEQ ID NO 35
<211> LENGTH: 9
<212> TYPE: PRT
<213> ORGANISM: Artificial
<220> FEATURE:
<223> OTHER INFORMATION: Synthetic

<400> SEQUENCE: 35

Asp Leu Tyr Gly Ser Asp Tyr Trp Asp
1               5

<210> SEQ ID NO 36
<211> LENGTH: 5
<212> TYPE: PRT
<213> ORGANISM: Artificial
<220> FEATURE:
<223> OTHER INFORMATION: Synthetic

<400> SEQUENCE: 36

Ile Asn Ala Met Ala
1               5

<210> SEQ ID NO 37
<211> LENGTH: 16
```

```
<212> TYPE: PRT
<213> ORGANISM: Artificial
<220> FEATURE:
<223> OTHER INFORMATION: Synthetic

<400> SEQUENCE: 37

Ala Ile Thr Ser Ser Gly Ser Thr Asn Tyr Ala Asn Ser Val Lys Gly
1               5                   10                  15

<210> SEQ ID NO 38
<211> LENGTH: 9
<212> TYPE: PRT
<213> ORGANISM: Artificial
<220> FEATURE:
<223> OTHER INFORMATION: Synthetic

<400> SEQUENCE: 38

Asp Glu Tyr Gly Ser Asp Tyr Trp Ile
1               5

<210> SEQ ID NO 39
<211> LENGTH: 16
<212> TYPE: PRT
<213> ORGANISM: Artificial
<220> FEATURE:
<223> OTHER INFORMATION: Synthetic

<400> SEQUENCE: 39

Ala Ile Thr Ser Gly Gly Ser Thr Asn Tyr Ala Asp Ser Val Lys Gly
1               5                   10                  15

<210> SEQ ID NO 40
<211> LENGTH: 9
<212> TYPE: PRT
<213> ORGANISM: Artificial
<220> FEATURE:
<223> OTHER INFORMATION: Synthetic

<400> SEQUENCE: 40

Asp Leu Tyr Gly Glu Asp Tyr Trp Ile
1               5

<210> SEQ ID NO 41
<211> LENGTH: 5
<212> TYPE: PRT
<213> ORGANISM: Artificial
<220> FEATURE:
<223> OTHER INFORMATION: Synthetic
<220> FEATURE:
<221> NAME/KEY: X
<222> LOCATION: (5)..(5)
<223> OTHER INFORMATION: X is G or A

<400> SEQUENCE: 41

Ile Asn Ala Met Xaa
1               5

<210> SEQ ID NO 42
<211> LENGTH: 16
<212> TYPE: PRT
<213> ORGANISM: Artificial
<220> FEATURE:
<223> OTHER INFORMATION: Synthetic
<220> FEATURE:
<221> NAME/KEY: X
<222> LOCATION: (3)..(3)
<223> OTHER INFORMATION: X is S or T
<220> FEATURE:
<221> NAME/KEY: X
```

```
<222> LOCATION: (4)..(4)
<223> OTHER INFORMATION: X is G or S
<220> FEATURE:
<221> NAME/KEY: X
<222> LOCATION: (5)..(5)
<223> OTHER INFORMATION: X is G or S
<220> FEATURE:
<221> NAME/KEY: X
<222> LOCATION: (7)..(7)
<223> OTHER INFORMATION: X is D or S
<220> FEATURE:
<221> NAME/KEY: X
<222> LOCATION: (9)..(9)
<223> OTHER INFORMATION: X is Y or N
<220> FEATURE:
<221> NAME/KEY: X
<222> LOCATION: (12)..(12)
<223> OTHER INFORMATION: X is D or N

<400> SEQUENCE: 42

Ala Ile Xaa Xaa Xaa Gly Xaa Thr Xaa Tyr Ala Xaa Ser Val Lys Gly
1               5                   10                  15

<210> SEQ ID NO 43
<211> LENGTH: 9
<212> TYPE: PRT
<213> ORGANISM: Artificial
<220> FEATURE:
<223> OTHER INFORMATION: Synthetic
<220> FEATURE:
<221> NAME/KEY: X
<222> LOCATION: (2)..(2)
<223> OTHER INFORMATION: X is E or L
<220> FEATURE:
<221> NAME/KEY: X
<222> LOCATION: (5)..(5)
<223> OTHER INFORMATION: X is E or S
<220> FEATURE:
<221> NAME/KEY: X
<222> LOCATION: (9)..(9)
<223> OTHER INFORMATION: X is D or I

<400> SEQUENCE: 43

Asp Xaa Tyr Gly Xaa Asp Tyr Trp Xaa
1               5

<210> SEQ ID NO 44
<211> LENGTH: 9
<212> TYPE: PRT
<213> ORGANISM: Artificial
<220> FEATURE:
<223> OTHER INFORMATION: Synthetic
<220> FEATURE:
<221> NAME/KEY: X
<222> LOCATION: (2)..(2)
<223> OTHER INFORMATION: X is E or L
<220> FEATURE:
<221> NAME/KEY: X
<222> LOCATION: (9)..(9)
<223> OTHER INFORMATION: X is D or I

<400> SEQUENCE: 44

Asp Xaa Tyr Gly Ser Asp Tyr Trp Xaa
1               5

<210> SEQ ID NO 45
<211> LENGTH: 126
<212> TYPE: PRT
<213> ORGANISM: Artificial
<220> FEATURE:
<223> OTHER INFORMATION: Synthetic

<400> SEQUENCE: 45
```

Glu Val Gln Leu Val Glu Ser Gly Gly Gly Leu Val Gln Ala Gly Glu
1               5                   10                  15

Ser Leu Arg Leu Ser Cys Ala Ala Ser Gly Ser Ile Ala Ser Ile Asn
            20                  25                  30

Ala Met Gly Trp Tyr Arg Gln Ala Pro Gly Ser Gln Arg Glu Leu Val
        35                  40                  45

Ala Ala Ile Ser Gly Gly Asp Thr Tyr Tyr Ala Asp Ser Val Lys
    50                  55                  60

Gly Arg Phe Thr Ile Ser Arg Asp Asn Ala Lys Thr Thr Val Tyr Leu
65              70                  75                  80

Gln Met Asn Ser Leu Arg Pro Glu Asp Thr Ala Val Tyr Tyr Cys Val
            85                  90                  95

Val Asp Leu Tyr Gly Ser Asp Tyr Trp Asp Trp Gly Gln Gly Thr Gln
            100                 105                 110

Val Thr Val Ser Ser Ala Ala Ala His His His His His His
            115                 120                 125

<210> SEQ ID NO 46
<211> LENGTH: 126
<212> TYPE: PRT
<213> ORGANISM: Artificial
<220> FEATURE:
<223> OTHER INFORMATION: Synthetic

<400> SEQUENCE: 46

Glu Val Gln Leu Val Glu Ser Gly Gly Gly Leu Val Gln Ala Gly Gly
1               5                   10                  15

Ser Leu Arg Leu Ser Cys Ala Ala Ser Gly Ser Leu Phe Ser Ile Asn
            20                  25                  30

Ala Met Ala Trp Tyr Arg Gln Ala Pro Gly Lys Gln Arg Glu Leu Val
        35                  40                  45

Ala Ala Ile Thr Ser Ser Gly Ser Thr Asn Tyr Ala Asn Ser Val Lys
    50                  55                  60

Gly Arg Phe Thr Val Ser Arg Asp Asn Ala Lys Asn Thr Met Tyr Leu
65              70                  75                  80

Gln Met Asn Ser Leu Lys Pro Glu Asp Thr Ala Val Tyr Tyr Cys Val
            85                  90                  95

Val Asp Glu Tyr Gly Ser Asp Tyr Trp Ile Trp Gly Gln Gly Thr Gln
            100                 105                 110

Val Thr Val Ser Ser Ala Ala Ala His His His His His His
            115                 120                 125

<210> SEQ ID NO 47
<211> LENGTH: 126
<212> TYPE: PRT
<213> ORGANISM: Artificial
<220> FEATURE:
<223> OTHER INFORMATION: Synthetic

<400> SEQUENCE: 47

Gln Val Gln Leu Val Glu Ser Gly Gly Gly Leu Val Gln Ala Gly Gly
1               5                   10                  15

Ser Leu Arg Leu Ser Cys Ala Ala Ser Gly Ser Ile Phe Ser Ile Asn
            20                  25                  30

Ala Met Gly Trp Tyr Arg Gln Ala Pro Gly Lys Gln Arg Glu Arg Val
        35                  40                  45

Ala Ala Ile Thr Ser Gly Gly Ser Thr Asn Tyr Ala Asp Ser Val Lys

```
                    50                  55                  60
Gly Arg Phe Thr Ile Ser Arg Asp Asn Ala Lys Asn Thr Val Tyr Leu
 65                  70                  75                  80

Gln Met Asn Asn Leu Glu Pro Arg Asp Ala Gly Val Tyr Tyr Cys Val
                 85                  90                  95

Val Asp Leu Tyr Gly Glu Asp Tyr Trp Ile Trp Gly Gln Gly Thr Gln
             100                 105                 110

Val Thr Val Ser Ser Ala Ala Ala His His His His His His
         115                 120                 125

<210> SEQ ID NO 48
<211> LENGTH: 145
<212> TYPE: PRT
<213> ORGANISM: Homo sapiens

<400> SEQUENCE: 48

Met Leu Arg Leu Leu Ala Leu Asn Leu Phe Pro Ser Ile Gln Val
  1               5                  10                  15

Thr Gly Asn Lys Ile Leu Val Lys Gln Ser Pro Met Leu Val Ala Tyr
                 20                  25                  30

Asp Asn Ala Val Asn Leu Ser Cys Lys Tyr Ser Tyr Asn Leu Phe Ser
             35                  40                  45

Arg Glu Phe Arg Ala Ser Leu His Lys Gly Leu Asp Ser Ala Val Glu
         50                  55                  60

Val Cys Val Val Tyr Gly Asn Tyr Ser Gln Gln Leu Gln Val Tyr Ser
 65                  70                  75                  80

Lys Thr Gly Phe Asn Cys Asp Gly Lys Leu Gly Asn Glu Ser Val Thr
                 85                  90                  95

Phe Tyr Leu Gln Asn Leu Tyr Val Asn Gln Thr Asp Ile Tyr Phe Cys
             100                 105                 110

Lys Ile Glu Val Met Tyr Pro Pro Pro Tyr Leu Asp Asn Glu Lys Ser
         115                 120                 125

Asn Gly Thr Ile Ile His Val Lys Gly Lys His Leu Cys Pro Ser Pro
     130                 135                 140

Leu
145

<210> SEQ ID NO 49
<211> LENGTH: 127
<212> TYPE: PRT
<213> ORGANISM: Homo sapiens

<400> SEQUENCE: 49

Asn Lys Ile Leu Val Lys Gln Ser Pro Met Leu Val Ala Tyr Asp Asn
  1               5                  10                  15

Ala Val Asn Leu Ser Cys Lys Tyr Ser Tyr Asn Leu Phe Ser Arg Glu
                 20                  25                  30

Phe Arg Ala Ser Leu His Lys Gly Leu Asp Ser Ala Val Glu Val Cys
             35                  40                  45

Val Val Tyr Gly Asn Tyr Ser Gln Gln Leu Gln Val Tyr Ser Lys Thr
         50                  55                  60

Gly Phe Asn Cys Asp Gly Lys Leu Gly Asn Glu Ser Val Thr Phe Tyr
 65                  70                  75                  80
```

```
Leu Gln Asn Leu Tyr Val Asn Gln Thr Asp Ile Tyr Phe Cys Lys Ile
                85                  90                  95
Glu Val Met Tyr Pro Pro Pro Tyr Leu Asp Asn Glu Lys Ser Asn Gly
            100                 105                 110
Thr Ile Ile His Val Lys Gly Lys His Leu Cys Pro Ser Pro Leu
        115                 120                 125
```

SMALL SHEDDING BLOCKING AGENTS

CROSS REFERENCE TO RELATED APPLICATIONS

This application is a National Phase of PCT Patent Application No. PCT/IL2020/050297 having International filing date of Mar. 12, 2020 which claims the benefit of priority of U.S. Provisional Patent Application No. 62/954,802, filed Dec. 30, 2019, U.S. Provisional Patent Application No. 62/942,240, filed Dec. 2, 2019, and U.S. Provisional Patent Application No. 62/818,351, filed Mar. 14, 2019, and the contents of which are all incorporated herein by reference in their entirety.

FIELD OF INVENTION

The present invention is in the field of immune regulation and immunotherapy.

BACKGROUND OF THE INVENTION

The adaptive immune system plays a critical role in the regulation and protection against pathogens and cancer cells, mainly by orchestrating the stimulation of antigen specific helper CD4+ and cytotoxic CD8+ T cells. Durable and persistent activation of T cells by antigen presenting cells (APC), involves i) engagement of the T cell receptor (TCR) with peptides presented by major histocompatibility complexes (MHCs) on APC; and ii) co-stimulatory CD28 receptors on T cells binding B7-1 (CD80) and B7-2 (CD86) ligands expressed also by the APC. The biological consequences of CD28 co-stimulation are numerous and include control of the T cell cycle, expansion, differentiation, as well as amplification of TCR stimulation by lowering the threshold needed for achieving immune effector function.

In contrast to the activating co-stimulatory molecule CD28, the structurally homolog, cytotoxic T lymphocyte associated 4 (CTLA-4), is an inhibitory co-stimulatory receptor, with membrane expression driven by the triggering of CD28. Both, CTLA-4 and CD28 are type I trans-membrane proteins. Their extracellular portion is composed with one V-set immunoglobulin super family (Ig-V) domain, which is homo-covalently linked by a cysteine residue located outside the IgV domain in proximity to the trans-membrane region. Despite the resemblance, CTLA-4 and CD28 differ in terms of affinities and quaternary structural arrangements. CTLA-4 was found to have higher binding affinities to B7 molecules, and a different dimerization mode from CD28 resulting in dissimilar stoichiometric binding with the shared ligands. CD28 exhibits a mono-valent binding stoichiometry, while CTLA-4 interacts in a bivalent fashion. Hence, CTLA-4 binds B7 molecules with a much higher affinity and avidity than CD28 and consequently downregulates T cell responses and favors the onset of antigen specific tolerance.

It has been indicated that some co-stimulatory molecules have several physiological forms. Alongside membrane-bound forms, soluble forms have been described that are expressed in naive immune cells, increasing the complexity of T cell biology. The soluble form of CD28 (sCD28) has been ascribed to alternatively spliced gene product. The splicing event results in a frame shift with the consequence of addition of two glutamate residues after glycine at position 137 before translational termination. The final product lacks the entire transmembrane and cytoplasmic regions and importantly is lacking the cysteine residue, at position 141, that mediates the disulfide linkage of dimeric CD28 (Magistrelli G., Biochem Biophy Res Commun, 1999). The biological function and counter-receptor binding of the monomeric CD28 soluble form was examined (Hebbar, M., Clin Exp Immunol, 2004) and was shown to also inhibit T cell proliferation. Still, in the case of dimeric sCD28 it has been suggested to have a regulatory role to suppress T cell functionality by binding to B7 molecules (Sun, Z., Centr Eur J Immunol, 2014; Hebbar, M., Clin Exp Immunol, 2004). Remarkably, an elevation in the number of sCD28 molecules in the serum of patients with auto-immune disorders has been reported (Wong, C. K., Rheumatol, 2005; Hamzaoui, K., Clin Exp Rheumatol, 2005; Hebbar, M., Clin Exp Immunol, 2004; Sun, Z., Clin Immunol, 2014). The definite source of sCD28 is debated. Using in-vitro models of T cell activation, reflecting the durable inflammation state of T cells in auto-immune patients, it has been shown that during the process of T cell activation the transcription of the alternative soluble form is repressed and only full-length membrane form of CD28 is evident, while the amount of the sCD28 in the culture is elevated (Hebbar, M., Clin Exp Immunol, 2004). This phenomenon led to the proposition that active shedding of the membrane form of CD28 is the cause for elevated soluble molecules in the serum, however, this has yet to be proven. Active shedding during T cell activation was described in the past as a regulatory mechanism to counteract persistent activation by the proteolysis of adhesion molecules.

While CTLA-4 limits the amplitude of early T cell responses, another inhibitory receptor, PD-1, suppresses T cell function in periphery. The expression of PD-1 is elevated during the activation of T cells, and its known ligands are the B7 family homologs: B7-H1 (PD-L1) and B7-H2 (PD-L2). These homologs are found on APC and cancer cells and drive activated T cells into a state of cellular anergy, leading to a dampened immune response. Accordingly, targeted therapies for the CTLA-4 and PD-1/PD-L1 axis have shown clinical activity in a wide variety of cancer types. Recently, studies have shown that the signaling pathway of CD28 is targeted and repressed by PD-1 (Hui, E., Science, 2017) and concomitantly for an effective PD-1 therapy to take place an intact active CD28/B7 axis is essential (Kamphorst, A. O., Science, 2017).

However, not all patients respond to PD-1 based immunotherapy or immunotherapy in general, and those that do often relapse. Methods and molecules that can improve the ability of a patient's immune cells to attack cancer are thus greatly in need.

SUMMARY OF THE INVENTION

The present invention provides agents smaller than 100 kilodaltons that bind membranal CD28 (mCD28) on the surface of a cell and inhibit proteolytic cleavage of mCD28. Methods of treating and preventing cancer and improving PD-1/PD-L1 based immunotherapy comprising administering the agents are also provided.

According to a first aspect, there is provided an agent that binds membranal CD28 (mCD28) on a surface of a cell and inhibits proteolytic cleavage of the mCD28, wherein the agent is smaller than 100 kilodaltons (kDa).

According to another aspect, there is provided a method of decreasing soluble CD28 (sCD28) levels in a subject in need thereof, the method comprising administering an agent of the invention.

According to another aspect, there is provided a method of treating and/or preventing cancer in a subject in need thereof, the method comprising administering an agent of the invention.

According to another aspect, there is provided a method of improving PD-1 and/or PD-L1 based immunotherapy in a subject in need thereof, the method comprising administering an agent of the invention.

According to another aspect, there is provided a method of generating an agent that inhibits proteolytic cleavage of mCD28 on a surface of a cell, comprising at least one of:
  a. obtaining an agent that binds to a CD28 extracellular domain or fragment thereof wherein the agent is smaller than 100 kDa;
  b. testing binding of the obtained agent to mCD28 on a cell surface; and
  c. selecting an agent that binds cell surface mCD28; and
  d. culturing a host cell comprising one or more vectors comprising a nucleic acid sequence encoding an agent, wherein the nucleic acid sequence is that of an agent that was selected by:
    i. obtaining an agent that binds to a CD28 extracellular domain or fragment thereof wherein the agent is smaller than 100 kDa;
    ii. testing binding of the obtained agent to mCD28 on a cell surface; and
    iii. selecting an agent that binds cell surface mCD28;
  thereby generating an agent that inhibits proteolytic cleavage of mCD28 on a surface of a cell.

According to another aspect, there is provided an agent produced by a method of the invention.

According to another aspect, there is provided a pharmaceutical composition comprising an agent of the invention, and a pharmaceutically acceptable carrier, excipient or adjuvant.

According to another aspect, there is provided a method of treating and/or preventing cancer, improving PD-1 and/or PD-L1 based immunotherapy, or decreasing sCD28 levels in a subject in need thereof, the method comprising administering a pharmaceutical composition of the invention.

According to another aspect, there is provided a kit comprising at least one agent of the invention.

According to some embodiments, the agent is selected from an antigen binding fragment of an antibody, a Fab fragment, a single chain antibody, a single domain antibody, a small molecule and a peptide that specifically binds to CD28.

According to some embodiments, the agent is smaller than 50 kDa.

According to some embodiments, the single domain antibody is a camelid or shark antibody.

According to some embodiments, the camelid antibody comprises three CDRs wherein:
  CDR1 comprises the amino acid sequence set forth in SEQ ID NO: 33 (INAMG), CDR2 comprises the amino acid sequence as set forth in SEQ ID NO: 34 (AISGGGDTYYADSVKG), CDR3 comprises the amino acid sequence as set forth in SEQ ID NO: 35 (DLYGSDYWD);
  CDR1 comprises the amino acid sequence set forth in SEQ ID NO: 36 (INAMA), CDR2 comprises the amino acid sequence as set forth in SEQ ID NO: 37 (AITSSGSTNYANSVKG), CDR3 comprises the amino acid sequence as set forth in SEQ ID NO: 38 (DEYGSDYWI); or
  CDR1 comprises the amino acid sequence set forth in SEQ ID NO: 33 (INAMG), CDR2 comprises the amino acid sequence as set forth in SEQ ID NO: 39 (AITSGGSTNYADSVKG), CDR3 comprises the amino acid sequence as set forth in SEQ ID NO: 40 (DLYGEDYWI).

According to some embodiments, the camelid antibody comprises a sequence selected from a group consisting of:

a.
(SEQ ID NO: 30)
EVQLVESGGGLVQAGESLRLSCAASGSIASINAMG

WYRQAPGSQRELVAAISGGGDTYYADSVKGRFTIS

RDNAKTTVYLQMNSLRPEDTAVYYCVVDLYGSDYW

DWGQGTQVTVSS;

b.
(SEQ ID NO: 31)
EVQLVESGGGLVQAGGSLRLSCAASGSLFSINAMA

WYRQAPGKQRELVAAITSSGSTNYANSVKGRFTVS

RDNAKNTMYLQMNSLKPEDTAVYYCVVDEYGSDYW

IWGQGTQVTVSS;
and c.
(SEQ ID NO: 32)
QVQLVESGGGLVQAGGSLRLSCAASGSIFSINAMG

WYRQAPGKQRERVAAITSGGSTNYADSVKGRFTIS

RDNAKNTVYLQMNNLEPRDAGVYYCVVDLYGEDYW

IWGQGTQVTVSS.

According to some embodiments, the agent comprises three heavy chain CDRs (CDR-H) and three light chain CDRs (CDR-L), wherein:
  CDR-H1 comprises the amino acid sequence set forth in SEQ ID NO: 17 (GFTFSSYYMS), CDR-H2 comprises the amino acid sequence as set forth in SEQ ID NO: 18 (TISDGGDNTYYAGTVTG), CDR-H3 comprises the amino acid sequence as set forth in SEQ ID NO: 19 (IHWPYYFDS), CDR-L1 comprises the amino acid sequence as set forth in SEQ ID NO: 20 (RASSSVSYMN), CDR-L2 comprises the amino acid sequence as set forth in SEQ ID NO: 21 (ATSDLAS), and CDR-L3 comprises the amino acid sequence as set forth in SEQ ID NO: 22 (QQWSSHPPT).

According to some embodiments, the agent is humanized.

According to some embodiments, the agent is not a CD28 agonist.

According to some embodiments, the agent is not a CD28 antagonist.

According to some embodiments, the agent neither degrades the mCD28 nor inhibits mCD28-mediated immune cell activation.

According to some embodiments, the antigen binding fragment of an antibody does not induce antibody-dependent cell-mediated cytotoxicity (ADCC) or complement-dependent cytotoxicity (CDC).

According to some embodiments, the agent binds within the stalk region of CD28.

According to some embodiments, the stalk region comprises the amino acid sequence

GKHLCPSPLFPGPSKP (SEQ ID NO: 9)

or

KGKHLCPSPLFPGPS. (SEQ ID NO: 27)

According to some embodiments, the stalk region consists of the amino acid sequence

HVKGKHLCPSPLFPGPSKP. (SEQ ID NO: 10)

According to some embodiments, the agent binds at a cleavage site for at least one protease.

According to some embodiments, the agent inhibits proteolytic cleavage by at least one protease.

According to some embodiments, the at least one protease is at least one metalloprotease.

According to some embodiments, the at least one metalloprotease is MMP-2, MMP-13, or a combination thereof.

According to some embodiments, the subject suffers from cancer.

According to some embodiments, the cancer is selected from melanoma, head and neck, non-small cell lung cancer, ovarian, kidney, gastric and colorectal.

According to some embodiments, the cancer is selected from melanoma, head and neck, non-small cell lung cancer, ovarian, and colorectal.

According to some embodiments, the method does not degrade mCD28 or decrease mCD28-mediated immune cell activation.

According to some embodiments, the subject's blood before the administering comprises at least 5 ng/ml sCD28.

According to some embodiments, the obtaining is obtaining an agent smaller than 50 kDa, and wherein the obtained agent is smaller than 50 kDa.

According to some embodiments, the method further comprises testing an ability of the agent to block cleavage by a protease of mCD28 on a cell surface.

According to some embodiments, the protease is selected from, MMP-2, and MMP-13.

According to some embodiments, the obtaining an agent comprises at least one of:
  a. immunizing a shark or camelid with the CD28 extracellular domain or fragment thereof and collecting antibodies from the immunized organism; and
  b. screening a library of agents for binding to a CD28 extracellular domain or fragment thereof and selecting an agent that binds.

According to some embodiments, the CD28 extracellular domain or fragment thereof is dimeric or monomeric.

According to some embodiments,
  a. the collecting antibodies comprises extracting B cells from a spleen of the immunized shark or camelid; or
  b. the selecting an agent that binds comprises sequencing the selected agent and producing a recombinant form of the agent from the sequence According to some embodiments, the method further comprises assaying mCD28 downstream signaling in the presence of the obtained agent and selecting at least one agent that neither substantially agonizes nor substantially antagonizes mCD28 signaling.

According to some embodiments, the kit further comprises at least one of:
  a. an anti-PD-1 and/or PD-L1 immunotherapy; and
  b. a label stating the agent of the invention is for use with a PD-1 and/or PD-L1 based immunotherapy.

Further embodiments and the full scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
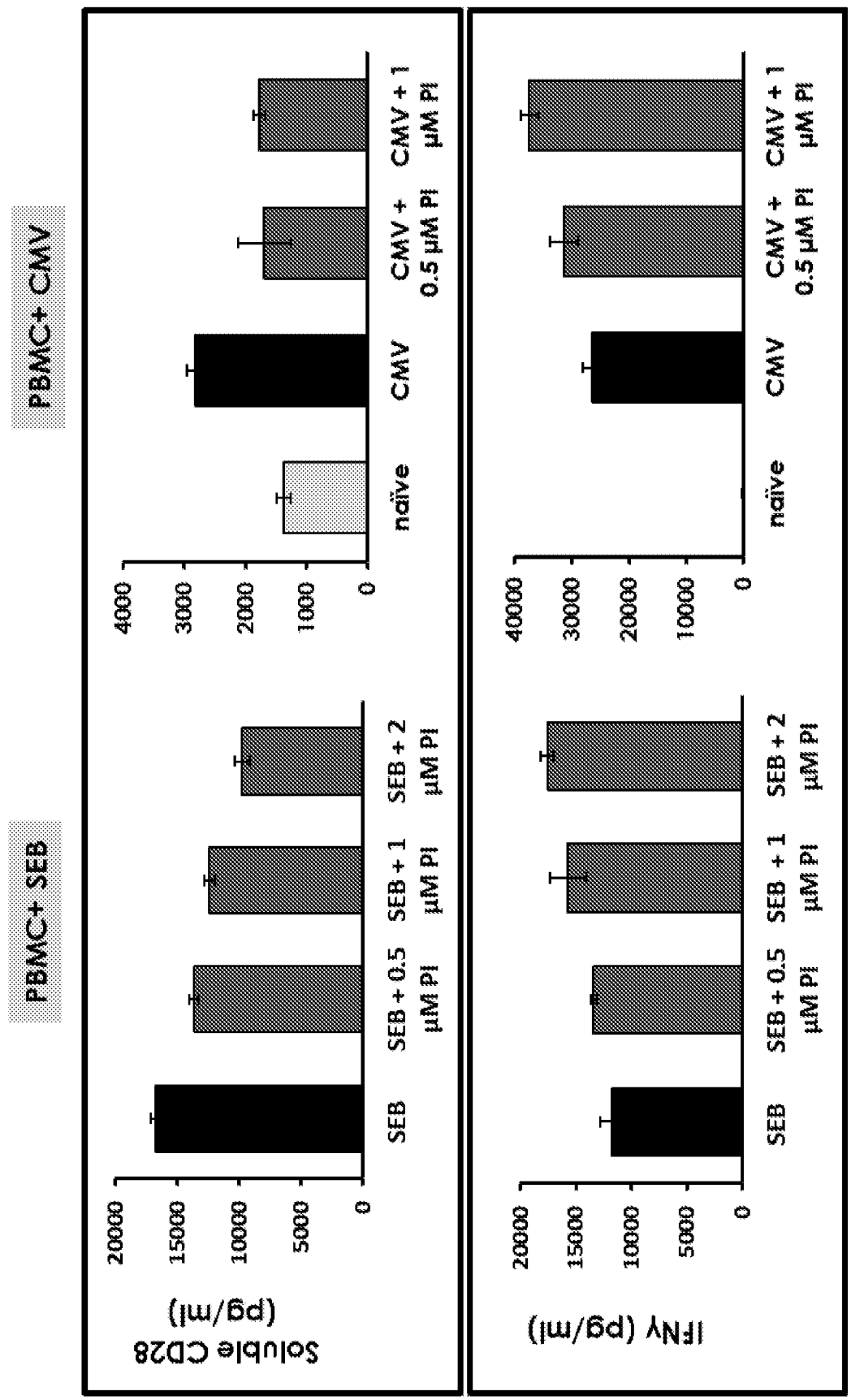
FIG. 1. Soluble CD28 is generated during stimulation of PBMCs and counteracted by addition of protease inhibitors (PI). Bar charts of the amount of soluble CD28 in the culture of PBMCs stimulated with SEB (0.5 ng/mL, left side) or CMV peptides (0.5 µg/mL, right side) as quantified by human CD28 ELISA (top panel). A cocktail of protease inhibitors was added at the indicated concentrations. The overall health and effector activity were examined by the secretion of interferon gamma (low panel).

The present invention, in some embodiments, provides agents smaller than 100 kilodaltons (kDa) that bind membranal CD28 (mCD28) on a cell surface and inhibit proteolytic cleavage of mCD28. Methods of treating cancer, improving PD-1/PD-L1 based immunotherapy, and decreasing sCD28 levels in a subject comprising administering an agent of the invention are also provided. The agents and methods of the invention are based on the surprising finding that full size antibodies against the cleavage site of mCD28 are too large to access the membrane proximal region and thus cannot inhibit shedding. Rather a smaller agent with specificity to mCD28 on a cell surface is needed. Further, a large number of cancer patients have elevated sCD28 levels in their blood stream which is caused by sCD28 shedding. This sCD28 acts as an immunosuppressant, and so reduction of shedding has the double benefit of decreasing the inhibition by sCD28 and increasing immune activation via mCD28 signaling. Further, it was unexpectedly found that sCD28 could inhibit PD-1/PD-L1 based immunotherapy.

Agents

According to a first aspect, there is provided an agent that binds membranal CD28 (mCD28) and inhibits proteolytic cleavage of the mCD28.

In some embodiments, the mCD28 is on a cell surface. In some embodiments, the mCD28 is in a membrane. In some embodiments, the agent is not a full-size antibody. In some embodiments, the agent is not an IgG. In some embodiments, the agent is smaller than 100 kilodaltons (kDa). In some embodiments, the agent is smaller than 100, 95, 90, 85, 80, 75, 70, 65, 60, 55, 50, 45, 40, 35, 30, 25, 20 or 15 kDa. Each possibility represents a separate embodiment of the invention. In some embodiments, the agent is smaller than 50 kDa. In some embodiments, the agent is smaller than 25 kDa. In some embodiments, the agent is smaller than 20 kDa. In some embodiments, the agent is smaller than 15 kDa.

In some embodiments, the CD28 is mammalian CD28. In some embodiments the CD28 is human CD28. In some embodiments, the human CD28 comprises or consists of the amino acid sequence:

```
                                        (SEQ ID NO: 1)
MLRLLLALNLFPSIQVTGNKILVKQSPMLVAYDNA

VNLSCKYSYNLFSREFRASLHKGLDSAVEVCVVYG

NYSQQLQVYSKTGFNCDGKLGNESVTFYLQNLYVN
```

-continued

QTDIYFCKIEVMYPPPYLDNEKSNGTIIHVKGKHL

CPSPLFPGPSKPFWVLVVVGGVLACYSLLVTVAFI

IFWVRSKRSRLLHSDYMNMTPRRPGPTRKHYQPYA

PPRDFAAYRS.

In some embodiments, mature CD28 lacks a signal peptide and comprises the sequence:

(SEQ ID NO: 2)
NKILVKQSPMLVAYDNAVNLSCKYSYNLFSREFRA

SLHKGLDSAVEVCVVYGNYSQQLQVYSKTGFNCDG

KLGNESVTFYLQNLYVNQTDIYFCKIEVMYPPPYL

DNEKSNGTIIHVKGKHLCPSPLFPGPSKPFWVLVV

VGGVLACYSLLVTVAFIIFWVRSKRSRLLHSDYMN

MTPRRPGPTRKHYQPYAPPRDFAAYRS.

In some embodiments, the DNA coding sequence that codes for full length human CD28 comprises the sequence:

(SEQ ID NO: 3)
ATGCTCAGGCTGCTCTTGGCTCTCAACTTATTCCC

TTCAATTCAAGTAACAGGAAACAAGATTTTGGTGA

AGCAGTCGCCCATGCTTGTAGCGTACGACAATGCG

GTCAACCTTAGCTGCAAGTATTCCTACAATCTCTT

CTCAAGGGAGTTCCGGGCATCCCTTCACAAAGGAC

TGGATAGTGCTGTGGAAGTCTGTGTTGTATATGGG

AATTACTCCCAGCAGCTTCAGGTTTACTCAAAAAC

GGGGTTCAACTGTGATGGGAAATTGGGCAATGAAT

CAGTGACATTCTACCTCCAGAATTTGTATGTTAAC

CAAACAGATATTTACTTCTGCAAAATTGAAGTTAT

GTATCCTCCTCCTTACCTAGACAATGAGAAGAGCA

ATGGAACCATTATCCATGTGAAAGGGAAACACCTT

TGTCCAAGTCCCCTATTTCCCGGACCTTCTAAGCC

CTTTTGGGTGCTGGTGGTGGTTGGTGGAGTCCTGG

CTTGCTATAGCTTGCTAGTAACAGTGGCCTTTATT

ATTTTCTGGGTGAGGAGTAAGAGGAGCAGGCTCCT

GCACAGTGACTACATGAACATGACTCCCCGCCGCC

CCGGGCCCACCCGCAAGCATTACCAGCCCTATGCC

CCACCACGCGACTTCGCAGCCTATCGCTCCTGA.

As used herein, sCD28 refers to any CD28 fragment or variant that does not comprise a transmembrane domain and thus cannot be integrated in a membrane. In some embodiments, the CD28 transmembrane domain comprises the amino acid sequence FWVLVVVGGVLACYSLLVTVAFIIFWV (SEQ ID NO: 4). In some embodiments, sCD28 is not membrane bound. In some embodiments, sCD28 is in solution. In some embodiments, the sCD28 is CD28 in blood. In some embodiments, the sCD28 is CD28 in the TME. In some embodiments, sCD28 is CD28 in a bodily fluid. In some embodiments, sCD28 lacks exon 3 of CD28. In some embodiments, sCD28 is a splice variant arising from alternative splicing that splices out exon 3 of CD28. In some embodiments, sCD28 is a cleavage product from membranal CD28 (mCD28). In some embodiments, sCD28 is truncated CD28. In some embodiments, sCD28 lacks the cytoplasmic domain of full-length CD28. In some embodiments, sCD28 is dimeric sCD28. In some embodiments, sCD28 is monomeric sCD28. In some embodiments, sCD28 is not a splice variant arising from alternative splicing of CD28. In some embodiments, the alternative splicing splices out exon 3 of CD28. In some embodiments, sCD28 comprises the amino acid sequence: MLRLLLALNLFPSIQVTGNKILVKQSPMLVAYDNAVNLSCKYSYNLFSREFRASLHKG LDSAVEVCVVYG-NYSQQLQVYSKTGFNCDGKLGNESVTFYLQ NLYVNQTDIYFCKIE VMYPPPYLDNEKSNGTIIHVK-GEE (SEQ ID NO: 5). In some embodiments, sCD28 consists of the amino acid sequence of SEQ ID NO: 5. In some embodiments, sCD28 lacks the signal peptide and comprises the sequence: NKILVKQSPMLVAYD-NAVNLSCKYSYNLFSREFRASLHKGLDSAVEVCV-VYGNYSQQ LQVYSKTGFNCDGKLGNESVTFYLQN-LYVNQTDIYFCKIEVMYPPPYLDNEKSNGTIIH VKGEE (SEQ ID NO: 6). In some embodiments, sCD28 consists of the amino acid sequence of SEQ ID NO: 6. In some embodiments, sCD28 comprises the amino acid sequence: MLRLLLALNLFPSIQVTGNKIL-VKQSPMLVAYDNAVNLSCKYSYNLFSREFRASLHKG LDSAVEVCVVYG-NYSQQLQVYSKTGFNCDGKLGNESVTFYLQNLY-VNQTDIYFCKIE VMYPPPYLD-NEKSNGTIIHVKGKHLCPSP (SEQ ID NO: 48). In some embodiments, sCD28 consists of the amino acid sequence of SEQ ID NO: 48. In some embodiments, sCD28 lacks the signal peptide and comprises the sequence: NKIL-VKQSPMLVAYDNAVNLSCKYSYNLFSRE-FRASLHKGLDSAVEVCVVYGNYSQQ LQVYSKTGFNCDGKLGNESVTFYLQNLY-VNQTDIYFCKIEVMYPPPYLDNEKSNGTIIH VKGKHLCPSP (SEQ ID NO: 49). In some embodiments, sCD28 consists of the amino acid sequence of SEQ ID NO: 49.

In some embodiments, the DNA coding sequence that codes for human sCD28 comprises the sequence:

(SEQ ID NO: 7)
ATGCTCAGGCTGCTCTTGGCTCTCAACTTATTCCC

TTCAATTCAAGTAACAGGAAACAAGATTTTGGTGA

AGCAGTCGCCCATGCTTGTAGCGTACGACAATGCG

GTCAACCTTAGCTGCAAGTATTCCTACAATCTCTT

CTCAAGGGAGTTCCGGGCATCCCTTCACAAAGGAC

TGGATAGTGCTGTGGAAGTCTGTGTTGTATATGGG

AATTACTCCCAGCAGCTTCAGGTTTACTCAAAAAC

GGGGTTCAACTGTGATGGGAAATTGGGCAATGAAT

CAGTGACATTCTACCTCCAGAATTTGTATGTTAAC

CAAACAGATATTTACTTCTGCAAAATTGAAGTTAT

GTATCCTCCTCCTTACCTAGACAATGAGAAGAGCA

ATGGAACCATTATCCATGTGAAAGGTGAGGAGTAA

-continued

```
GAGGAGCAGGCTCCTGCACAGTGACTACATGAACA

TGACTCCCCGCCGCCCGGGCCCACCCGCAAGCAT

TACCAGCCCTATGCCCACCACGCGACTTCGCAGC

CTATCGCTCCTGA.
```

The effects of sCD28 on immune cells are well known in the art, and include as non-limiting examples, immune cell induction of anti-inflammatory cytokines such as IL-10 or TGF β, immune cell expression of Indoleamine 2,3-dioxygenase (IDO), and immune cell down regulation of pro-inflammatory cytokines, such as IL-2 or IFN-γ. In some embodiments, the agent inhibiting proteolytic cleavage of membranal CD28 comprises inhibiting generation of sCD28. In some embodiments, the inhibiting generation of sCD28 comprises inhibiting effects of sCD28 on immune cells.

As used herein, inhibiting proteolytic cleavage refers to any reduction in proteolytic cleavage of mCD28. In some embodiments, the inhibition is a reduction in cleavage of at least 5, 10, 15, 20, 25, 30, 35, 40, 45, 50, 55, 60, 65, 70, 75, 80, 85, 90, 95, 97, 99 or 100%. Each possibility represents a separate embodiment of the invention. In some embodiments, inhibiting proteolytic cleavage maintains levels of mCD28 on immune cells. In some embodiments, inhibiting proteolytic cleavage increases levels of mCD28 on immune cells. In some embodiments, inhibiting proteolytic cleavage maintains levels of mCD28 adequate for immune stimulation.

In some embodiments, the reduction in proteolytic cleavage is reduction in cleavage by at least one protease. In some embodiments, the reduction in proteolytic cleavage is reduction in cleavage by at least one metalloprotease. In some embodiments, the metalloprotease is MMP-2, ADAM10, ADAM17 or a combination thereof. In some embodiments, the metalloprotease is MMP-2, ADAM10, ADAM17, MMP-13 or a combination thereof. In some embodiments, the metalloprotease is MMP-2. In some embodiments, the metalloprotease is MMP-2 or MMP-13. In some embodiments, the metalloprotease is MMP-2. In some embodiments, the metalloprotease is MMP-2, MMP-13 or a combination thereof.

In some embodiments, the agent is selected from an antigen binding fragment of an antibody, a Fab fragment, a single chain antibody, a single domain antibody, a small molecule and a peptide that specifically binds to CD28. In some embodiments, the agent is a Fab fragment. In some embodiments, the agent is a single chain antibody. In some embodiments, the agent is a single domain antibody. In some embodiments, the agent is a peptide that specifically binds to CD28.

In some embodiments, the agent lacks a Fc domain. In some embodiments, the agent is an antigen binding domain that lacks an Fc domain. In some embodiments, the agent is a camelid, shark or nanobody. In some embodiments, the antibody or fragment is fused to another protein or fragment of a protein. In some embodiments, the second protein or fragment increases half-life, particularly in serum. In some embodiments, the half-life extending protein is human serum albumin. In some embodiments, the agent is modified by a chemical that produces a modification that enhances half-life. In some embodiments, the modification is PEGylation and the chemical is polyethylene glycol. A skilled artisan will appreciate that any half-life extending protein or chemical agent, or modification known in the art may be used.

An example of an agent includes, but is not limited to, an antibody, an antigen binding fragment of an antibody, a nanobody, a single chain antibody, a single domain antibody, a small molecule, a peptide and a DARPin. In some embodiments, the agent is selected from an antibody, an antigen binding fragment of an antibody, a Fab fragment, a nanobody, a single chain antibody, a single domain antibody, a small molecule, a peptide and a DARPin. In some embodiments, the agent is selected from an antibody, an antigen binding fragment of an antibody, a Fab fragment, a single chain antibody, a single domain antibody, a small molecule, and a peptide with specific binding to CD28. In some embodiments, the agent is a single domain antibody. In some embodiments, the agent is a nanobody. In some embodiments, the agent is a VHH antibody. As used herein, the terms "single domain antibody", "nanobody" and "VHH antibody" are synonymous and used interchangeably. In some embodiments, the peptide has specific binding to CD28. In some embodiments, the agent is a peptide with specific binding to CD28. In some embodiments, the peptide is selected from an antibody, an antigen binding fragment of an antibody, a Fab fragment, a single chain antibody, a single-domain antibody, a nanobody, a VHH antibody and an antibody mimetic. As used herein, the term "antibody mimetic" refers to an organic compound that can specifically bind to a target antigen. In some embodiments, an antibody mimetic is not structurally related to an antibody. Examples of antibody mimetics include, but are not limited to, affilins, affimers, affitins, alphabodies, anticalins, avimers, DARPins, fynomers, Kunitz domain peptides, monobodies, and nanoCLAMPS. In some embodiments, the antibody mimetic is a DARPin. All of these agents are well known in the art and are known to be useful in blocking interactions between receptors and their ligands. Small molecules and proteins that can bind mCD28 may occlude the cleavage site or may cause hinderance or impair access for the protease. In some embodiments, the protein is an antibody mimetic. As used herein, the term "DARPin" refers to a designed ankyrin repeat protein. DARPins are genetically engineered antibody mimetic proteins that are generally highly specific for their protein target. Thus, a DARPin for CD28 may be an example of an agent.

In some embodiments, a Fab fragment comprises a size of about 50 kDa. In some embodiments, a Fab fragment comprises a size of less than 100 kDa. In some embodiments, a Fab fragment comprises a size of less than 80 kDa. In some embodiments, a Fab fragment comprises a size of less than 70 kDa. In some embodiments, a Fab fragment comprises a size of less than 50 kDa. In some embodiments, a Fab fragment comprises a size of 50 kDa or less. In some embodiments, a single chain antibody comprises a size of about 25 kDa. In some embodiments, a single chain antibody comprises a size of less than 50 kDa. In some embodiments, a single chain antibody comprises a size of less than 40 kDa. In some embodiments, a single chain antibody comprises a size of less than 30 kDa. In some embodiments, a single chain antibody comprises a size of less than 25 kDa. In some embodiments, a single chain antibody comprises a size of 25 kDa or less. In some embodiments, a single domain antibody comprises a size of about 15 kDa. In some embodiments, a single domain antibody comprises a size of between 10-17 kDa. In some embodiments, a single domain antibody comprises a size of between 10-16 kDa. In some embodiments, a single domain antibody comprises a size of between 10-15 kDa. In some embodiments, a single domain antibody comprises a size of between 12-15 kDa. In some embodiments, a single domain antibody comprises a size of between 12-16 kDa. In some embodiments, a single domain antibody comprises a size of between 12-17 kDa. In some embodiments, a single domain antibody comprises a size of less than 25 kDa. In some embodiments, a single domain antibody comprises a size of less than 20 kDa. In some embodiments, a single domain antibody comprises a size of less than 15 kDa. In some embodiments, a single domain antibody comprises a size of 15 kDa or less. Due to its small size, and only 3 CDRS a single domain antibody comprises a convex shape and binds its epitope from only one side. By comparison Fab fragments and single-chain antibodies comprise 6 CDRs and bind epitopes from at least 2 sides. In some embodiments, binding with only 3 CDRs allows superior access to the mCD28 stalk region as compared to binding with 6 CDRS. In some embodiments, the geometry of single-domain antibody binding is superior for accessing the mCD28 stalk region.

As used herein, the term "antibody" refers to a polypeptide or group of polypeptides that include at least one binding domain that is formed from the folding of polypeptide chains having three-dimensional binding spaces with internal surface shapes and charge distributions complementary to the features of an antigenic determinant of an antigen. An antibody typically has a tetrameric form, comprising two identical pairs of polypeptide chains, each pair having one "light" and one "heavy" chain. The variable regions of each light/heavy chain pair form an antibody binding site. An antibody may be oligoclonal, polyclonal, monoclonal, chimeric, camelised, CDR-grafted, multi-specific, bi-specific, catalytic, humanized, fully human, anti-idiotypic and antibodies that can be labeled in soluble or bound form as well as fragments, including epitope-binding fragments, variants or derivatives thereof, either alone or in combination with other amino acid sequences. An antibody may be from any species. The term antibody also includes binding fragments, including, but not limited to Fv, Fab, Fab', F(ab')2 single stranded antibody (scFv), dimeric variable region (Diabody) and disulphide-linked variable region (dsFv). In particular, antibodies include immunoglobulin molecules and immunologically active fragments of immunoglobulin molecules, i.e., molecules that contain an antigen binding site. Antibody fragments may or may not be fused to another immunoglobulin domain including but not limited to, an Fc region or fragment thereof. The skilled artisan will further appreciate that other fusion products may be generated including but not limited to, scFv-Fc fusions, variable region (e.g., VL and VH)-Fc fusions and scFv-scFv-Fc fusions.

Immunoglobulin molecules can be of any type (e.g., IgG, IgE, IgM, IgD, IgA and IgY), class (e.g., IgG1, IgG2, IgG3, IgG4, IgA1 and IgA2) or subclass.

The basic unit of the naturally occurring antibody structure is a heterotetrameric glycoprotein complex of about 150,000 Daltons, composed of two identical light (L) chains and two identical heavy (H) chains, linked together by both noncovalent associations and by disulfide bonds. Each heavy and light chain also has regularly spaced intra-chain disulfide bridges. Five human antibody classes (IgG, IgA, IgM, IgD and IgE) exist, and within these classes, various subclasses, are recognized based on structural differences, such as the number of immunoglobulin units in a single antibody molecule, the disulfide bridge structure of the individual units, and differences in chain length and sequence. The class and subclass of an antibody is its isotype. In some embodiments, a Fab fragment has a size of less than 100, 90, 80, 75, 70, 65, 60, 55, or 50 kDa. Each possibility represents a separate embodiment of the invention. In some embodiments, a Fab fragment has a size of less than 50 kDa.

The amino terminal regions of the heavy and light chains are more diverse in sequence than the carboxy terminal regions, and hence are termed the variable domains. This part of the antibody structure confers the antigen-binding specificity of the antibody. A heavy variable (VH) domain and a light variable (VL) domain together form a single antigen-binding site, thus, the basic immunoglobulin unit has two antigen-binding sites. Particular amino acid residues are believed to form an interface between the light and heavy chain variable domains (Chothia et al., J. Mol. Biol. 186, 651-63 (1985); Novotny and Haber, (1985) Proc. Natl. Acad. Sci. USA 82 4592-4596).

The carboxy terminal portion of the heavy and light chains form the constant domains i.e. CH1, CH2, CH3, CL. While there is much less diversity in these domains, there are differences from one animal species to another, and further, within the same individual there are several different isotypes of antibody, each having a different function.

The term "framework region" or "FR" refers to the amino acid residues in the variable domain of an antibody, which are other than the hypervariable region amino acid residues as herein defined. The term "hypervariable region" as used herein refers to the amino acid residues in the variable domain of an antibody, which are responsible for antigen binding. The hypervariable region comprises amino acid residues from a "complementarity determining region" or "CDR". The CDRs are primarily responsible for binding to an epitope of an antigen. The extent of FRs and CDRs has been precisely defined (see, Kabat et al.).

Immunoglobulin variable domains can also be analyzed using the IMGT information system (www://imgt.cines.fr/) (IMGT®/V-Quest) to identify variable region segments, including CDRs. See, e.g., Brochet, X. et al, Nucl. Acids Res. J6:W503-508 (2008).

Chothia et al. also defined a numbering system for variable domain sequences that is applicable to any antibody. One of ordinary skill in the art can unambiguously assign this system of "Chothia numbering" to any variable domain sequence, without reliance on any experimental data beyond the sequence itself. As used herein, "Chothia numbering" refers to the numbering system set forth by Chothia et al., Journal of Molecular Biology, "Canonical Structures for the Hypervariable regions of immunoglobulins" (1987) and Chothia et al., Nature, "Conformations of Immunoglobulin Hypervariable Regions" (1989).

As used herein, the terms "single chain antibodies" and "single chain variable fragments" are used synonymously and refer to a fusion protein of variable region of heavy and light chains of immunoglobulins, connected by a short peptide linker. In some embodiments a single chain antibody has a size of less than 50, 45, 40, 35, 30, 25, or 20 kDa. Each possibility represents a separate embodiment of the invention. In some embodiments, a single chain antibody has a size of less than 25 kDa. In some embodiments, the linker of a single chain antibody is between 10 and 25 amino acids. In some embodiments, the linker is between 1-40, 5-40, 10-40, 1-35, 5-35, 10-35, 1-30, 5-30, 10-30, 1-25, 5-25 or 10-25 amino acids. Each possibility represents a separate embodiment of the invention. In some embodiments, the, the single chain antibody comprises a heavy chain of antibody M9. In some embodiments, the single chain antibody comprises a light chain of antibody M9. In some embodiments, the single chain antibody comprises the CDRs of antibody M9.

As used herein, the terms "single domain antibody", "nanobody" and "VHH" are used synonymously and refer to an antibody fragment consisting of a single monomeric variable antibody domain. In some embodiments, the single domain antibody is a camelid antibody. In some embodiments, a camelid is a camel, an alpaca or a llama. In some embodiments, the camelid is a camel. In some embodiments, the camelid is an alpaca. In some embodiments, the camelid is a llama. In some embodiments, the single domain antibody is a shark antibody.

Also, as already indicated herein, the amino acid residues of a Nanobody are numbered according to the general numbering for VHs given by Kabat et al. ("Sequence of proteins of immunological interest", US Public Health Services, NTH Bethesda, Md., Publication No. 91), as applied to VHH domains from Camelids in the article of Riechmann and Muyldermans, J. Immunol. Methods 2000 jun. 23; 240 (1-2): 185-195 or referred to herein. According to this numbering, FR1 of a Nanobody comprises the amino acid residues at positions 1-30, CDR1 of a Nanobody comprises the amino acid residues at positions 31-35, FR2 of a Nanobody comprises the amino acids at positions 36-49, CDR2 of a Nanobody comprises the amino acid residues at positions 50-65, FR3 of a Nanobody comprises the amino acid residues at positions 66-94, CDR3 of a Nanobody comprises the amino acid residues at positions 95-102, and FR4 of a Nanobody comprises the amino acid residues at positions 103-113. In this respect, it should be noted that—as is well known in the art for VH domains and for VHH domains—the total number of amino acid residues in each of the CDR's may vary and may not correspond to the total number of amino acid residues indicated by the Kabat numbering (that is, one or more positions according to the Kabat numbering may not be occupied in the actual sequence, or the actual sequence may contain more amino acid residues than the number allowed for by the Kabat numbering). This means that, generally, the numbering according to Kabat may or may not correspond to the actual numbering of the amino acid residues in the actual sequence. Generally, however, it can be said that, according to the numbering of Kabat and irrespective of the number of amino acid residues in the CDR's, position 1 according to the Kabat numbering corresponds to the start of FR1 and vice versa, position 36 according to the Kabat numbering corresponds to the start of FR2 and vice versa, position 66 according to the Kabat numbering corresponds to the start of FR3 and vice versa, and position 103 according to the Kabat numbering corresponds to the start of FR4 and vice versa.

Alternative methods for numbering the amino acid residues of VH domains, which methods can also be applied in an analogous manner to VHH domains from Camelids and to Nanobodies, are the method described by Chothia et al. (Nature 342, 877-883 (1989)), the so-called "AbM definition" and the so-called "contact definition". However, in the present description, aspects and figures, the numbering according to Kabat as applied to VHH domains by Riechmann and Muyldermans will be followed, unless indicated otherwise.

As used herein, the term "humanized antibody" refers to an antibody from a non-human species whose protein sequences have been modified to increase similarity to human antibodies. A humanized antibody may be produced by production of recombinant DNA coding for the CDRs of the non-human antibody surrounded by sequences that resemble a human antibody. In some embodiments, the humanized antibody is a chimeric antibody. In some embodiments, humanizing comprises insertion of the CDRs of the invention into a human antibody scaffold or backbone. Humanized antibodies are well known in the art and any method of producing them that retains the CDRs of the invention may be employed.

The term "monoclonal antibody" or "mAb" as used herein refers to an antibody obtained from a population of substantially homogeneous antibodies, i.e., the individual antibodies comprising the population are identical and/or bind the same epitope, except for possible variants that may arise during production of the monoclonal antibody, such variants generally being present in minor amounts. In contrast to polyclonal antibody preparations that typically include different antibodies directed against different determinants (epitopes), each monoclonal antibody is directed against a single determinant on the antigen. In addition to their specificity, the monoclonal antibodies are advantageous in that they are uncontaminated by other immunoglobulins. The modifier "monoclonal" indicates the character of the antibody as being obtained from a substantially homogeneous population of antibodies and is not to be construed as produced by any specific preparation method. Monoclonal antibodies to be used in accordance with the methods provided herein, may be made by the hybridoma method first described by Kohler et al, Nature 256:495 (1975), or may be made by recombinant DNA methods (see, e.g., U.S. Pat. No. 4,816,567). The "monoclonal antibodies" may also be isolated from phage antibody libraries using the techniques described in Clackson et al, Nature 352:624-628 (1991) and Marks et al, J. Mol. Biol. 222:581-597 (1991), for example.

The mAb of the present invention may be of any immunoglobulin class including IgG, IgM, IgD, IgE or IgA. A hybridoma producing a mAb may be cultivated in vitro or in vivo. High titers of mAbs can be obtained in vivo production where cells from the individual hybridomas are injected intraperitoneally into pristine-primed Balb/c mice to produce ascites fluid containing high concentrations of the desired mAbs. mAbs of isotype IgM or IgG may be purified from such ascites fluids, or from culture supernatants, using column chromatography methods well known to those of skill in the art.

"Antibody fragments" comprise a portion of an intact antibody, preferably comprising the antigen binding region thereof. Examples of antibody fragments include Fab, Fab', F(ab')2, and Fv fragments; diabodies; tandem diabodies (taDb), linear antibodies (e.g., U.S. Pat. No. 5,641,870, Example 2; Zapata et al, Protein Eng. 8(10): 1057-1062 (1995)); one-armed antibodies, single variable domain antibodies, minibodies, single-chain antibody molecules; multispecific antibodies formed from antibody fragments (e.g., including but not limited to, Db-Fc, taDb-Fc, taDb-CH3, (scFV)4-Fc, di-scFv, bi-scFv, or tandem (di,tri)-scFv); and Bi-specific T-cell engagers (BiTEs).

Papain digestion of antibodies produces two identical antigen-binding fragments, called "Fab" fragments, each with a single antigen-binding site, and a residual "Fc" fragment, whose name reflects its ability to crystallize readily. Pepsin treatment yields an F(ab')2 fragment that has two antigen-binding sites and is still capable of cross-linking antigen.

"Fv" is the minimum antibody fragment that contains a complete antigen-recognition and antigen-binding site. This region consists of a dimer of one heavy chain and one light chain variable domain in tight, non-covalent association. It is in this configuration that the three surfaces of the VH-VL dimer. Collectively, the six hypervariable regions confer antigen-binding specificity to the antibody. However, even a single variable domain (or half of an Fv comprising only three hypervariable regions specific for an antigen) has the ability to recognize and bind antigen, although at a lower affinity than the entire binding site.

The Fab fragment also contains the constant domain of the light chain and the first constant domain (CH1) of the heavy chain. Fab' fragments differ from Fab fragments by the addition of a few residues at the carboxy terminus of the heavy chain CH1 domain including one or more cysteines from the antibody hinge region. Fab'-SH is the designation herein for Fab' in which the cysteine residue(s) of the constant domains bear at least one free thiol group. F(ab')2 antibody fragments originally were produced as pairs of Fab' fragments that have hinge cysteines between them. Other chemical couplings of antibody fragments are also known.

The "light chains" of antibodies (immunoglobulins) from any vertebrate species can be assigned to one of two clearly distinct types, called kappa and lambda, based on the amino acid sequences of their constant domains.

Depending on the amino acid sequence of the constant domain of their heavy chains, antibodies can be assigned to different classes. There are five major classes of intact antibodies: IgA, IgD, IgE, IgG, and IgM, and several of these may be further divided into subclasses (isotypes), e.g., IgG1, IgG2, IgG3, IgG4, IgA, and IgA2. The heavy chain constant domains that correspond to the different classes of antibodies are called a, delta, e, gamma, and micro, respectively. The subunit structures and three-dimensional configurations of different classes of immunoglobulins are well known.

"Single-chain Fv" or "scFv" antibody fragments comprise the VH and VL domains of antibody, wherein these domains are present in a single polypeptide chain. In some embodiments, the Fv polypeptide further comprises a polypeptide linker between the VH and VL domains that enables the scFv to form the desired structure for antigen binding. For a review of scFv see Pluckthun in The Pharmacology of Monoclonal Antibodies, vol. 113, Rosenburg and Moore eds., Springer-Verlag, New York, pp. 269-315 (1994).

The term "diabodies" refers to small antibody fragments with two antigen-binding sites, which fragments comprise a heavy chain variable domain (VH) connected to a light chain variable domain (VL) in the same polypeptide chain (VH-VL). By using a linker that is too short to allow pairing between the two domains on the same chain, the domains are forced to pair with the complementary domains of another chain and create two antigen-binding sites. Diabodies production is known in the art and is described in Natl. Acad. Sci. USA, 90:6444-6448 (1993).

The term "multispecific antibody" is used in the broadest sense and specifically covers an antibody that has polyepitopic specificity. Such multispecific antibodies include, but are not limited to, an antibody comprising a heavy chain variable domain (VH) and a light chain variable domain (VL), where the VHVL unit has polyepitopic specificity, antibodies having two or more VL and VH domains with each VHVL unit binding to a different epitope, antibodies having two or more single variable domains with each single variable domain binding to a different epitope, full length antibodies, antibody fragments such as Fab, Fv, dsFv, scFv, diabodies, bispecific diabodies, triabodies, tri-functional antibodies, antibody fragments that have been linked covalently or non-covalently. "Polyepitopic specificity" refers to the ability to specifically bind to two or more different epitopes on the same or different target(s).

A monoclonal antibodies of the invention may be prepared using methods well known in the art. Examples include various techniques, such as those in Kohler, G. and Milstein, C, Nature 256: 495-497 (1975); Kozbor et al, Immunology Today 4: 72 (1983); Cole et al, pg. 77-96 in MONOCLONAL ANTIBODIES AND CANCER THERAPY, Alan R. Liss, Inc. (1985).

Besides the conventional method of raising antibodies in vivo, antibodies can be generated in vitro using phage display technology. Such a production of recombinant antibodies is much faster compared to conventional antibody production and they can be generated against an enormous number of antigens. Furthermore, when using the conventional method, many antigens prove to be non-immunogenic or extremely toxic, and therefore cannot be used to generate antibodies in animals. Moreover, affinity maturation (i.e., increasing the affinity and specificity) of recombinant antibodies is very simple and relatively fast. Finally, large numbers of different antibodies against a specific antigen can be generated in one selection procedure. To generate recombinant monoclonal antibodies, one can use various methods all based on display libraries to generate a large pool of antibodies with different antigen recognition sites. Such a library can be made in several ways: One can generate a synthetic repertoire by cloning synthetic CDR3 regions in a pool of heavy chain germline genes and thus generating a large antibody repertoire, from which recombinant antibody fragments with various specificities can be selected. One can use the lymphocyte pool of humans as starting material for the construction of an antibody library. It is possible to construct naive repertoires of human IgM antibodies and thus create a human library of large diversity. This method has been widely used successfully to select a large number of antibodies against different antigens. Protocols for bacteriophage library construction and selection of recombinant antibodies are provided in the well-known reference text Current Protocols in Immunology, Colligan et al (Eds.), John Wiley & Sons, Inc. (1992-2000), Chapter 17, Section 17.1.

Non-human antibodies may be humanized by any methods known in the art. In one method, the non-human complementarity determining regions (CDRs) are inserted into a human antibody or consensus antibody framework sequence. Further changes can then be introduced into the antibody framework to modulate affinity or immunogenicity.

In some embodiments, antibodies and portions thereof include: antibodies, fragments of antibodies, Fab and F(ab')2, single-domain antigen-binding recombinant fragments and natural nanobodies. In some embodiments, the antigen binding fragment is selected from the group consisting of a Fv, Fab, F(ab')$_2$, scFV or a scFV$_2$ fragment.

In some embodiments, the present invention provides nucleic acid sequences encoding the antibodies or antigen binding portions of the present invention.

For example, the polynucleotide may encode an entire immunoglobulin molecule chain, such as a light chain or a heavy chain. A complete heavy chain includes not only a heavy chain variable region (VH) but also a heavy chain constant region (CH), which typically will comprise three constant domains: CH1, CH2 and CH3; and a "hinge" region. In some situations, the presence of a constant region is desirable.

Other polypeptides which may be encoded by the polynucleotide include antigen-binding antibody fragments such as single domain antibodies ("dAbs"), Fv, scFv, Fab' and CHI and CK or CL domain has been excised. As minibodies are smaller than conventional antibodies they should achieve better tissue penetration in clinical/diagnostic use but being bivalent they should retain higher binding affinity than monovalent antibody fragments, such as dAbs. Accordingly, unless the context dictates otherwise, the term "antibody" as used herein encompasses not only whole antibody molecules, but also antigen-binding antibody fragments of the type discussed above. Each framework region present in the encoded polypeptide may comprise at least one amino acid substitution relative to the corresponding human acceptor framework. Thus, for example, the framework regions may comprise, in total, three, four, five, six, seven, eight, nine, ten, eleven, twelve, thirteen, fourteen, or fifteen amino acid substitutions relative to the acceptor framework regions. Given the properties of the individual amino acids comprising the disclosed protein products, some rational substitutions will be recognized by the skilled worker. Amino acid substitutions, i.e. "conservative substitutions," may be made, for instance, on the basis of similarity in polarity, charge, solubility, hydrophobicity, hydrophilicity, and/or the amphipathic nature of the residues involved.

Suitably, the polynucleotides described herein may be isolated and/or purified. In some embodiments, the polynucleotides are isolated polynucleotides.

As used herein, the term "non-naturally occurring" substance, composition, entity, and/or any combination of substances, compositions, or entities, or any grammatical variants thereof, is a conditional term that explicitly excludes, but only excludes, those forms of the substance, composition, entity, and/or any combination of substances, compositions, or entities that are well-understood by persons of ordinary skill in the art as being "naturally-occurring," or that are, or might be at any time, determined or interpreted by a judge or an administrative or judicial body to be, "naturally-occurring".

By another aspect, there is provided an agent, comprising three CDRs, wherein CDR1 comprises the amino acid sequence set forth in SEQ ID NO: 33 (INAMG), CDR2 comprises the amino acid sequence as set forth in SEQ ID NO: 34 (AISGGGDTYYADSVKG), CDR3 comprises the amino acid sequence as set forth in SEQ ID NO: 35 (DLYGSDYWD).

By another aspect, there is provided an agent, comprising three CDRs, wherein CDR1 comprises the amino acid sequence set forth in SEQ ID NO: 36 (INAMA), CDR2 comprises the amino acid sequence as set forth in SEQ ID NO: 37 (AITSSGSTNYANSVKG), CDR3 comprises the amino acid sequence as set forth in SEQ ID NO: 38 (DEYGSDYWI).

By another aspect, there is provided an agent, comprising three CDRs, wherein CDR1 comprises the amino acid sequence set forth in SEQ ID NO: 33 (INAMG), CDR2 comprises the amino acid sequence as set forth in SEQ ID NO: 39 (AITSGGSTNYADSVKG), CDR3 comprises the amino acid sequence as set forth in SEQ ID NO: 40 (DLYGEDYWI).

In some embodiments, the CDRs are numbered according to the Abm method of numbering. In some embodiments, the CDRs are numbered according to the Chothia method of numbering. In some embodiments, the CDRs are numbered according to the Kabat method of numbering.

In some embodiments, CDR1 comprises the amino acid sequence set forth in SEQ ID NO: 41 (INAMX$_1$), wherein X$_1$ is G or A. In some embodiments, CDR2 comprises the amino acid sequence set forth in SEQ ID NO: 42 (AIX$_1$X$_2$X$_3$GX$_4$TX$_5$YAX$_6$SVKG), wherein X$_1$ is S or T, X$_2$ is G or S, X$_3$ is G or S, X$_4$ is D or S, X$_5$ is Y or N, and X$_6$ is D or N. In some embodiments, CDR3 comprises the amino acid sequence set forth in SEQ ID NO: 43 (DX$_1$YGX$_2$DYWX$_3$), wherein X$_1$ is E or L, X$_2$ is E or S, and X$_3$ is D or I. In some embodiments, CDR3 comprises the amino acid sequence set forth in SEQ ID NO: 44 (DX$_1$YGSDYWX$_2$), wherein X$_1$ is E or L, and X$_2$ is D or I.

In some embodiments, the agent is a single-domain antibody. In some embodiments, the agent is a VHH antibody. In some embodiments, the agent is a camelid antibody. In some embodiments, the camelid is a llama. In some embodiments, the agent comprises no other CDRs other than the CDRs recited hereinabove.

In some embodiments, the agent comprises a sequence comprising and/or consisting of

```
                                        (SEQ ID NO: 30)
EVQLVESGGGLVQAGESLRLSCAASGSIASINAMG

WYRQAPGSQRELVAAISGGGDTYYADSVKGRFTIS

RDNAKTTVYLQMNSLRPEDTAVYYCVVDLYGSDYW

DWGQGTQVTVSS.
```

In some embodiments, the agent comprises a sequence comprising and/or consisting of

```
                                        (SEQ ID NO: 31)
EVQLVESGGGLVQAGGSLRLSCAASGSLFSINAMA

WYRQAPGKQRELVAAITSSGSTNYANSVKGRFTVS

RDNAKNTMYLQMNSLKPEDTAVYYCVVDEYGSDYW

IWGQGTQVTVSS.
```

In some embodiments, the agent comprises a sequence comprising and/or consisting of

```
                                        (SEQ ID NO: 32)
QVQLVESGGGLVQAGGSLRLSCAASGSIFSINAMG

WYRQAPGKQRERVAAITSGGSTNYADSVKGRFTIS

RDNAKNTVYLQMNNLEPRDAGVYYCVVDLYGEDYW

IWGQGTQVTVSS.
```

In some embodiments, the VHH sequences further comprise a His tag. In some embodiments, the His tag is at least 1, 2, 3, 4, 5, 6, 7, 8, 9, or 10 histidine residues. Each possibility represents a separate embodiment of the invention. In some embodiments, the His tag consists of 6 histidine residues. In some embodiments, the His tag is connected to the VHH via a linker. In some embodiments, the linker is a peptide linker. In some embodiments, the linker is an alanine repeat linker. In some embodiments, the alanine repeat comprises at least 1, 2, 3, 4, 5, 6, 7, 8, 9, or 10 alanine residues. Each possibility represents a separate embodiment of the invention. In some embodiments, the alanine repeat linker consists of 3 alanine residues. In some embodiments, the His-tag is a six His tag.

In some embodiments, the VHH sequences found to specifically bind the stalk region of human CD28 and comprising a His tag are:

```
(SEQ ID NO: 45, clone 2A1)
EVQLVESGGGLVQAGESLRLSCAASGSIASINAMG
WYRQAPGSQRELVAAISGGGDTYYADSVKGRFTIS
RDNAKTTVYLQMNSLRPEDTAVYYCVVDLYGSDYW
DWGQGTQVTVSSAAAHRHHHH;

(SEQ ID NO: 46, clone 4A4)
EVQLVESGGGLVQAGGSLRLSCAASGSLFSINAMA
WYRQAPGKQRELVAAITSSGSTNYANSVKGRFTVS
RDNAKNTMYLQMNSLKPEDTAVYYCVVDEYGSDYW
IWGQGTQVTVSSAAAHRHHHH;
and (SEQ ID NO: 47, clone 4A1)
QVQLVESGGGLVQAGGSLRLSCAASGSIFSINAMG
WYRQAPGKQRERVAAITSGGSTNYADSVKGRFTIS
RDNAKNTVYLQMNNLEPRDAGVYYCVVDLYGEDYW
IWGQGTQVTVSSAAAHHHHHH.
```

By another aspect, there is provided an agent, comprising three heavy chain CDRs (CDR-H) and three light chain CDRs (CDR-L), wherein: CDR-H1 comprises the amino acid sequence set forth in SEQ ID NO: 11 (GYTLTNY), CDR-H2 comprises the amino acid sequence as set forth in SEQ ID NO: 12 (NTYTGK), CDR-H3 comprises the amino acid sequence as set forth in SEQ ID NO: 13 (GDANQQFAY), CDR-L1 comprises the amino acid sequence as set forth in SEQ ID NO: 14 (KASQDINSYLS), CDR-L2 comprises the amino acid sequence as set forth in SEQ ID NO: 15 (RANRLVD), and CDR-L3 comprises the amino acid sequence as set forth in SEQ ID NO: 16 (LQYDEFPPT). This antibody is herein referred to as M9.

In some embodiments, the agent comprises three heavy chain CDRs (CDR-H) and three light chain CDRs (CDR-L), wherein: CDR-H1 comprises the amino acid sequence set forth in SEQ ID NO: 17 (GFTFSSYYMS), CDR-H2 comprises the amino acid sequence as set forth in SEQ ID NO: 18 (TISDGGDNTYYAGTVTG), CDR-H3 comprises the amino acid sequence as set forth in SEQ ID NO: 19 (IHWPYYFDS), CDR-L1 comprises the amino acid sequence as set forth in SEQ ID NO: 20 (RASSSVSYMN), CDR-L2 comprises the amino acid sequence as set forth in SEQ ID NO: 21 (ATSDLAS), and CDR-L3 comprises the amino acid sequence as set forth in SEQ ID NO: 22 (QQWSSHPPT).

In some embodiments, the agent comprises a heavy chain comprising the amino acid sequence DVKLVESGGGLVKLGGSLKLSCVASGFTFSSYYMSWVRQTPEKRLEWVATISDGGDN TYYAGTVTGRFTISRDFAKNTLYLQMNSLTSEDTAVYYCARIHWPYYFDSWGQGTTL TVSS (SEQ ID NO: 23). In some embodiments, the variable region of the heavy chain comprises and/or consists of SEQ ID NO: 23. In some embodiments, the agent comprises a heavy chain comprising a polypeptide encoded by the nucleic acid sequence: GACGTGAAGCTCGTGGAGTCTGGGGGAGGCTTAGTGAAGCTTGGAGGGTCCCTGA AACTCTCCTGTGTAGCCTCTGGATTCACTTTCAGTAGCTATTACATGTCTTGGGTTC GCCAGACTCCGGAGAAGAGGCTGGAGTGGGTCGCGACCATAAGTGATGGTGGTGA TAACACCTACTACGCAGGCACTGTGACGGGCCGATTCACCATCTCCAGAGACTTTG CCAAGAACACCCTGTACCTGCAAATGAACAGTCTGACCTCTGAGGACACAGCCGT GTATTACTGTGCAAGAATTCATTGGCCTTACTATTTTGACTCCTGGGGCCAAGGCA CCACTCTCACAGTCTCCTCA (SEQ ID NO: 24). In some embodiments, the heavy chain consists of SEQ ID NO: 24. Antibody M9 was sequenced and found to have a heavy chain consisting of SEQ ID NO: 24. The CDRs of this heavy chain, as determined using Chothia scheme, are SEQ ID NOs: 17-19.

In some embodiments, the agent comprises a light chain comprising the amino acid sequence

```
(SEQ ID NO: 25)
QFVLSQSPAILSASPGEMLTMTCRASSSVSYMNWY
QQKPGSSPKPWIYATSDLASGVPARFSGSGSGTSY
SLTISRVEAEDAATYYCQQWSSHPPTFGGGTKLEI
R.
```

In some embodiments, the variable region of the light chain comprises and/or consists of SEQ ID NO: 25. In some embodiments, the agent comprises a light chain comprising a polypeptide encoded by the nucleic acid sequence: CAATTTGTTCTCTCCCAGTCTCCAGCAATCCTGTCTGCATCTCCCGGGGAGATGCTC ACAATGACTTGCAGGGCCAGCTCAAGTGTAAGTTATATGAACTGGTATCAGCAGA AGCCAGGATCTTCCCCCAAACCCTGGATTTATGCCACATCCGACCTGGCTTCTGGA GTCCCTGCTCGCTTCAGTGGCAGTGGGTCT GGGACCTCTTATTCTCTCACAATCAGC AGAGTGGAGGCTGAAGATGCTGCCACTTATTACTGCCAGCAGTGGAGTAGTCACCC ACCCACGTTCGGAGGGGGGACCAAGCTGGAAATAAGA (SEQ ID NO: 26). In some embodiments, the light chain consists of SEQ ID NO: 26. Antibody M9 was sequenced and found to have a light chain consisting of SEQ ID NO: 26. The CDRs of this light chain, as determined using Chothia scheme, are SEQ ID NOs: 20-22.

In some embodiments, the agent binds as a monomer. In some embodiments, the agent binds as a dimer. In some embodiments, the agent binds as a monomer and/or a dimer. In some embodiments, the agent binds as a dimer, but does not crosslink and/or activate mCD28. In some embodiments, the agent binds as a dimer, but only binds a single molecule of CD28. In some embodiments, the agent binds monomeric CD28. In some embodiments, the agent binds dimeric CD28. In some embodiments, the agent binds monomeric and/or dimeric CD28.

In some embodiments, the agent is not a CD28 agonist. In some embodiments, the agent is not a CD28 antagonist. In some embodiments, the agent is neither a CD28 agonist or antagonist.

The term "agonist" generally refers to a molecule, compound or agent that binds to a receptor and activates, fully or partially, the receptor. In some embodiments, the agonist binds at the same site as the natural ligand. In some embodiments, the agonist binds at an allosteric site different from the binding site of the natural ligand. The term "antagonist" generally refers to a molecule, compound or agent that binds to a receptor at the same site as an agonist or another site, does not activate the receptor and does one or more of the following: interferes with or blocks activation of the receptor by a natural ligand, and interferes with or blocks activation of the receptor by a receptor agonist. In some embodiments, the antibodies of the invention bind to mCD28 but do not activate or block activation of the receptor. In some embodiments, they do not block activation by CD86. In some embodiments, the antibodies of the invention do not bind mCD28.

As used herein, a "direct agonist/antagonist" refers to a molecule that binds to a receptor (mCD28) and by binding increases/decreases signaling by that molecule. In the case of mCD28 an agonist would bind mCD28 and by binding increase mCD28 signaling in the cell. In some embodiments, the agonist increases T cell activation. In some embodiments, the agonist increases T cell proliferation. In some embodiments, the agonist increases pro-inflammatory cytokine secretion. Pro-inflammatory cytokines are well known in the art and are known to be secreted by activated T cells. Examples of pro-inflammatory cytokines include, but are not limited to, TNFα, IFNγ, IL-1B, IL-2, and IL-6. In some embodiments, the pro-inflammatory cytokine is IFNγ. In some embodiments, the pro-inflammatory cytokine is IL-2. In the case of mCD28 an antagonist would bind mCD28 and by binding decrease mCD28 signaling in the cell. In some embodiments, the antagonist decreases T cell activation, decreases T cell proliferation and/or decreases pro-inflammatory cytokine secretion. A molecule that affects a receptor's signaling by contacting its ligand, contacting an inhibitor, contacting a co-receptor or contacting any molecule other than the receptor in question in order to modify receptor signaling is not considered a direct agonist/antagonist. In some embodiments, the agent of the invention contacts sCD28 in serum and thereby allows for increased signaling through mCD28 on cells. Though the result is increased mCD28 signaling the antibody is not a mCD28 agonist or direct agonist as its binding to mCD28 does not increase the receptors signaling.

In some embodiments, the agent does not bind the ligand binding domain of mCD28. In some embodiments, the agent does not obscure or block access to the ligand binding domain. In some embodiments, the agent does not bind, obscure or block access to the IgV domain of sCD28. In some embodiments, the IgV domain is the ligand binding domain. In some embodiments, the ligand binding domain comprises amino acids 28-137 of SEQ ID NO: 1. In some embodiments, the ligand binding domain comprises or consists of the amino acid sequence MLVAYD-NAVNLSCKYSYNLFSREFRASLHKGLDSAVEVCV-VYGNYSQQLQVYSKTG FNCDGKLGNESVTFYLQNLYVNQTDIYFCKI-EVMYPPPYLDNEKSNGTIIHVKG (SEQ ID NO: 8). In some embodiments, the agent does not inhibit binding of sCD28 to a ligand. In some embodiments, the CD28 ligand is selected from: CD80, CD86 and ICOSL. In some embodiments, the CD28 ligand is CD86. In some embodiments, the CD28 ligand is CD80. In some embodiments, the CD28 ligand is ICOSL. In some embodiments, CD86 is CD86-Fc. In some embodiments, CD80 is CD80-Fc.

In some embodiments, the agent binds a stalk region of CD28. In some embodiments, the agent binds a membrane proximal region of mCD28. In some embodiments, the stalk region comprises the sequence GKHLCPSPLFPGPSKP (SEQ ID NO: 9). In some embodiments, the stalk region comprises the sequence KGKHLCPSPLFPGPS (SEQ ID NO: 27). In some embodiments, the stalk region comprises or consists of the sequence HVKGKHLCPSPLFPGPSKP (SEQ ID NO: 10). In some embodiments, the agent binds monomeric sCD28. In some embodiments, the agent binds dimeric sCD28. In some embodiments, the agent binds monomeric sCD28, dimeric sCD28 or both. In some embodiments, the agent binds monomeric but not dimeric CD28. In some embodiments, a fragment of the CD28 extracellular domain is the stalk region. In some embodiments, the agent binding to CD28 prevents cleavage of CD28. In some embodiments, the agent binding to CD28 prevents shedding of CD28 from a cell.

In some embodiments, the agent binds at a cleavage site in the stalk region. In some embodiments, the agent binds at a cleavage site within mCD28. In some embodiments, the agent binds at a cleavage site of at least one protease. In some embodiments, the agent binds at a cleavage site of MMP-2.

In some embodiments, the agent does not bind the ligand binding domain of mCD28. In some embodiments, the agent does not obscure or block access to the ligand binding domain. In some embodiments, the agent binds a cleavage site. In some embodiments, the agent obscures, occludes or blocks access to a cleavage site. In some embodiments, the agent binds, blocks, occludes or obscures a protease cleavage site. In some embodiments, the agent does not bind a protease cleavage site but occludes the site. In some embodiments, the agent blocks access to a protease cleavage site. In some embodiments, the agent generates steric hinderance that blocks a protease cleavage site. In some embodiments, the agent does not bind a protease cleavage site but binding of the agent generates a conformational change to mCD28 that blocks the protease cleavage site. In some embodiments, binding of the agent generates a conformational change to mCD28 that blocks a protease cleavage site. In some embodiments, the protease is MMP-2. In some embodiments, the protease is MMP-13. In some embodiments, the cleavage site is a cleavage motif. In some embodiments, the MMP-2 cleavage motif is PXX/X, wherein the last X is a hydrophobic residue. In some embodiments, the PXX/X motif in CD28 is PSP/L. In some embodiments, the protease cleavage site is amino acids 142-145 (PSPL) of SEQ ID NO: 1. In some embodiments, the protease cleavage site is amino acids 127-130 (PSPL) of SEQ ID NO: 2. In some embodiments, the protease cleavage site is amino acids 9-12 (PSPL) of SEQ ID NO: 10. In some embodiments, the agent blocks accesses of a protease to a cleavage site. In some embodiments, the agent binds to PSPL in a stalk domain of mCD28.

In some embodiments, the cleavage site is before a leucine. In some embodiments, the cleavage site is before a valine. In some embodiments, the cleavage site is before an aromatic amino acid. In some embodiments, the cleavage site is before a leucine, valine and/or aromatic amino acid. In some embodiments, the aromatic amino acid is selected from phenylalanine, tryptophan, tyrosine and histidine. In some embodiments, the cleavage site is before any one of histidine 134, valine 135, histidine 139, leucine 140, leucine 145, and phenylalanine 146 of SEQ ID NO: 1. In some embodiments, the cleavage site is before histidine 134, valine 135, histidine 139, leucine 140, leucine 145, or phenylalanine 146 of SEQ ID NO: 1. Each possibility represents a separate embodiment of the invention. In some embodiments, the cleavage site is before leucine 145 of SEQ ID NO: 1. In some embodiments, the cleavage site is before leucine 145 of SEQ ID NO: 1. In some embodiments, he cleavage site is before leucine 127 of SEQ ID NO: 2.

In some embodiments, the agent does not bind a stalk region of CD28 with a mutated cleavage site. In some embodiments, the stalk region of CD28 with a mutated cleavage site is not a substrate for a protease. In some embodiments, the stalk region of CD28 with a mutated cleavage site is not a substrate for a metalloprotease. In some embodiments, the stalk region of CD28 with a mutated cleavage site is not a substrate for a matrix metalloprotease. In some embodiments, the stalk region of CD28 with a mutated cleavage site is not a substrate for matrix metalloprotease 2 (MMP-2). In some embodiments, the stalk region of CD28 with a mutated cleavage site is not a substrate for matrix metalloprotease 13 (MMP-13). In some embodiments, the mutated cleavage site is a mutation of leucine 145 of SEQ ID NO: 1. In some embodiments, the mutated cleavage site is an amino acid substitution for leucine 145 of SEQ ID NO: 1. In some embodiments the amino acid substitution for leucine 145 of SEQ ID NO: 1 is a lysine.

In some embodiments, the agent does not modulate CD28 function and/or signaling. In some embodiments, the agent does not degrade mCD28. In some embodiments, the agent does not lead to or facilitate mCD28 degradation. In some embodiments, the signaling is mCD28-mediated immune cell activation. In some embodiments, the agent does not inhibit immune cell activation. In some embodiments, the agent does not induce CD28 receptor internalization or recycling. Co-stimulation via mCD28 is essential for immune activation of T-cells. Proteolytic cleavage removed the ligand-binding domain in the extracellular region of CD28 from the transmembrane and cytoplasmic portions of the protein which remain in the membrane. Thus, cleaved CD28 cannot signal and cannot contribute to T cell activation. Thus, an agent that blocks cleavage, and is also an antagonist does not allow for mCD28 activation. Similarly, an agent that blocks cleavage, but is also an agonist could induce aberrant T-cell activation, and potentially an autoimmune response.

In some embodiments, the agent does not reduce surface levels of mCD28 on an immune cell. In some embodiments, the immune cell is a T cell. In some embodiments, the agent reduces surface levels of mCD28 by less than 50, 40, 30, 25, 20, 15, 10, 7, 5, 3, 2 or 1%. Each possibility represents a separate embodiment of the invention.

In some embodiments, the binding of the agent to a cell does not kill the cell. In some embodiments, the binding of the agent to a cell does not lead to death of the cell. In some embodiments the agent does not induce antibody dependent cell-mediated cytotoxicity (ADCC). In some embodiments, the agent does not induce complement-dependent cytotoxicity (CDC). In some embodiments, the agent does not induce ADCC and/or CDC. In some embodiments, the agent is an antibody and comprises an IgG2 or IgG4 domain. In some embodiments, the antibody comprises an IgG2 domain. In some embodiments, the antibody comprises an IgG4 domain. In some embodiments, the antibody comprises an IgG1 or IgG3 mutated to reduce cell death mediated by binding of the antibody. In some embodiments, the mutation mutates a Fc receptor binding domain. In some embodiments, a Fc domain of the antibody is engineered or mutated to decrease CDC, ADCC or both. Fc engineering is well known in the art, and any mutation or amino acid change that is known to decrease antibody mediated cell killing may be used.

In some embodiments, the agent lacks an Fc domain. In some embodiments, the agent is an antigen binding domain that lacks an Fc domain. In some embodiments, the agent is a single-domain antibody. In some embodiments, the agent is a camelid, shark or nanobody.

In some embodiments, the agent is a non-antibody protein. In some embodiments, the agent is a small molecule. In some embodiments, the agent is a nucleic acid molecule. In some embodiments, the agent is a synthetic peptide. In some embodiments, the agent is a synthetic binding protein. In some embodiments, the synthetic peptide is based on a non-antibody scaffold. In some embodiments, the agent is an antibody mimetic. In some embodiments, the antibody mimetic has a molar mass of less than 100, 90, 80, 70, 60, 50, 40, 30 or 20 kDa. Each possibility represents a separate embodiment of the invention. In some embodiments, the agent is a nucleic acid aptamer. In some embodiments, the aptamer is DNA. In some embodiments, the aptamer is RNA. In some embodiments, the aptamer is DNA or RNA. Examples of antibody mimetics include, but are not limited to, affilins, affimers, affitins, alphabodies, anticalins, avimers, DARPins, fynomers, Kunitz domain peptides, monobodies, and nanoCLAMPS. In some embodiments, the antibody mimetic is a DARPin.

In some embodiments, the agent inhibits proteolytic cleavage by at least one protease. In some embodiments, the protease is a metalloprotease. In some embodiments, the protease is a matrix metalloprotease. In some embodiments, the protease is a serine protease. In some embodiments, the protease is a cysteine protease. In some embodiments, the protease is a threonine protease. In some embodiments, the protease is a serine, cysteine or threonine protease. In some embodiments, the protease is an aspartic protease. In some embodiments, the protease is a glutamic protease. In some embodiments, the protease is selected from an aspartic, a glutamic, a serine, a cysteine and a threonine protease. In some embodiments, the protease is an asparagine peptide lyases. In some embodiments, the protease is a sheddase. In some embodiments, the metalloprotease is an exopeptidase. In some embodiments, the metalloprotease is an endopeptidase. In some embodiments, the metalloprotease is an exopeptidase or endopeptidase. In some embodiments, the metalloprotease is zinc catalyzed. In some embodiments, the metalloprotease is cobalt catalyzed. In some embodiments, the metalloprotease is matrix metalloproteinase-2 (MMP-2). In some embodiments, the metalloprotease is matrix metalloproteinase-13 (MMP-13). In some embodiments, the metalloprotease is ADAM10. In some embodiments, the metalloprotease is ADAM17. In some embodiments, the metalloprotease is ADAM10, MMP-2, and/or ADAM17. In some embodiments, the metalloprotease is ADAM10, MMP-2, MMP-13 and/or ADAM17. In some embodiments, the metalloprotease is MMP-2, ADAM10, ADAM17 or a combination thereof. In some embodiments, the metalloprotease is MMP-2, MMP-13, ADAM10, ADAM17 or a combination thereof.

Methods of Use

By another aspect, there is provided a method of treating and/or preventing cancer in a subject in need thereof, the method comprising administering the agent of the invention.

By another aspect, there is provided a method of improving immunotherapy in a subject in need thereof, the method comprising administering the agent of the invention.

By another aspect, there is provided a method of decreasing sCD28 in a subject in need thereof, the method comprising administering the agent of the invention.

In some embodiments, the immunotherapy is PD-1 and/or PD-L1 based immunotherapy. In some embodiments, the PD-1/PD-L1 based immunotherapy comprises administering an anti-PD1 or anti-PD-L1 antibody. In some embodiments, the therapy comprises blockade of the PD-1 checkpoint. In some embodiments, the immunotherapy comprises administering allogenic, syngeneic or autologous immune cells to the subject. In some embodiments, the immune cells are T cells. In some embodiments, the subject in need of immunotherapy suffers from cancer. In some embodiments, the subject suffers from cancer. In some embodiments, the cancer is a sCD28 positive cancer. In some embodiments, the cancer is a sCD28 high cancer. In some embodiments, the subject is at risk for developing cancer.

As used herein, the terms "treatment" or "treating" of a disease, disorder, or condition encompasses alleviation of at least one symptom thereof, a reduction in the severity thereof, or inhibition of the progression thereof. Treatment need not mean that the disease, disorder, or condition is totally cured. To be an effective treatment, a useful composition herein needs only to reduce the severity of a disease, disorder, or condition, reduce the severity of symptoms associated therewith, or provide improvement to a patient or subject's quality of life.

In some embodiments, the decreasing comprises administering to the subject at least one agent of the invention. As used herein, the terms "administering," "administration," and like terms refer to any method which, in sound medical practice, delivers a composition containing an active agent to a subject in such a manner as to provide a therapeutic effect. One aspect of the present subject matter provides for oral administration of a therapeutically effective amount of an agent of the invention to a patient in need thereof. Other suitable routes of administration can include parenteral, subcutaneous, intravenous, intramuscular, or intraperitoneal.

By another aspect, there is provided a pharmaceutical composition comprising an agent of the invention and a therapeutically acceptable carrier, adjuvant or excipient. In some embodiments, the administering is administering a pharmaceutical composition of the invention.

As used herein, the term "carrier," "excipient," or "adjuvant" refers to any component of a pharmaceutical composition that is not the active agent. As used herein, the term "pharmaceutically acceptable carrier" refers to non-toxic, inert solid, semi-solid liquid filler, diluent, encapsulating material, formulation auxiliary of any type, or simply a sterile aqueous medium, such as saline. Some examples of the materials that can serve as pharmaceutically acceptable carriers are sugars, such as lactose, glucose and sucrose, starches such as corn starch and potato starch, cellulose and its derivatives such as sodium carboxymethyl cellulose, ethyl cellulose and cellulose acetate; powdered tragacanth; malt, gelatin, talc; excipients such as cocoa butter and suppository waxes; oils such as peanut oil, cottonseed oil, safflower oil, sesame oil, olive oil, corn oil and soybean oil; glycols, such as propylene glycol, polyols such as glycerin, sorbitol, mannitol and polyethylene glycol; esters such as ethyl oleate and ethyl laurate, agar; buffering agents such as magnesium hydroxide and aluminum hydroxide; alginic acid; pyrogen-free water; isotonic saline, Ringer's solution; ethyl alcohol and phosphate buffer solutions, as well as other non-toxic compatible substances used in pharmaceutical formulations. Some non-limiting examples of substances which can serve as a carrier herein include sugar, starch, cellulose and its derivatives, powered tragacanth, malt, gelatin, talc, stearic acid, magnesium stearate, calcium sulfate, vegetable oils, polyols, alginic acid, pyrogen-free water, isotonic saline, phosphate buffer solutions, cocoa butter (suppository base), emulsifier as well as other non-toxic pharmaceutically compatible substances used in other pharmaceutical formulations. Wetting agents and lubricants such as sodium lauryl sulfate, as well as coloring agents, flavoring agents, excipients, stabilizers, antioxidants, and preservatives may also be present. Any non-toxic, inert, and effective carrier may be used to formulate the compositions contemplated herein. Suitable pharmaceutically acceptable carriers, excipients, and diluents in this regard are well known to those of skill in the art, such as those described in The Merck Index, Thirteenth Edition, Budavari et al., Eds., Merck & Co., Inc., Rahway, N.J. (2001); the CTFA (Cosmetic, Toiletry, and Fragrance Association) International Cosmetic Ingredient Dictionary and Handbook, Tenth Edition (2004); and the "Inactive Ingredient Guide," U.S. Food and Drug Administration (FDA) Center for Drug Evaluation and Research (CDER) Office of Management, the contents of all of which are hereby incorporated by reference in their entirety. Examples of pharmaceutically acceptable excipients, carriers and diluents useful in the present compositions include distilled water, physiological saline, Ringer's solution, dextrose solution, Hank's solution, and DMSO. These additional inactive components, as well as effective formulations and administration procedures, are well known in the art and are described in standard textbooks, such as Goodman and Gillman's: The Pharmacological Bases of Therapeutics, 8th Ed., Gilman et al. Eds. Pergamon Press (1990); Remington's Pharmaceutical Sciences, 18th Ed., Mack Publishing Co., Easton, Pa. (1990); and Remington: The Science and Practice of Pharmacy, 21st Ed., Lippincott Williams & Wilkins, Philadelphia, Pa., (2005), each of which is incorporated by reference herein in its entirety. The presently described composition may also be contained in artificially created structures such as liposomes, ISCOMS, slow-releasing particles, and other vehicles which increase the half-life of the peptides or polypeptides in serum. Liposomes include emulsions, foams, micelles, insoluble monolayers, liquid crystals, phospholipid dispersions, lamellar layers and the like. Liposomes for use with the presently described peptides are formed from standard vesicle-forming lipids which generally include neutral and negatively charged phospholipids and a sterol, such as cholesterol. The selection of lipids is generally determined by considerations such as liposome size and stability in the blood. A variety of methods are available for preparing liposomes as reviewed, for example, by Coligan, J. E. et al, Current Protocols in Protein Science, 1999, John Wiley & Sons, Inc., New York, and see also U.S. Pat. Nos. 4,235,871, 4,501,728, 4,837,028, and 5,019,369.

The carrier may comprise, in total, from about 0.1% to about 99.99999% by weight of the pharmaceutical compositions presented herein.

In some embodiments, the methods of the invention do not degrade or lead to degradation of mCD28. In some embodiments, the methods of the invention do not decrease mCD28 levels on immune cells. In some embodiments, the methods of the invention do not decrease mCD28-mediated immune cell activation. In some embodiments, the methods of the invention maintain mCD28 levels on immune cells in the subject. In some embodiments, the methods of the invention increase mCD28 levels on immune cells in the subject.

In some embodiments, the reduction is at least a 10, 20, 30, 40, 50, 60, 70, 80, 90, 95, or 99% reduction in sCD28. Each possibility represents a separate embodiment of the invention. In some embodiments, the reduction is in serum sCD28. In some embodiments, the reduction is in the blood levels of sCD28. In some embodiments, the reduction is in the levels of sCD28 in the tumor microenvironment (TME).

In some embodiments, the subject's blood comprises elevated levels of sCD28. In some embodiments, the subject's blood before the decreasing comprises elevated levels of sCD28. In some embodiments, the levels are elevated above those of healthy subjects. In some embodiments, the subject's sCD28 levels are elevated by at least 5%, 10%, 15%, 20%, 25%, 30%, 40%, 50%, 60%, 70%, 80%, 90%, 100%, 150%, 200%, 250%, 300%, 350%, 400%, 500%, 600%, 700%, 800%, 900%, or 1000% above healthy subject levels. Each possibility represents a separate embodiment of the invention. In some embodiments, the levels are elevated above 5, 6, 7, 8, 9, 10, 12, 14, 15, 16, 18, 20, 25, 30, 35, 40, 45 or 50 ng/ml of blood. Each possibility represents a separate embodiment of the invention. In some embodiments, the levels are elevated above 5 ng/ml. In some embodiments, the levels are elevated above 10 ng/ml. In some embodiments, the levels are elevated above 20 ng/ml. In some embodiments, the subject's blood comprises at least 5, 6, 7, 8, 9, 10, 12, 14, 15, 16, 18, 20, 25, 30, 35, 40, 45 or 50 ng sCD28 per ml of blood. Each possibility represents a separate embodiment of the invention. In some embodiments, the subject's blood prior to the decreasing comprises at least 5, 6, 7, 8, 9, 10, 12, 14, 15, 16, 18, 20, 25, 30, 35, 40, 45 or 50 ng sCD28 per ml of blood. Each possibility represents a separate embodiment of the invention. In some embodiments, the subject's blood comprises at least 5 ng/ml sCD28. In some embodiments, the subject's blood comprises at least 10 ng/ml sCD28. In some embodiments, the subject's blood comprises at least 20 ng/ml sCD28. In some embodiments, the subject's blood prior to the decreasing comprises at least 5 ng/ml sCD28. In some embodiments, the subject's blood prior to the decreasing comprises at least 10 ng/ml sCD28. In some embodiments, the subject's blood prior to the decreasing comprises at least 20 ng/ml sCD28.

In some embodiments, the subject suffers from cancer. In some embodiments, the cancer is a cancer that can be treated with PD-1/PD-L1 therapy. In some embodiments, the subject has undergone PD-1/PD-L1 therapy. In some embodiments, the subject is a non-responder to PD-1/PD-L1 therapy. In some embodiments, the subject is naïve to PD-1/PD-L1 therapy. In some embodiments, the methods of the invention are performed together with PD-1/PD-L1 therapy. In some embodiments, the methods of the invention are performed before PD-1/PD-L1 therapy.

In some embodiments, the method further comprises administering another immunotherapy to the subject. In some embodiments, the method further comprises administering a PD-1 and/or PD-L1 based immunotherapy. In some embodiments, the another immunotherapy is a checkpoint inhibitor. In some embodiments, the checkpoint inhibitor is a PD-1 and/or PD-L1 inhibitor. In some embodiments, the checkpoint inhibitor is a CTLA-4 inhibitor. In some embodiments, the another immunotherapy is a chimeric antigen receptor (CAR) based immunotherapy. In some embodiments, the CAR is a CAR-T. In some embodiments, the CAR is a CAR-NK. In some embodiments, the another immunotherapy is a cancer vaccine.

As used herein, the terms "CAR-T cell" and "CAR-NK cell" refer to an engineered receptor which has specificity for at least one protein of interest (for example an immunogenic protein with increased expression following treatment with an epigenetic modifying agent) and is grafted onto an immune effector cell (a T cell or NK cell). In some embodiments, the CAR-T cell has the specificity of a monoclonal antibody grafted onto a T-cell. In some embodiments, the CAR-NK cell has the specificity of a monoclonal antibody grafted onto a NK-cell. In some embodiments, the T cell is selected from a cytotoxic T lymphocyte and a regulatory T cell.

CAR-T and CAR-NK cells and their vectors are well known in the art. Such cells target and are cytotoxic to the protein for which the receptor binds. In some embodiments, a CAR-T or CAR-NK cell targets at least one viral protein. In some embodiments, a CAR-T or CAR-NK cell targets a plurality of viral proteins. In some embodiments, a CAR-T or CAR-NK cell targets a viral protein with increased expression due to contact with an epigenetic modifying agent.

Construction of CAR-T cells is well known in the art. In one non-limiting example, a monoclonal antibody to a viral protein can be made and then a vector coding for the antibody will be constructed. The vector will also comprise a costimulatory signal region. In some embodiments, the costimulatory signal region comprises the intracellular domain of a known T cell or NK cell stimulatory molecule. In some embodiments, the intracellular domain is selected from at least one of the following: CD3Z, CD27, CD28, 4-1BB, OX40, CD30, CD40, PD-1, ICOS, lymphocyte function-associated antigen-1 (LFA-1), CD2, CD 7, LIGHT, NKG2C, B7-H3, and a ligand that specifically binds with CD83. In some embodiments, the vector also comprises a CD3Z signaling domain. This vector is then transfected, for example by lentiviral infection, into a T-cell.

In some embodiments, the cancer is a cancer with elevated sCD28 levels. In some embodiments, the cancer comprises high sCD28 levels. In some embodiments, elevated and/or high sCD28 levels are levels at and/or above 5, 6, 7, 8, 9, 10, 12, 14, 15, 17, 20, 25, 30, 35, 40, 50, 60, 70, 80, 90 or 100 ng/ml. Each possibility represents a separate embodiment of the invention. In some embodiments, the cancer comprises high sCD28 levels. In some embodiments, elevated and/or high sCD28 levels are levels at and/or above 5, 10, 15, 20, 25, 30, 35, 40, 45, 50, 55, 60, 65, 70, or 75% of the levels in a healthy subject. Each possibility represents a separate embodiment of the invention. In some embodiments, the cancer is not breast cancer. In some embodiments, the cancer is selected from melanoma, head and neck, non-small cell lung cancer, ovarian, kidney, gastric and colorectal. In some embodiments, the cancer is selected from melanoma, head and neck, non-small cell lung cancer, ovarian, and colorectal. In some embodiments, the cancer is melanoma, head and neck, non-small cell lung cancer, ovarian, kidney, gastric or colorectal. Each possibility represents a separate embodiment of the invention.

Kits

By another aspect, there is provided a kit comprising at least one agent of the invention, or the pharmaceutical composition of the invention.

In some embodiments, the kit further comprises a PD-1 and/or PD-L1 based immunotherapeutic. In some embodiments, the kit comprises a label stating the agent of the invention is for use with a PD-1 and/or PD-L1 based immunotherapeutic. In some embodiments, the kit comprises a label stating the PD-1 and/or PD-L1 based therapeutic is for use with an antibody or pharmaceutical composition of the invention.

By another aspect, there is provided a kit comprising a PD-1 and/or PD-L1 based immunotherapeutic comprising a label stating it is for use with an antibody or pharmaceutical composition of the invention.

In some embodiments, a kit of the invention is for use in treating cancer. In some embodiments, a kit of the invention is a diagnostic kit. In some embodiments, a kit of the invention is for use in determining serum levels of sCD28 in a subject in need thereof. In some embodiments, the subject suffers from cancer. In some embodiments, a kit of the invention is for use in determining suitability of a subject to be treated with an agent or pharmaceutical composition of Methods of Agent Generation By another aspect, there is provided a method of generating an agent that inhibits proteolytic cleave of mCD28 on a surface of a cell, comprising:
a. obtaining an agent that binds to a CD28 extracellular domain or fragment thereof wherein the agent is smaller than 100 kDa;
b. testing binding of the obtained agent to mCD28 on a cell surface; and
c. selecting an agent that binds cell surface mCD28;
thereby generating an agent that inhibits proteolytic cleavage of mCD28 on a surface of a cell.

By another aspect, there is provided a method of generating an agent that inhibits proteolytic cleave of mCD28 on a surface of a cell, comprising:
a. culturing a host cell comprising one or more vectors comprising a nucleic acid sequence encoding an agent, wherein the nucleic acid sequence is that of an agent that was selected by:
  i. obtaining an agent that binds to a CD28 extracellular domain or fragment thereof wherein the agent is smaller than 100 kDa;
  ii. testing binding of the obtained agent to mCD28 on a cell surface; and
  iii. selecting an agent that binds cell surface mCD28;
thereby generating an agent that inhibits proteolytic cleavage of mCD28 on a surface of a cell.

In some embodiments, the method further comprises testing an ability of the agent to block cleave by a protease of mCD28 on a cell surface. In some embodiments, the agent is an anti-cleavage agent. In some embodiments, the agent is an anti-shedding agent. In some embodiments, the agent decreases shedding of sCD28 in a subject. In some embodiments, the agent decreases cleavage of mCD28. In some embodiments, the agent decreases cleavage of mCD28 in a subject.

In some embodiments, the protease is MMP-2. In some embodiments, the protease is MMP-13. In some embodiments, the protease is ADAM10. In some embodiments, the protease is ADAM17. In some embodiments, the protease is MMP-2, ADAM10, ADAM17 or a combination thereof. MMP-2, MMP-13, ADAM10, ADAM17 or a combination thereof.

As used herein, the term "extracellular domain of CD28" refers to the N-terminal portion of CD28 that comes before the transmembrane domain. In some embodiments, an extracellular domain of CD28 is sCD28. In some embodiments, an extracellular domain of CD28 is CD28a. In some embodiments, an extracellular domain of CD28 is the CD28 stalk domain. In some embodiments, an extracellular domain of CD28 comprises the stalk domain of CD28. In some embodiments, an extracellular domain of CD28 comprises or consists of the sequence NKILVKQSPMLVAYD-NAVNLSCKYSYNLFSREFRASLHKGLDSAVEVCV-VYGNYSQQ LQVYSKTGFNCDGKLGNESVTFYLQN-LYVNQTDIYFCKIEVMYPPPYLDNEKSNGTIIH VKGKHLCPSPLFPGPSKP (SEQ ID NO: 28). In some embodiments, the extracellular domain of CD28 or a fragment thereof is dimeric. In some embodiments, the extracellular domain of CD28 or a fragment thereof is monomeric. In some embodiments, the extracellular domain of CD28 or a fragment thereof is dimeric or monomeric.

As used herein, a "fragment" refers to a partial polypeptide that makes up part of the larger protein or protein domain. In some embodiments, a fragment comprises at least 10, 20, 30, 40 or 50 amino acids. Each possibility represents a separate embodiment of the invention. In some embodiments, a fragment comprises at most 10, 20, 30, 40, 50, 60 70, 80, 90 or 100 amino acids. Each possibility represents a separate embodiment of the invention. In some embodiments, obtaining an agent that binds a fragment of the extracellular domain of CD28 is obtaining an agent that binds specifically to a CD28 stalk domain.

In some embodiments, the method further comprises assaying mCD28 downstream signaling in the presence of the obtained agent and selecting at least one agent that neither substantially agonizes nor substantially antagonizes mCD28 signaling. In some embodiments, the selecting is selecting at least one agent that does not antagonize mCD28 signaling. It will be understood by a skilled artisan that for cancer treatment agonizing CD28 signaling might not be deleterious, but that antagonizing the signaling would be counterproductive.

In some embodiments, testing an agent's ability to block cleavage comprises measuring sCD28 in serum of activated immune cells in the presence and absence of the agent. In some embodiments, testing an agent's ability to block cleavage comprises mixing of the agent, the protease and an extracellular domain of CD28 or a fragment thereof comprising a cleavage site. In some embodiments, the testing further comprises sequencing the extracellular domain of CD28 or a fragment thereof to check for truncation and/or cleavage. In some embodiments, the testing further comprises running the extracellular domain of CD28 or a fragment thereof on a gel that is sufficiently sensitive to measure the size change due to cleavage. In some embodiments, the testing further comprises measuring the production of sCD28 from cells expressing mCD28 in the presence of the agent and the protease.

In some embodiments, the obtaining an agent comprises immunizing a shark or camelid with said CD28 extracellular domain or fragment thereof and collecting antibodies from said immunized organism. In some embodiments, the obtaining an agent comprises screening a library of agents for binding to a CD28 extracellular domain or fragment thereof and selecting an agent that binds.

In some embodiments, the collecting an antibody comprises extracting B cells from a spleen of the immunized shark or camelid. In some embodiments, the B cells are fused with a melanoma cell to produce a hybridoma. In some embodiments, the antibodies are collected from the culture media of the hybridoma. In some embodiments, obtaining the agent comprises immunizing an organism with the CD28 extracellular domain or fragment thereof, and collecting antibodies from the immunized organism. In some embodiments, the organism is a mouse. In some embodiments, the organism is selected from a rabbit, a mouse, a rat, a shark, a camelid, a chicken a goat and a phage. In some embodiments, the camelid is selected from a camel and a llama. In some embodiments, the collecting comprises drawing blood. In some embodiments, the collecting comprises:
a. extracting B cells from a spleen of the immunized organism;
b. fusing the extracted B cells with myeloma cells to produce a hybridoma; and
c. collecting antibodies from the hybridoma.

In some embodiments, obtaining the agent comprises screening a library of agents for binding to a CD28 extracellular domain or fragment thereof and selecting an agent that so binds. In some embodiments, the library is a phage display library. In some embodiments, the library is an immunized library derived from splenic B cells. In some embodiments, the library is an IgG library. In some embodiments, the library is a Fab library. In some embodiments, the library is a library of VHH antibodies. In some embodiments, the library is a library of single chain, single domain or nanobodies. In some embodiments, obtaining the agent comprises sequencing the agent. In some embodiments, obtaining the agent comprises producing a recombinant form of the agent. In some embodiments, selecting the agent comprises sequencing the agent. In some embodiments, selecting the agent comprises producing a recombinant form of the agent. In some embodiments, the recombinant form is produced from the sequence of the agent. In some embodiments, the method further comprises humanizing the agent.

Expressing of a nucleic acid molecule that encodes an agent within a cell is well known to one skilled in the art. It can be carried out by, among many methods, transfection, viral infection, or direct alteration of the cell's genome. In some embodiments, the gene is in an expression vector such as plasmid or viral vector. One such example of an expression vector containing p16-Ink4a is the mammalian expression vector pCMV p16 INK4A available from Addgene.

A vector nucleic acid sequence generally contains at least an origin of replication for propagation in a cell and optionally additional elements, such as a heterologous polynucleotide sequence, expression control element (e.g., a promoter, enhancer), selectable marker (e.g., antibiotic resistance), poly-Adenine sequence.

The vector may be a DNA plasmid delivered via non-viral methods or via viral methods. The viral vector may be a retroviral vector, a herpesviral vector, an adenoviral vector, an adeno-associated viral vector or a poxviral vector. The promoters may be active in mammalian cells. The promoters may be a viral promoter.

In some embodiments, the nucleic acid sequence encoding an agent is operably linked to a promoter. The term "operably linked" is intended to mean that the nucleotide sequence of interest is linked to the regulatory element or elements in a manner that allows for expression of the nucleotide sequence (e.g. in an in vitro transcription/translation system or in a host cell when the vector is introduced into the host cell).

In some embodiments, the vector is introduced into the cell by standard methods including electroporation (e.g., as described in From et al., Proc. Natl. Acad. Sci. USA 82, 5824 (1985)), Heat shock, infection by viral vectors, high velocity ballistic penetration by small particles with the nucleic acid either within the matrix of small beads or particles, or on the surface (Klein et al., Nature 327. 70-73 (1987)), and/or the like.

The term "promoter" as used herein refers to a group of transcriptional control modules that are clustered around the initiation site for an RNA polymerase i.e., RNA polymerase II. Promoters are composed of discrete functional modules, each consisting of approximately 7-20 bp of DNA, and containing one or more recognition sites for transcriptional activator or repressor proteins.

In some embodiments, nucleic acid sequences are transcribed by RNA polymerase II (RNAP II and Pol II). RNAP II is an enzyme found in eukaryotic cells. It catalyzes the transcription of DNA to synthesize precursors of mRNA and most snRNA and microRNA.

In some embodiments, mammalian expression vectors include, but are not limited to, pcDNA3, pcDNA3.1 (±), pGL3, pZeoSV2(±), pSecTag2, pDisplay, pEF/myc/cyto, pCMV/myc/cyto, pCR3.1, pSinRep5, DH26S, DHBB, pNMT1, pNMT41, pNMT81, which are available from Invitrogen, pCI which is available from Promega, pMbac, pPbac, pBK-RSV and pBK-CMV which are available from Strategene, pTRES which is available from Clontech, and their derivatives.

In some embodiments, expression vectors containing regulatory elements from eukaryotic viruses such as retroviruses are used by the present invention. SV40 vectors include pSVT7 and pMT2. In some embodiments, vectors derived from bovine papilloma virus include pBV-1MTHA, and vectors derived from Epstein Bar virus include pHEBO, and p205. Other exemplary vectors include pMSG, pAV009/A+, pMTO10/A+, pMAMneo-5, baculovirus pDSVE, and any other vector allowing expression of proteins under the direction of the SV-40 early promoter, SV-40 later promoter, metallothionein promoter, murine mammary tumor virus promoter, Rous sarcoma virus promoter, polyhedrin promoter, or other promoters shown effective for expression in eukaryotic cells.

In some embodiments, recombinant viral vectors, which offer advantages such as lateral infection and targeting specificity, are used for in vivo expression. In one embodiment, lateral infection is inherent in the life cycle of, for example, retrovirus and is the process by which a single infected cell produces many progeny virions that bud off and infect neighboring cells. In one embodiment, the result is that a large area becomes rapidly infected, most of which was not initially infected by the original viral particles. In one embodiment, viral vectors are produced that are unable to spread laterally. In one embodiment, this characteristic can be useful if the desired purpose is to introduce a specified gene into only a localized number of targeted cells.

Various methods can be used to introduce the expression vector of the present invention into cells. Such methods are generally described in Sambrook et al., Molecular Cloning: A Laboratory Manual, Cold Springs Harbor Laboratory, New York (1989, 1992), in Ausubel et al., Current Protocols in Molecular Biology, John Wiley and Sons, Baltimore, Md. (1989), Chang et al., Somatic Gene Therapy, CRC Press, Ann Arbor, Mich. (1995), Vega et al., Gene Targeting, CRC Press, Ann Arbor Mich. (1995), Vectors: A Survey of Molecular Cloning Vectors and Their Uses, Butterworths, Boston Mass. (1988) and Gilboa et at. [Biotechniques 4 (6): 504-512, 1986] and include, for example, stable or transient transfection, lipofection, electroporation and infection with recombinant viral vectors. In addition, see U.S. Pat. Nos. 5,464,764 and 5,487,992 for positive-negative selection methods.

It will be appreciated that other than containing the necessary elements for the transcription and translation of the inserted coding sequence (encoding the polypeptide), the expression construct of the present invention can also include sequences engineered to optimize stability, production, purification, yield or activity of the expressed polypeptide.

By another aspect, there is provided an agent produced by a method of the invention.

By another aspect, there is provided a pharmaceutical composition comprising an agent produced by a method of the invention and a pharmaceutically acceptable carrier, excipient or adjuvant.

As used herein, the term "about" when combined with a value refers to plus and minus 10% of the reference value. For example, a length of about 1000 nanometers (nm) refers to a length of 1000 nm+−100 nm.

It is noted that as used herein and in the appended claims, the singular forms "a," "an," and "the" include plural referents unless the context clearly dictates otherwise. Thus, for example, reference to "a polynucleotide" includes a plurality of such polynucleotides and reference to "the polypeptide" includes reference to one or more polypeptides and equivalents thereof known to those skilled in the art, and so forth. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

In those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination. All combinations of the embodiments pertaining to the invention are specifically embraced by the present invention and are disclosed herein just as if each and every combination was individually and explicitly disclosed. In addition, all sub-combinations of the various embodiments and elements thereof are also specifically embraced by the present invention and are disclosed herein just as if each and every such sub-combination was individually and explicitly disclosed herein.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

Various embodiments and aspects of the present invention as delineated hereinabove and as claimed in the claims section below find experimental support in the following examples.

EXAMPLES

Generally, the nomenclature used herein and the laboratory procedures utilized in the present invention include molecular, biochemical, microbiological and recombinant DNA techniques. Such techniques are thoroughly explained in the literature. See, for example, "Molecular Cloning: A laboratory Manual" Sambrook et al., (1989); "Current Protocols in Molecular Biology" Volumes I-III Ausubel, R. M., ed. (1994); Ausubel et al., "Current Protocols in Molecular Biology", John Wiley and Sons, Baltimore, Maryland (1989); Perbal, "A Practical Guide to Molecular Cloning", John Wiley & Sons, New York (1988); Watson et al., "Recombinant DNA", Scientific American Books, New York; Birren et al. (eds) "Genome Analysis: A Laboratory Manual Series", Vols. 1-4, Cold Spring Harbor Laboratory Press, New York (1998); methodologies as set forth in U.S. Pat. Nos. 4,666,828; 4,683,202; 4,801,531; 5,192,659 and 5,272,057; "Cell Biology: A Laboratory Handbook", Volumes I-III Cellis, J. E., ed. (1994); "Culture of Animal Cells—A Manual of Basic Technique" by Freshney, Wiley-Liss, N. Y. (1994), Third Edition; "Current Protocols in Immunology" Volumes Coligan J. E., ed. (1994); Stites et al. (eds), "Basic and Clinical Immunology" (8th Edition), Appleton & Lange, Norwalk, CT (1994); Mishell and Shiigi (eds), "Strategies for Protein Purification and Characterization—A Laboratory Course Manual" CSHL Press (1996); all of which are incorporated by reference. Other general references are provided throughout this document.

Materials and Methods

Antibodies—Commercial mouse monoclonal anti-CD28 clone #CD28.2 (Biolegend, Cat. No. 302902) and FITC conjugated (Biolegend, Cat. No. 302906). Goat polyclonal anti-CD28 (R&D system, Cat. No. AF-342-PB). FITC conjugated anti-Human PD-L1 (BD bioscience, Cat. No. 558065). APC conjugated anti-Human PD-L2 (Biolegend, Cat. No. 345508). PE conjugated anti-Human IDO (R&D system, Cat. No. IC6030P). Goat anti mouse IgG Alexa Fluor 647 (Biolegend, Cat. No. 405322). Donkey anti human IgG (H+L) Alexa Fluor 647 (Jackson immune research, Cat. No. 709-605-149). Goat anti mouse IgG HRP (Jackson immune research, Cat. No. 115-035-071). Anti-Human CD3 clone OKT3 (Biolegend, Cat. No. 317304). Anti-Human PD-1 pembrolizumab (MK-3475). Human IgG (Sigma, Cat. No. 14506).

Isolation of VHH targeting the stalk region of human CD28 receptor—The genetic code of peripheral blood B cells, derived from naïve non-immunized Llama, was used to construct a phage library composed of particles expressing individual VHHs as a fusion protein with a C-terminal His6-Myc tag. The naïve library was used to select nanobody with binding capabilities to the stalk region of human CD28. Screening were done with biotinylated recombinant CD28-Fc chimera or oxidized dimeric peptide with the sequence of "HVKGKHLCPSPLFPGPSKP (SEQ ID NO: 10)" with a biotin addition at the C-terminal. Each antigen was bound to streptavidin magnetic beads that were blocked with skimmed milk. In-solution selections of phages were performed using the same antigen throughout three consecutive selection rounds, varying the phage input amount and antigen concentration. Blocked beads without antigen were used as control. Elution of bound phages was carried out with trypsin for 20 mins. Enrichment ratios during in-solution selections were calculated as the ratio between the number of phages eluted from the CD28 antigen selection conditions over the number of phage eluted from no antigen selection condition. 279 individual phage mono-clones of selected outputs, in either phage or periplasmic formats, were verified for antigen binding by ELISA and characterized for binding to membranal CD28 by flow cytometry. 72 clones showed specific binding to the stalk region peptide in periplasmic format, 22 proved to have a unique CDR sequence and only 6 were found to belong to a distinctive CDR3 family. The 6 VHHs were produced as recombinant proteins in CHO cells with c-terminal His tag and evaluated for anti-shedding activity and cellular binding. Transfection—CD28 wt (encoding the full-length CD28 transcript) plasmids were generated by cloning the DNA sequences into a PCDNA3.1 vector. Transfections were done using Jet Pei Transfection regent (PolyPlus Transfections). Stable transfectants were selected in G418-containing medium.

ELISA—Commercial ELISA kits were used for quantitation of the amount of human interferon-gamma (Biolegend, Cat. No. 430103), human interleukin 2 (Biolegend, Cat. No. 431802), human interleukin 6 (Biolegend, Cat. No. 430502), human interleukin 10 (Biolegend, Cat. No. 430603), human tumor growth factor beta 1 (Biolegend, Cat. No. 436708), human interleukin beta 1 (Biolegend, Cat. No. 437004) and human CD28 (R&D system, Cat. No. DY342). Cell Proliferation and viability (MTT assay) was conducted according to manufacturer instructions (Roche, Cat. No. 11465007001). Kynurenine (IDO activity) ELISA kit was conducted according to manufacturer instructions (ImmuSmol, Cat. No. BA E-2200).

CD28 stalk region binding assay—Biotin conjugated wild-type or L145K CD28 stalk region dimeric peptides were immobilized on neutravidin coated ELISA maxi-sorb plates. Serial dilution of the VHH clones (0.2-5 µg/mL) was performed and detection of bound VHH was done with anti His tag-HRP conjugated antibody and development was done with TMB.

Cytokine multiplex—The simultaneous evaluation of several cytokines was carried out using ProcartaPLex (Invitrogen, Cat. No. PPX-07-MXXGPY2) on the Magpix system (Millipore).

Flow Cytometry—Generally, cells were kept on ice during all steps. Prior to staining, $5 \times 10^5$ cells were blocked with 50 µg/mL human IgG (Sigma, Cat. No. 14506) in FACS buffer (PBS with 0.1% BSA) for 15 min. Antibodies were used at concentrations recommended by the manufacturer and incubated for 30 min. in the dark. Incubations were done in a volume of 100 µL in 96-well U bottom plates. Cells were washed twice with 200 µL of FACS buffer and transferred to FACS tubes in 150 µL of FACS buffer for analysis. Cells were analyzed on a Gallios Flow Cytometer (Beckman Coulter) using the Kaluza for Gallios Flow Cytometry Acquisition Software.

Cell lines and isolation of human immune cells—Jurkat leukemic T-cell lymphoblast cell line clone E6.1 and SCC-25 tongue squamous cell carcinoma were obtained from the ATCC. PBMCs were isolated from fresh blood samples of healthy donors using standard lymphocytes separation medium (MBP, Cat. No. 850494). CD3 cells were isolated from fresh blood samples of healthy donors using RossetteSEP™ Human T cells Enrichment Kit (STEMCELL, Cat. No. 15061) by negative selection method. CD4 cells were isolated from fresh blood samples of healthy donors using EasySep™ Human CD4 T cells Enrichment Kit (STEMCELL, Cat. No. 19059) by negative selection method. Monocytes were isolated from fresh blood samples of healthy donors using EasySep™ Human Monocyte Enrichment Kit (STEMCELL, Cat. No. 17952) by negative selection method. All cells were grown in complete RPMI-1640 media supplemented with 10% HI-FCS and pen/strep mixture.

CD86 blocking FACS—$0.5 \times 10^6$ HEK293 cells stably transfected with human CD28 were incubated with 2 µg/mL CD86-Fc (R&D systems, Cat. No. 141-B2) without or with anti CD28 antibody (CD28.2, 10 µg/mL) or VHH clones (30 µg/mL) for 30 min in room temperature. Cells were washed and taken for secondary binding using anti-human heavy and light chains antibody conjugated to fluorophore at 1:5000 dilution for 20 min on ice.

Dendritic cell differentiation—monocytes were cultured at a density of $1 \times 10^6$/mL in RPMI medium with growth factors that was refreshed at day 3 and at day 6. Immature dendritic cells (iDCs) were induced by 50 ng/mL GM-CSF and 20 ng/mL IL-4 for 6 days. When needed the iDCs were further differentiated into mature dendritic cells by addition of 100 ng/mL LPS for 48 hrs. The generated cell populations were tested for the indicated phenotypes by FACS analysis of relevant markers and by analysis of secretion of characteristic cytokines.

Metalloproteinases—Commercial recombinant human metalloproteinase MMP-2 was used both from Anaspec (Cat. No. AS-72005) or R&D system (Cat. No. 902-MP). Commercial recombinant human metalloproteinase MMP-13 was purchased from R&D system (Cat. No. 511-MM). Pro-MMP2 and Pro-MMP-13 were activated with 1 mM p-aminophenylmercuric acetate (APMA) for 1-2 hr at 37° C. according to manufacturer's protocol.

Protease Inhibitors—Protease inhibitors were added at the indicated concentrations at the start of each experiment. In week long assays another portion of the inhibitors was added after 3 days at the final concentration. Protease inhibitors used are TAPI-1 (Cayman, Cat. No. 18505), GM6001 (Santa Cruz, Cat. No. SC-203979), TMI-1 (Sigma, Cat. No. PZ0336) and GI254023X (Sigma, Cat. No. SML0789). Where mentioned the protease cocktail was composed with a mixture of TAPI-1 and GM6001 at equimolar ratio.

Synthetic Peptide—Substrate peptide with the final form of "DYKDDDDKGGGGGHVKGKHLCPSPLFPGPSKP (SEQ ID NO: 41)-biotin" was designed to include the amino acid sequence of human CD28 stalk region (His134-Pro152) between an N-terminal cMyc tag followed by five glycine sequence and a C-terminal biotin conjugation. The peptide was custom synthesized by Gencust Europe. The Cysteine residue at position 141 was used to generate a dimeric peptide by a disulfide linkage. CD28 stalk region peptide with mutation at the cleavage site, substitution of Leucine at position 145 to Lysine, was similarly synthesized with the final form of "DYKDDDDKGGGGGHV KGKHLCPSPKFPGPSKP (SEQ ID NO: 42)-biotin".

In-vitro cleavage assay—50 ng pf purified recombinant MMP-2 or MMP-13 were incubated with 0.125 µM dimeric c-Myc-tagged and biotinylated substrate peptide in the presence or absence of MMP inhibitor (TMI-1, 50 nM), M9 Fab or indicated VHH clones at various concentrations (0.4-10 µg/mL) for 5 hours. The assay was performed in 50 mM Tris, 10 mM $CaCl_2$), 150 mM NaCl, 0.05% Brij-35, pH 7.5. After 5 hr the cleavage reaction mixture was diluted to a final 1 nM concentration of peptide and loaded on a neutravidin plate to bind the peptide. After 1 hr incubation at room-temperature the plate was washed, and detection of un-cleaved peptide is done using an anti-cMyc antibody conjugated to HRP.

PHA activation of CD4 T cells or Jurkat T cell line for the generation of soluble CD28—$1 \times 10^5$ Jurkat cells or CD4 T cells were incubated with the indicated concentration of Phytohemagglutinin (Sigma, Cat. No. L8902) and various protease inhibitors for additional 5 (Jurkat) or 7 days (CD4 T cells).

SEB or CMV activation of PBMCs for the generation of soluble CD28—$0.3 \times 10^6$ PBMCs were stimulated with 0.5 ng/mL SEB (Sigma, Cat. No. S4881) for 5-7 days at 37° C. with/without the indicated concentration of various protease inhibitors in 48 well plate. Alternatively, $0.1 \times 10^6$ PBMCs were stimulated with 0.5 ng/mL SEB in 96 well plate format assay. For CMV stimulation $0.5 \times 10^6$ PBMCs were stimulated with 0.5 µg/mL CMV peptivator (Milteny Biotec, Cat. No. 130-093-435) for 2-5 days at 37° C. with/without the indicated concentration of various protease inhibitors in a 96 well plate. For continuous shedding experiments PBMC were stimulated with SEB or CMV in 24 well plate for 24 hr, cells were taken and washed three times with RPMI without stimulant and plated again in a 96 well plate. Samples were taken at indicated times and put under freezing conditions until examination for soluble CD28.

Cellular assays evaluating anti shedding activity of VHH—For SEB activation of PBMCs, $0.1 \times 10^6$ PBMCs were stimulated with 2 ng/mL SEB (Sigma, Cat. No. S4881) for 5-7 days at 37° C. with/without the indicated concentrations of various treatments in 96 well plates. For PHA activated T cells, $0.1 \times 10^6$ CD4 T cells were incubated with the indicated concentration of Phytohemagglutinin (Sigma, Cat. No. L8902) and 200 IU/mL of IL-2 (Proleukine) for 5-7 days at 37° C. with/without the indicated concentrations of various treatments in 96 well plates. For HEK spontaneous CD28 shedding assay, $0.1 \times 10^5$ HEK cells were incubated for 48 hours at 37° C. with/without the indicated concentrations of various treatments in 96 well plates.

Mixed lymphocyte reaction—$1 \times 10^5$ immature DCs were mixed with $5 \times 10^5$ isolated autogenic CD3 T cells for 6 days.

SEB or CMV stimulation assay with ectopic recombinant human CD28, human CTLA-4 and human CD80—For CMV stimulation $0.5 \times 10^6$ PBMCs (from healthy or cancer patients' donors) were stimulated with 0.5 μg/mL CMV peptivator (Milteny Biotec, Cat. No. 130-093-435) for 2-5 days at 37° C. with/without the indicated concentration of recombinant human CD28 (R&D systems, Cat. No. 342-CD), human CTLA-4 (R&D systems, Cat. No. 434-CT), human CD80 (R&D systems, Cat. No. 140-B1) in a 96 well plate. For SEB setting, $1 \times 10^5$ PBMCs were cultured with 0.5 ng/mL Staphylococcal Enterotoxin B (SEB) (Sigma, Cat. No. S4881) concentrations in the presence of indicated concentration of rec. human CD28 for 72 hrs. Where specified, anti-PD1 or human IgG were added at a final concentration of 5 μg/mL.

Autologous monocytes CD3 MLR—$0.5 \times 10^6$ T cells were mixed with $0.5 \times 10^5$ monocytes from same CMV reactive donor and stimulated with 0.5 μg/mL CMV peptivator for 6 days at 37° C. with/without the indicated concentration of treatments.

Stimulation of monocytes with recombinant human CD28—$1.5 \times 10^6$ monocytes were plated at 24 well plate in RPMI medium with 100-100 U/ml IFN gamma (R&D system, Cat. No. 285-IF) in the presence of recombinant human CD28 at the indicated concentrations for 48 hrs. The generated cell populations were tested for the indicated phenotypes by FACS analysis of relevant markers (IDO, PD-L1 and PD-L2) and by analysis of secretion of characteristic cytokines (IL-6).

T cells stimulation with OKT3—$0.1 \times 10^6$ isolated CD3 T cells (from healthy donors) were stimulated with indicated amount of anti-CD3 clone OKT3 for 48-72 hr at 37° C. When stated recombinant human CD80-Fc (2 μg/mL, R&D system) was added in soluble form. Antibodies or VHHs to CD28 or controls were added at the indicated concentration in soluble form.

Co-culture of SCC-25 cancer cell line with monocytes in trans-well based assay—$4 \times 10^4$ SCC-25 cells were plated on the bottom of 24 well plate with $1 \times 10^5$ monocytes placed on cell culture insert (Millipore, Cat. No. MCHT241148) with or without indicated treatments for 4 days in starvation media without serum.

Detection of soluble human CD28 in cancer patients' plasma—20 frozen plasma samples in each of 10 different cancer indications and healthy donors were purchased from DxBiosamples (San Diego, CA, USA). The plasma samples were diluted 1:20 and analyzed for soluble human CD28 by ELISA. Samples with high sCD28 were analyzed again in adequate dilutions.

Direct CD28 EIA—Unless discussed otherwise, Corning high binding plate or equivalent were used for screening. Each well was coated with 200-300 ng of human CD28-Ig chimera (R&D, Cat. No. 342-CD), mouse CD28-Ig chimera (R&D, Cat. No. 483-CD) or BSA conjugated dimeric peptide composed of CD28 stalk region amino acid sequence (Gly137-Pro152). Plates were blocked using 5% milk or 1% casein in PBS for 1 hr. at room temperature (RT). Plates were washed 3 times using PBST and incubated with investigated antibody following detection with goat anti mouse HRP Fc specific diluted 1:5000. Positive control is mouse anti human CD28 clone 28.2 or mice serum from immunized mice. Hybridoma supernatant cultures were screened undiluted.

Antibody sequencing. Antibodies were supplied to the Rapid Novor company for amino acid sequencing. Sequencing was performed using standard methods, which briefly include LC-MS analysis performed after enzymatic digestion with six enzymes (pepsin, trypsin, chymotrypsin, elastase, Lys C and Asp N). Digestion was performed with disulfide reduction, and alkylation. LC-MS/MS analysis was performed using a Thermo-Fisher Q-exactive mass spectrometer. In both the heavy and light chains of each antibody 100% of amino acid residues were covered by at least 5 peptide scans, with significant supporting fragment ions. CDRs were determined using Chothia scheme.

Example 1: Human CD28 Undergoes Proteolytic Shedding During Chronic Stimulation

Figure 2:
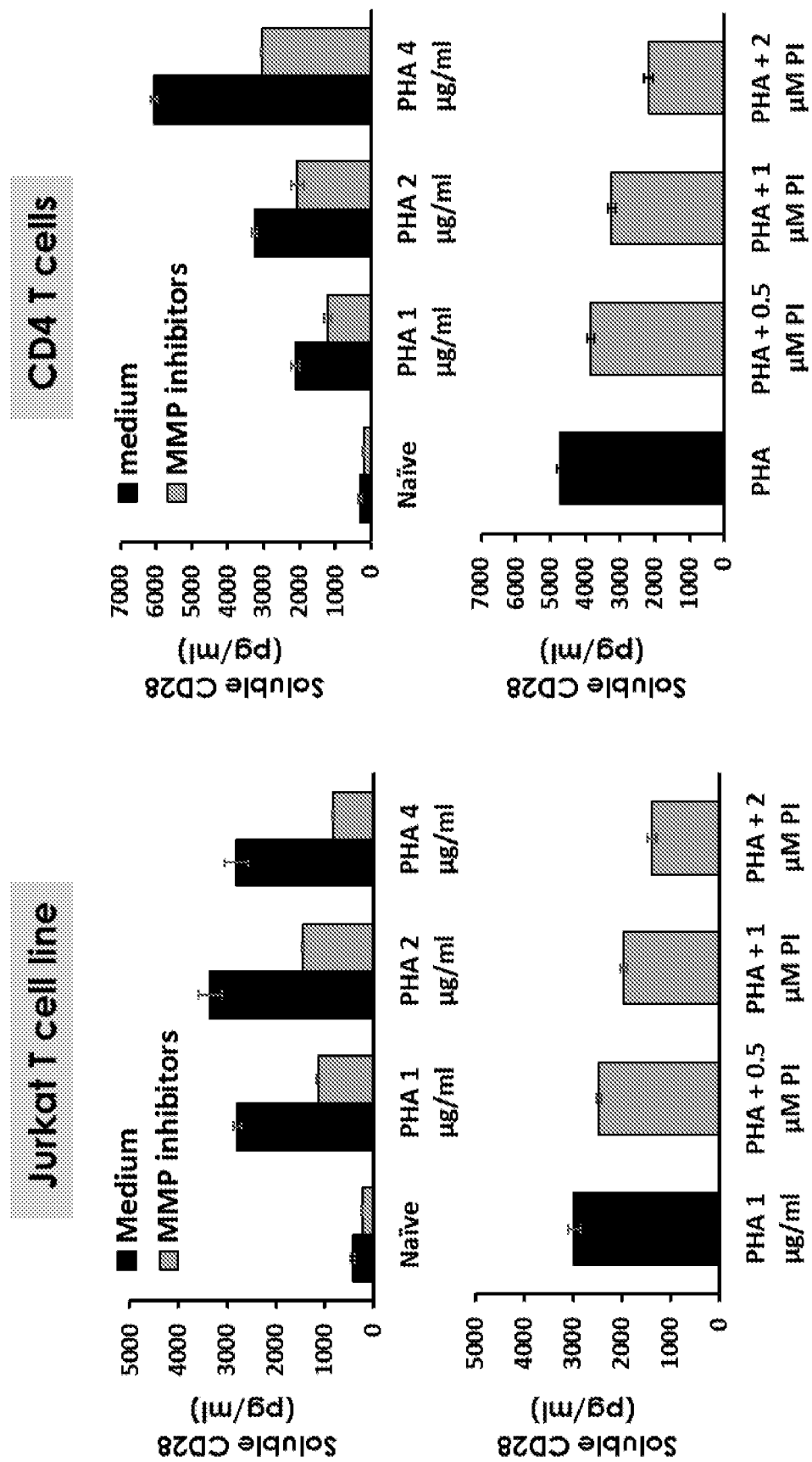
FIG. 2. Soluble CD28 is generated during stimulation of T cells by PHA and counteracted by addition of protease inhibitors. Bar charts of Jurkat cells (upper left) or isolated human CD4 T cells (upper right) stimulated with increasing concentrations of PHA (1-4 µg/mL, upper charts) in the presence of a protease inhibitor cocktail at a fixed concentration (2 In another setup the PHA concentration was fixed to stimulate Jurkat T cells (1 µg/mL PHA, lower left) or human CD4 T cells (2 µg/mL PHA, lower right) and the concentration of the protease inhibitor cocktail was tittered (0.5-2 The concentration of human CD28 in the supernatant was quantified with a standardized sandwich ELISA.

Soluble CD28 (sCD28) was detected by ELISA in the culture of chronically stimulated human PBMCs (FIG. 1, upper charts). The phenomenon was evident regardless of the nature of the stimulant, artificial (SEB) or physiological (CMV), indicating the robustness of the phenomenon. The origin of soluble CD28 is from shedding of the membrane form, as treatment with TAPI-1 and GM6001 (broad MMP and ADAM17 inhibitors) diminish the amount of sCD28 in a dose dependent manner (FIG. 1, upper charts). The cellular source of shed CD28 is T cells as can be seen in FIG. 2. Chronic stimulations with PHA, of either the Jurkat T cell line or human CD4 T cells from peripheral blood of healthy donors, results in the generation of sCD28 in a dose dependent manner (FIG. 2, upper charts). Treatment with TAPI-1 and GM6001 diminished the amount of sCD28 at each PHA concentration (FIG. 2, upper charts) and in a dose dependent manner at a fixed PHA concentration (FIG. 2. lower charts).

Figure 3A:
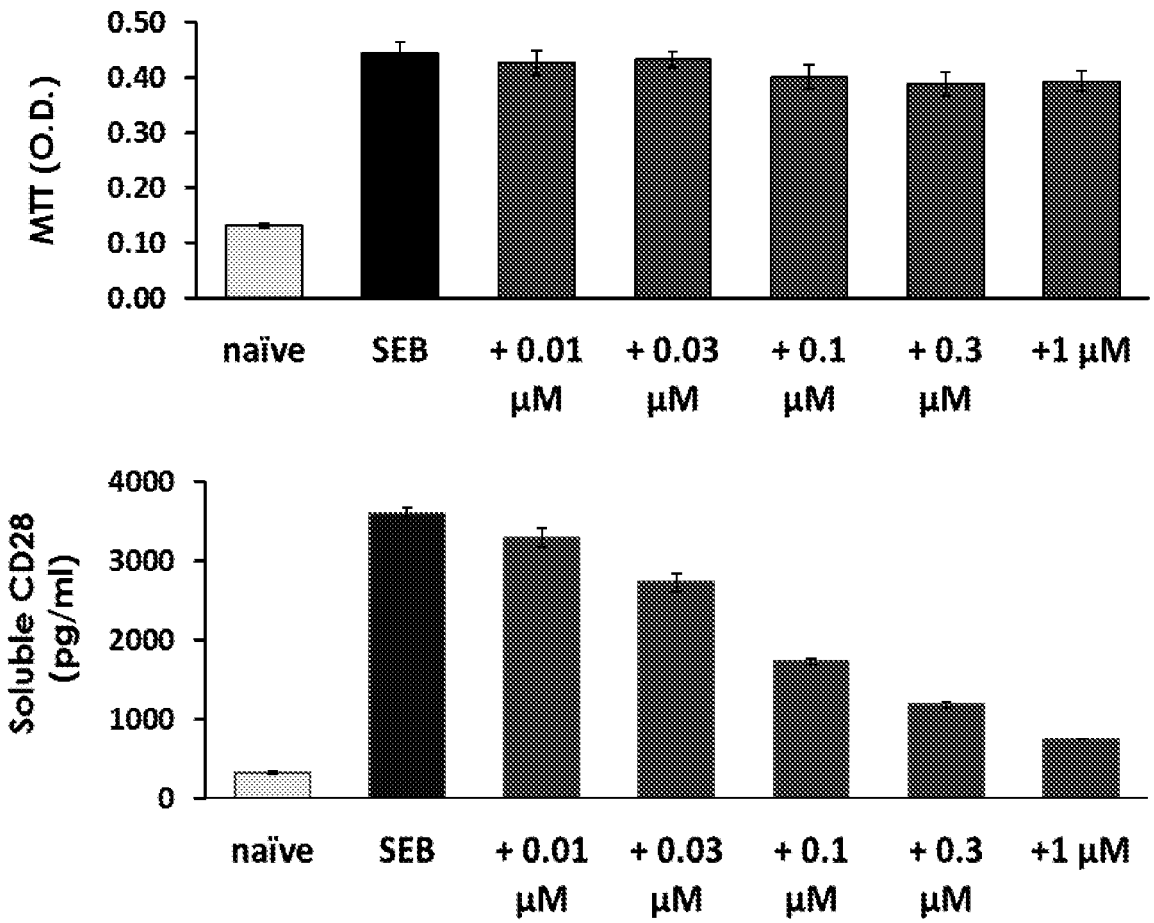
FIGS. 3A-3B. Specific ADAM-10 and ADAM-17 inhibitors eliminate the accumulation of soluble CD28 during human PBMCs activation by SEB while not hampering their viability. (3A-B) Bar charts of human PBMCs stimulated with SEB (1 ng/mL) in the presence of (3A) ADAM-10 specific inhibitor (GI254023X) and (3B) ADAM-17 specific inhibitor (TMI-1) at various concentrations (0.01-1 µM). The viability of the cells in the different treatments was evaluated using MTT assay (upper panel). The concentration of human CD28 (lower panel) in the supernatant was quantified with a standardized sandwich ELISA.
Figure 3B:
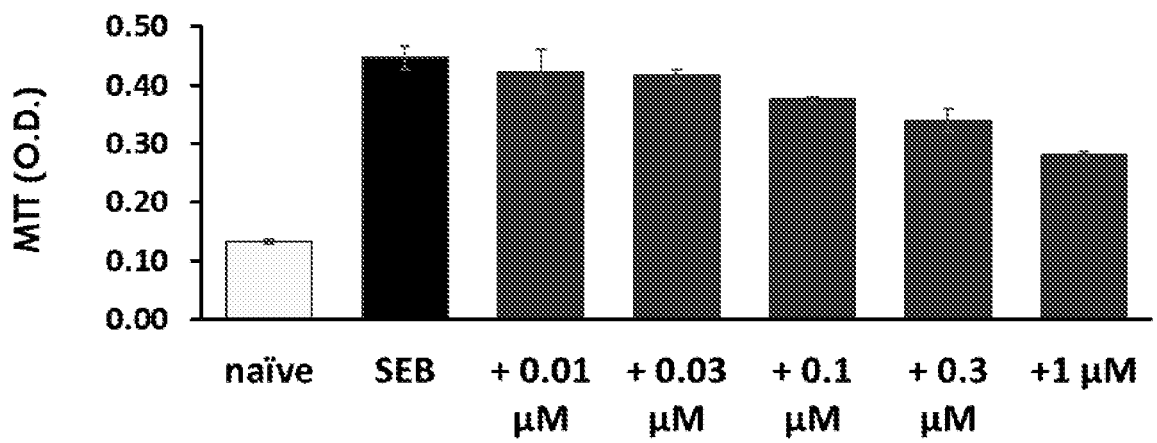
Figure 3B:
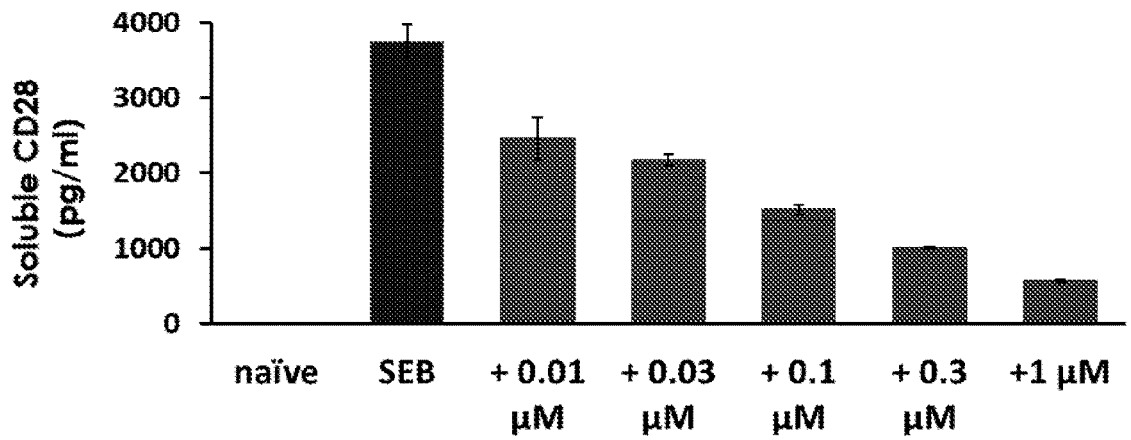

Treatment with GI254023X, a highly specific ADAM-10 inhibitor, resulted in almost complete inhibition of sCD28 release from activated immune cells and in a dose dependent manner (FIG. 3A, lower panel). Similar results were observed with the ADAM-17 specific inhibitor TMI-1 (FIG. 3B, lower panel). The viability of the immune cells was monitored by MTT assay, checking the metabolic activity of the cells in the culture. The results showed no significant difference between treatments with and without either ADAM inhibitor, implying that the low sCD28 levels are caused by blocking of protease activity and are not artifacts of cellular death caused by the protease inhibitor (FIG. 3A-B, upper panels).

The generation of sCD28 was validated also in more physiological systems. First, isolated autologous dendritic cells and CD4 T cells which mimic the physiologic stimulation of T cells by antigen presenting cells were utilized.

Figure 4A:
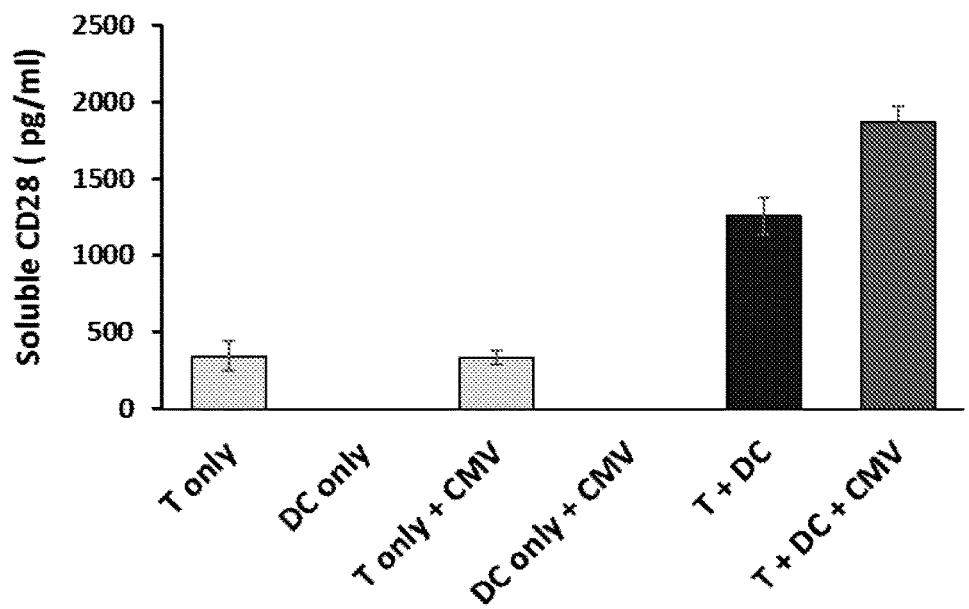
FIGS. 4A-4D. Soluble CD28 is generated during PBMC stimulation. (4A) Bar chart of immature dendritic cells mixed in a 1:5 ratio with CD3 T cells from same donor without CMV (black bar) or with CMV peptides (dark grey bar). Control of each cell population alone or with CMV are in light grey bars. The concentration of human CD28 in the supernatant was quantified with a standardized sandwich ELISA. (4B-D) Bar charts of human PBMCs stimulated for 24 with (4B) CMV or (4C) SEB or (4D) SEB in the presence of ADAM-10 and ADAM-17 inhibitors, and then transferred to a clean culture. Measurements in FIG. 4D are 120 hours after cells were transferred.

Elevation of sCD28 was evident when mixing the two cell populations and became even more pronounced when CMV was added into the culture (FIG. 4A). This shows that the human CD28 protein experiences a proteolytic shedding process when chronic stimulation takes place.

Figure 4B:
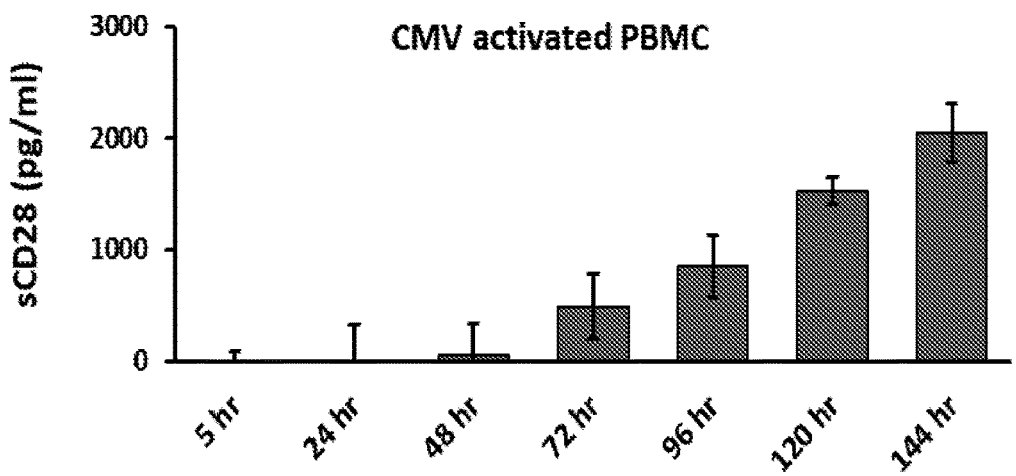
Figure 4C:
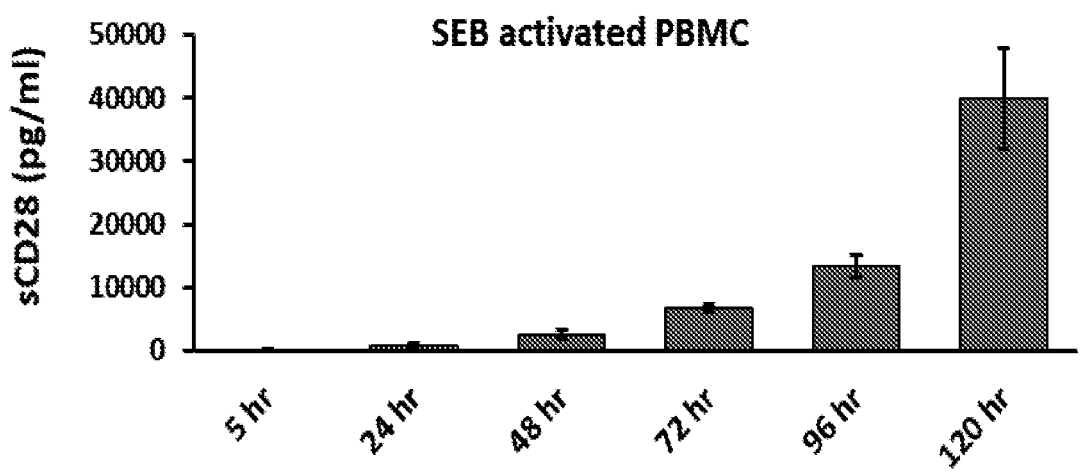
Figure 4D:
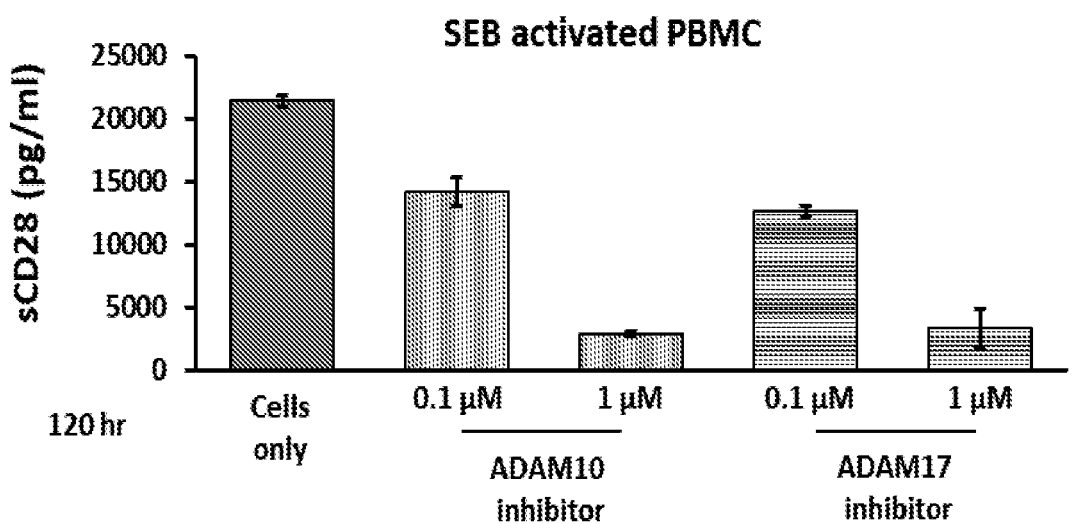

Next, human PBMCs were stimulated with CMV peptides (FIG. 4B), or SEB (FIG. 4C) for 24 hours. Afterwards, the cells were washed to remove the stimulant and plated again without any stimulation signal for various time periods. This was followed by examining for the presence of sCD28 in the culture media. The accumulation of sCD28 is clearly visible over time. Further, the accumulation is dependent of the activity of ADAM-10 and ADAM-17 as can be seen in FIG. 4D. Addition of specific inhibitors at different concentrations, after SEB stimulation, resulted in diminished amounts of sCD28 as quantified after 120 hours. This study can explain the existence of high amount of soluble CD28 in the blood of patients, as CD28 shedding takes place upon primary activation of T cells and does not necessarily need constant or repeated stimulations.

Example 2: Soluble Human CD28 has an Immune Suppressive Activity

Figure 5:
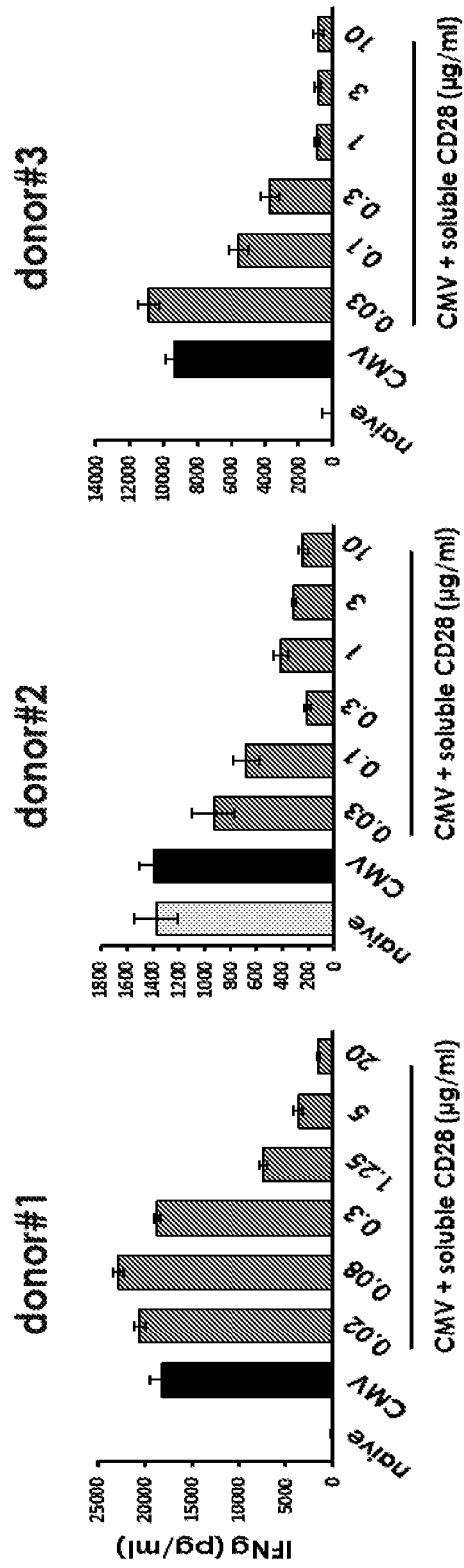
FIG. 5. Soluble CD28 inhibits effector cytokine secretion. Bar charts of human PBMCs stimulated with CMV (0.5 µg/mL) without (black bars) or with recombinant human CD28 at the indicated concentrations (grey bars). Naïve samples without CMV stimulation are indicated by light grey bars. The concentration of human IFN gamma in the supernatant was quantified with a standardized sandwich ELISA (Biolegend).

As can be seen in FIG. 1 (lower charts), lowering the levels of sCD28 using a protease inhibitor cocktail is directly correlated with elevation in T cell activation, as manifested by levels of secreted IFN gamma, suggesting that sCD28 has an immunosuppressive function. Increasing the concentration of protease inhibitor cocktail led to lower levels of sCD28 in the cells' media and these lower levels of sCD28 were inversely correlated with higher levels of secreted IFN gamma. To further explore immune suppression by sCD28, recombinant human CD28 lacking the transmembrane and cytoplasmic domains was added into cultures of human PBMCs stimulated with CMV. This resulted in a dose-dependent inhibition of IFN gamma secretion (FIG. 5). This immune suppression effect was observed in different human PBMCs donors, affirming the robustness of this signaling axis blocked by sCD28.

Figure 6:
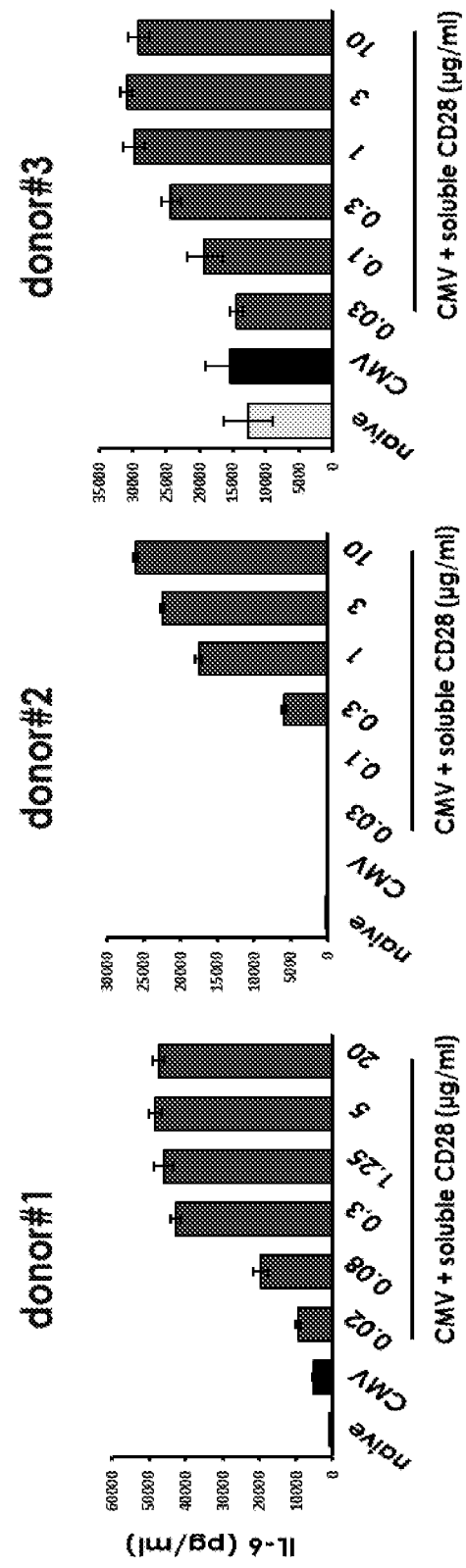
FIG. 6. Soluble CD28 increase IL-6 cytokine secretion. Bar charts of human PBMCs stimulated with CMV (0.5 µg/mL) without (black bars) or with recombinant human soluble CD28 at the indicated concentrations (grey bars). Naïve samples without CMV stimulation are indicated by light grey bars. The concentration of human IL-6 in the supernatant was quantified with a standardized sandwich ELISA (Biolegend).
Figure 7A:
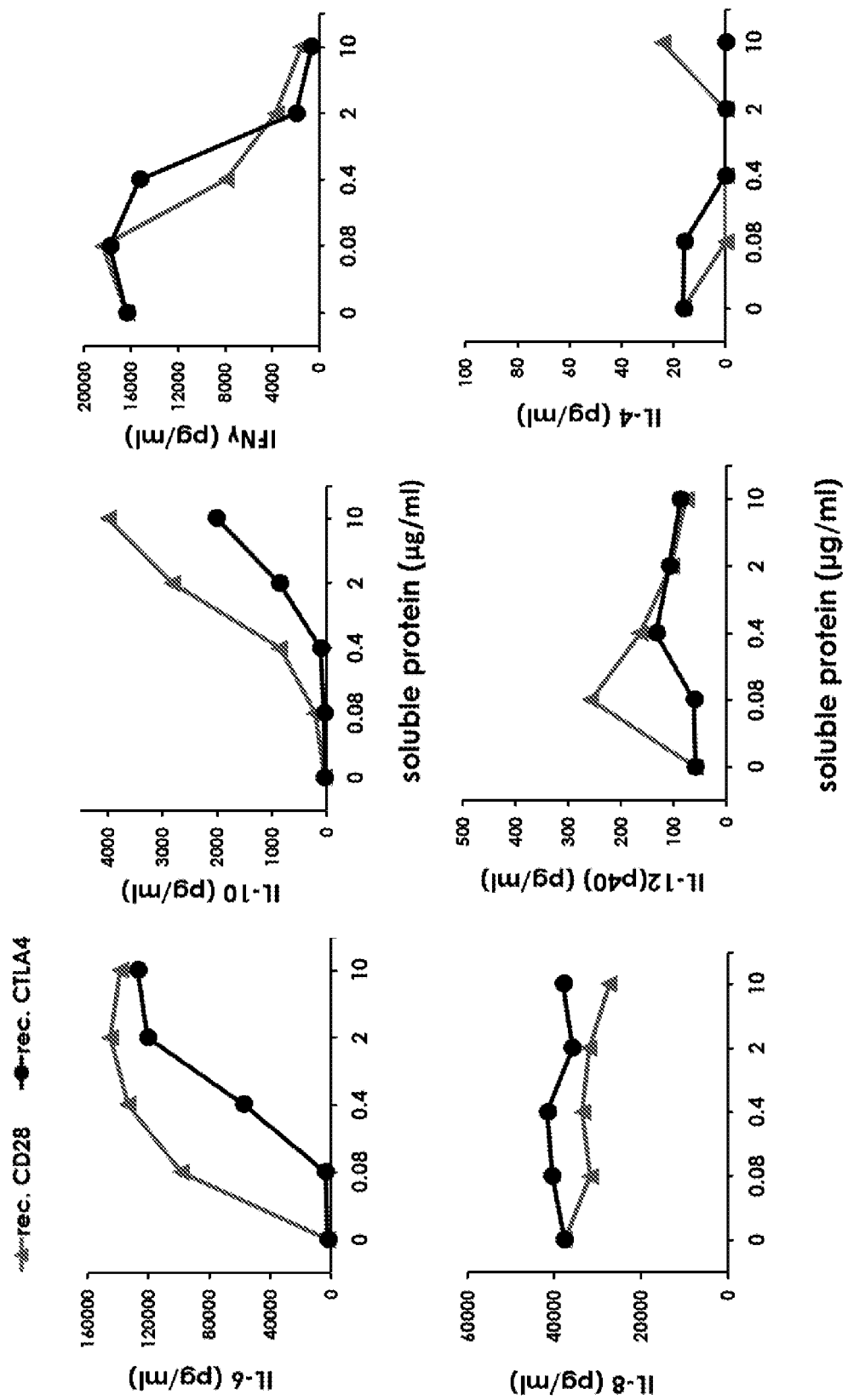
FIGS. 7A-7E. (7A) Line graphs of human PBMCs stimulated with CMV (0.5 µg/mL) in the presence of recombinant human soluble CD28 (grey triangles) or recombinant human soluble CTLA-4 (black circles) at the indicated concentrations. The concentration of human IL-6, IFN gamma and IL-4 in the supernatants were quantified with a standardized sandwich ELISA (Biolegend). The concentration of human IL-8, IL-12p(40) and IL-10 in the supernatants were quantified with a multiplex analysis using a Magpix system (Millipore). (7B) Bar graphs of cytokine secretion from autologous monocytes and CD3 MLR. Naïve samples without CMV stimulation are indicated by light grey bars. CMV alone or with IgG control are indicated with black bars. Increasing concentrations of sCD28 are indicated with dark grey bars. (7C) Line graphs of lymphocytes' clusters formation by human PBMCs stimulated with SEB in the presence of recombinant human soluble CD28 (grey circles) or with a control IgG (grey triangles). (7D) Bar graph of IDO secretion into culture as measured by Kynurenine ELISA kit from monocytes that were treated with and without recombinant human sCD28. (7E) Scatter plot of intracellular FACS for IDO in monocytes that were treated with and without recombinant human sCD28.

In parallel, an elevation of interleukin-6 secretion (FIGS. 6 and 7A) and interleukin-10 (FIG. 7A) was evident. These cytokines are reported to exhibit suppression of immune effector activity (IL-10) and skewing of the immune system toward a type-2 immune response which can support cancer proliferation and angiogenesis through STAT-3 signaling (IL-6). Additionally, a comparison with soluble CTLA-4 (mimicking Abatacept—a registered therapy for auto-immune disorders) was done and revealed an over-all similar impact on the immune system in terms of cytokine secretion profiles (FIG. 7A).

Figure 7B:
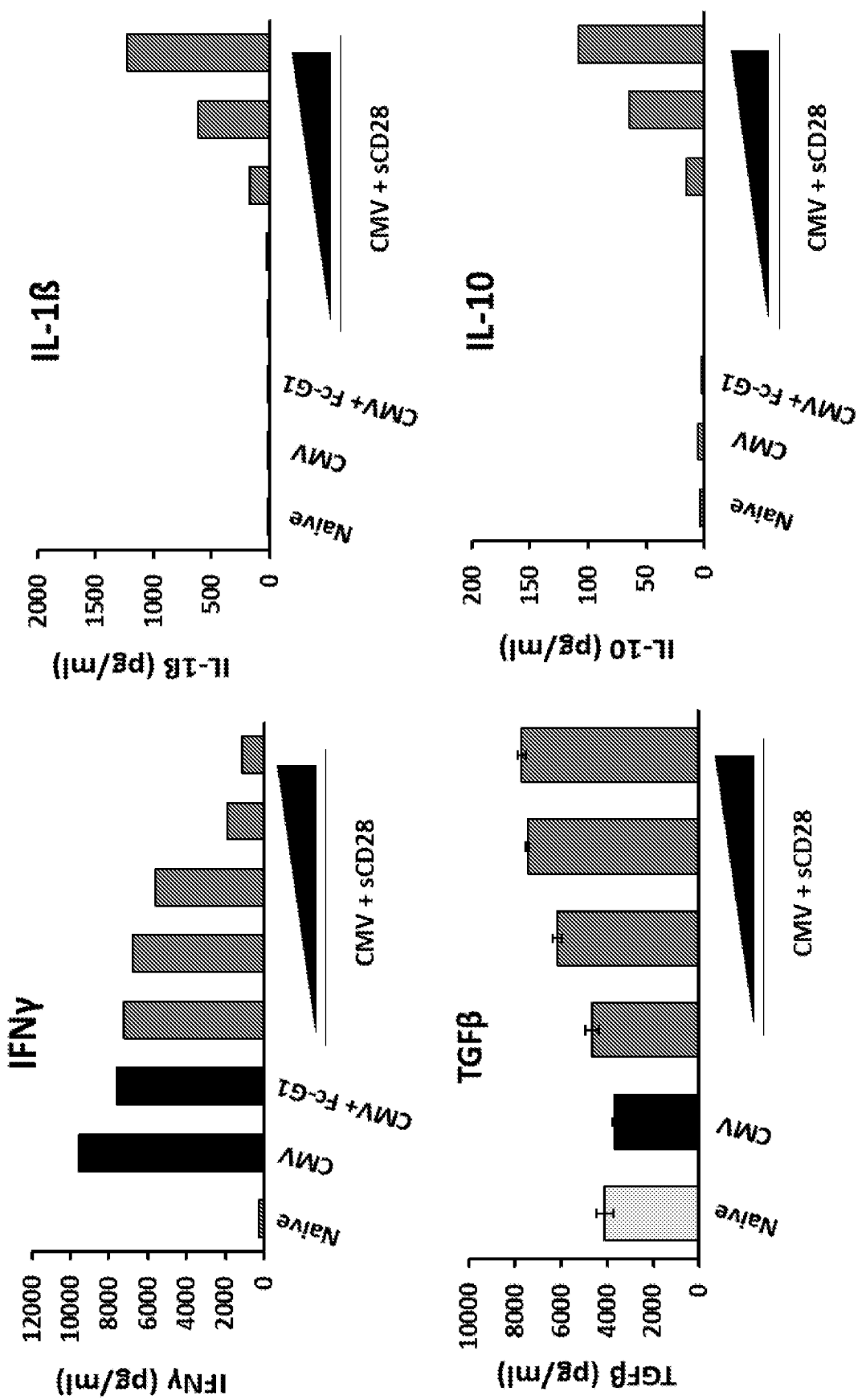
Figure 7C:
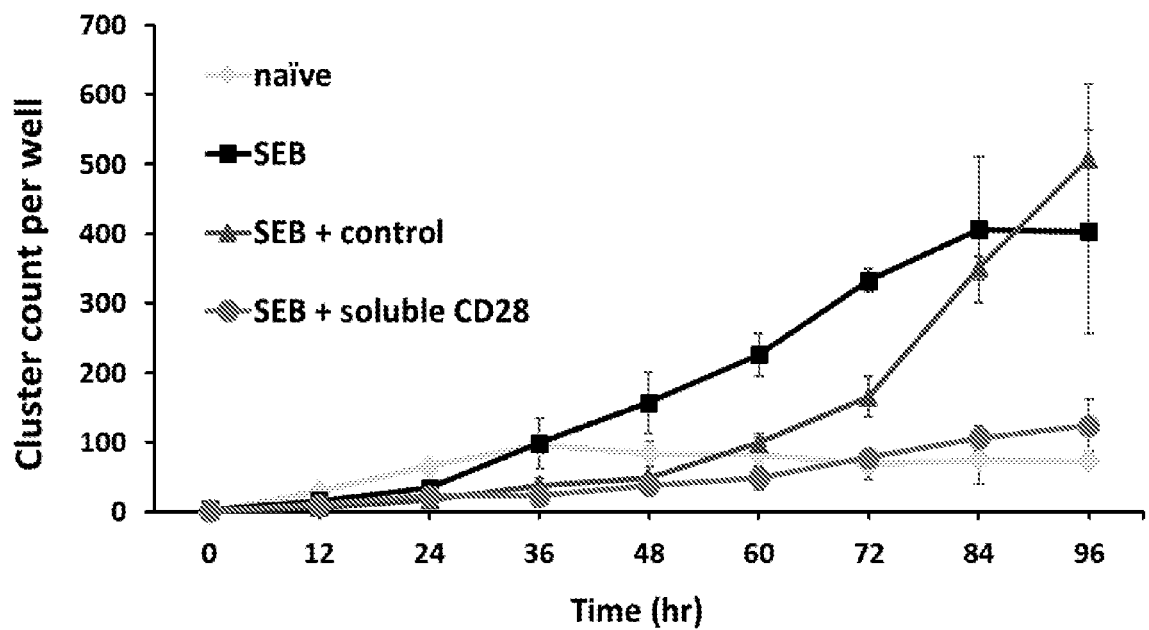

Next, human PBMCs were stimulated with SEB (1 ng/mL) without or in the presence of recombinant human CD28. Human IgG was used as control. Lymphocyte clustering, a hallmark of immune activation was monitored using the IncuCyte® S3 Live-Cell, with pictures taken every 12 hours. As can be seen in FIG. 7C, SEB had essentially no effect on the lymphocytes when the recombinant human sCD28 was present. It is well established that during in-vitro immune response antigen presenting cells (APC) cluster with one another and with other cell types, and clustering is essential for the antigen specific activation of resting lymphocytes. Soluble CD28 seems to diminish the amount and size of cluster formation during SEB immune response, meaning that it inhibits the first steps of T cells specific activation by APCs.

Figure 7D:
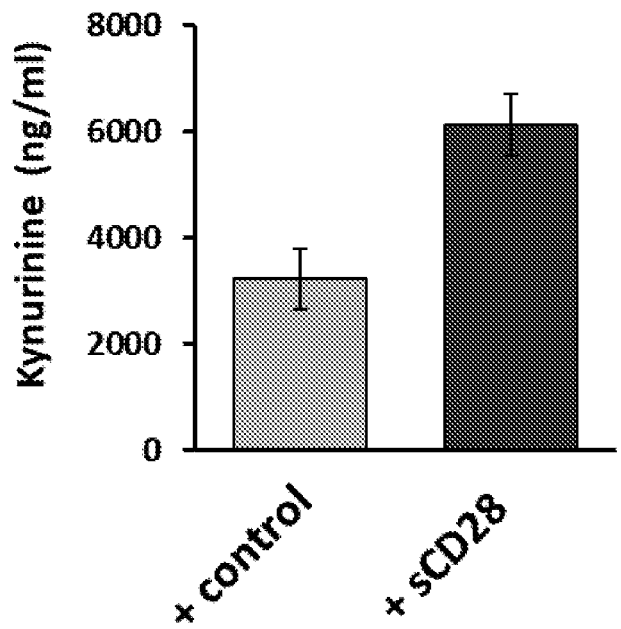
Figure 7E:
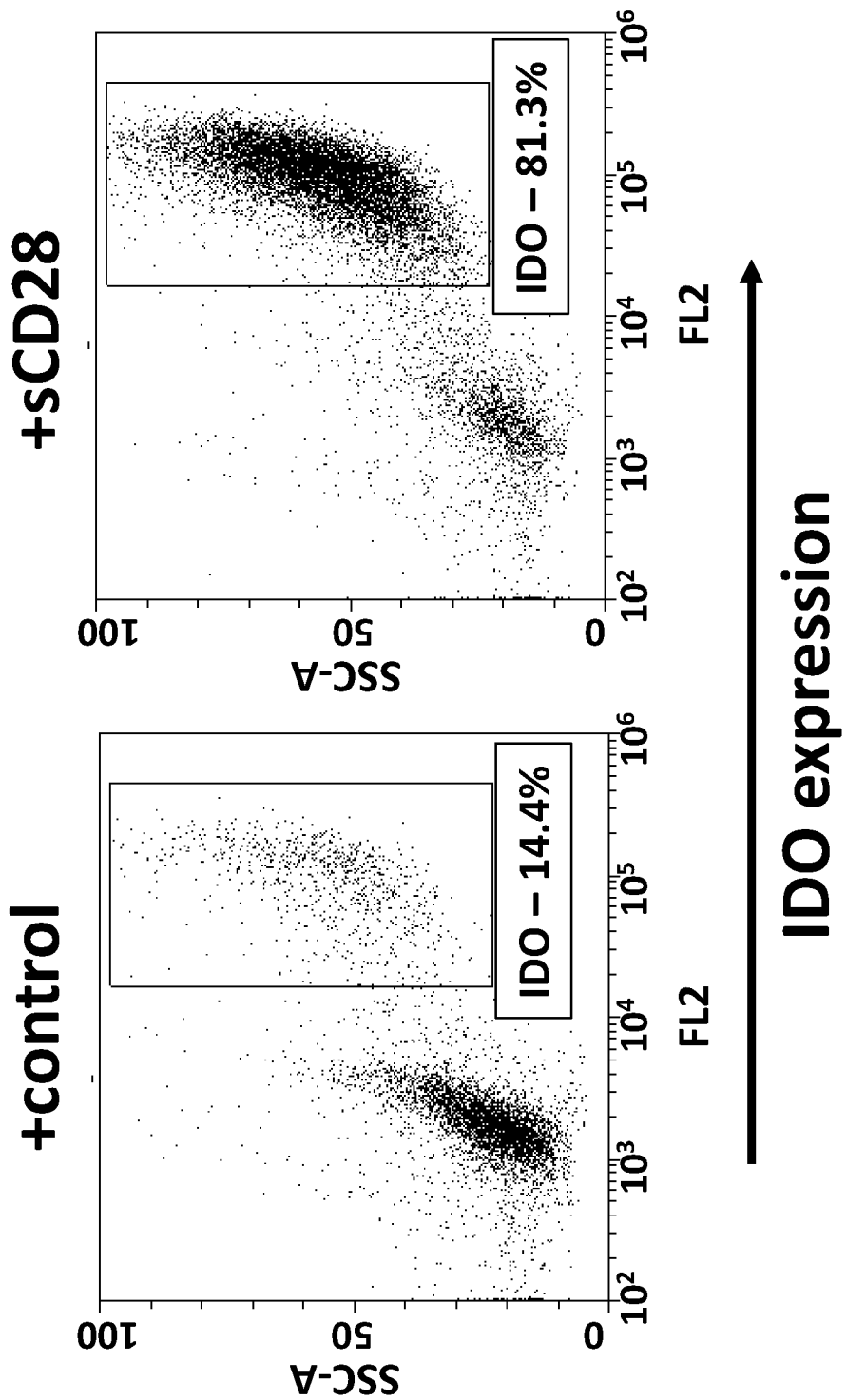

Similar results were observed when isolated autologous monocytes and CD3 T cells were cocultured in a mixed lymphocyte reaction (MLR). The mixed cells were stimulated for 5 days with CMV peptide (0.5 μg/mL) with and without increasing concentrations of recombinant human sCD28. Once again sCD28 was found to inhibit IFN gamma secretion, while simultaneously increasing the secretion of IL-1B, TGF beta and IL-10 (FIG. 7B).

sCD28 had a similar immunosuppressive effect on monocytes. The enzyme indoleamine 2,3-dioxygenase (IDO) has been implicated in immune modulation through its ability to catabolize the essential amino acid Tryptophan. It is expressed by different immune cells and also by many cancer cells. Tryptophan shortage inhibits T lymphocytes maturation and proliferation, while Kynurenine, the end product of tryptophan catabolism, is also known as immunosuppressive metabolite that promotes immune tolerance in various physiological and pathophysiological conditions. To test the effect of sCD28 on IDO, isolated human monocytes were stimulated for 48 hr with IFNγ (1000 U/mL) in the presence of control human IgG or with recombinant human CD28 (10 μg/mL). After incubation, the monocytes were stained intracellularly for human IDO (FIG. 7E). To facilitate intracellular staining the cells were fixed and permeabilized with BD Cytofix/Cytoperm Buffer Kit. The culture media of the different treatments were assessed for IDO activity using ImmuSmol specific Kynurenine ELISA kit (FIG. 7D). sCD28 strongly enhanced IDO expression in the monocytes.

Figure 8A:
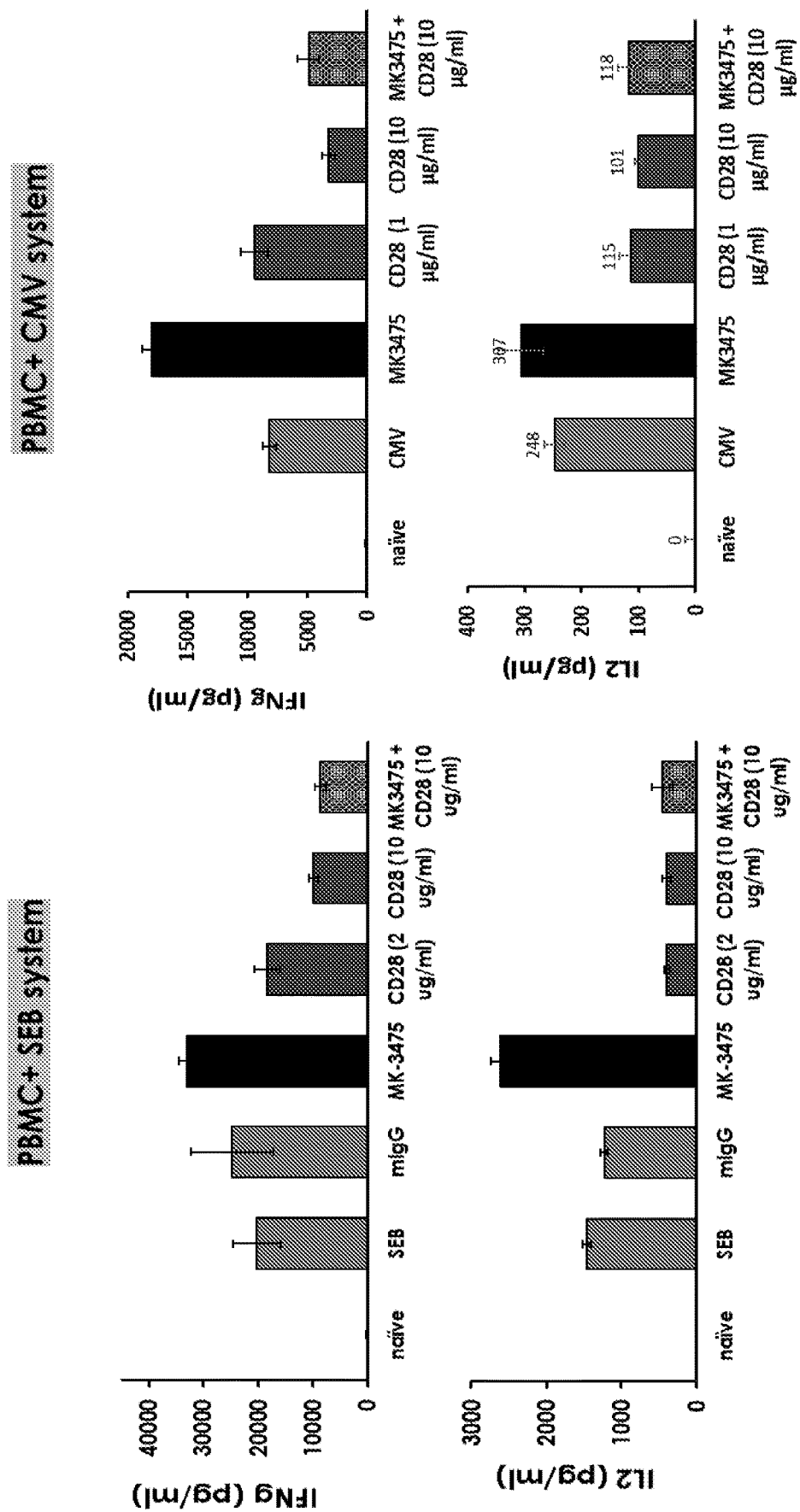
FIGS. 8A-8C. Soluble CD28 impedes anti-PD1 treatment. (8A) Bar charts of human PBMCs stimulated for 3 days with SEB (200 ng/mL, left side charts) or CMV peptides (0.5 µg/mL, right side charts) in the presence of anti-PD1 (MK3475, 5 µg/mL, black bar) or recombinant human soluble CD28 (2 and 10 µg/mL, grey bars) or a combination of both (dotted bar). (8B) Bar charts of cytokine secretion from monocytes MLR setting, naïve-white bars, CMV alone-light gray bars, sCD28-black bars, MK-3475-dark grey, sCD28+MK-3475-plaid bars. The concentrations of human IFN gamma, TGF beta and IL-2 in the supernatants were quantified with standardized sandwich ELISAs (Biolegend). (8C) Histograms of surface PD-L1 (left) and PD-L2 (right) expression in monocytes after incubation with control and sCD28.

Further, it was surprisingly found that sCD28 is a potent inhibitor of anti-PD1 immunotherapy. MK-3475 (Pembrolizumab or Keytruda, Merck) is an approved drug with unprecedent efficacy in multiple cancer indications. Its addition to PMBC culture increased proinflammatory cytokine secretion (IFN gamma and IL-2), however the presence of sCD28 abrogated completely this immune activation effect (FIG. 8A).

Figure 8B:
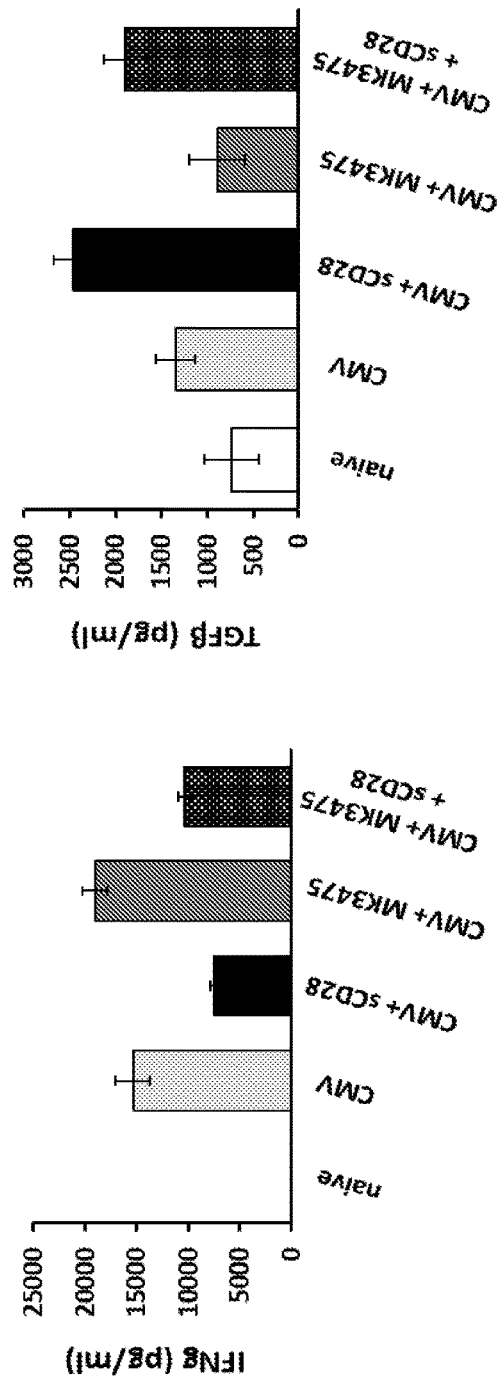

Similar results were again observed in an MLR setting. The MLR was run as before only with and without sCD28 and with and without an anti-PD1 antibody (MK3475, 5 μg/mL) (FIG. 8B). As expected, MK-3475 increased IFN gamma secretion and decreased TGF beta secretion. Notably, in the presence of sCD28 the effect of MK-3475 was significantly reduced.

Figure 8C:
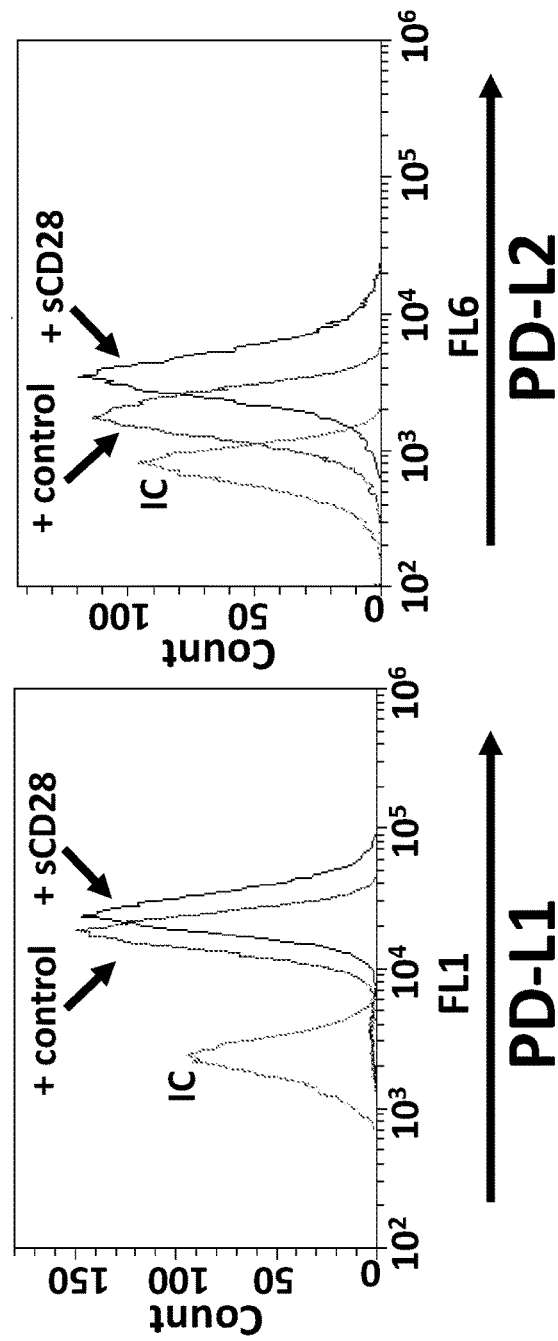

In order to elucidate the mechanism by which sCD28 inhibits the pro-activation effect of anti-PD-1 therapy, the expression of PD-1 ligands on immune cells in the presence of sCD28 was examined. Isolated human monocytes were stimulated for 48 hours with IFNγ (1000 U/mL) in the presence of control human IgG (10 μg/mL) or with recombinant human CD28 (10 μg/mL). After incubation the monocytes were stained for PD-L1 (FIG. 8C, left) and PD-L2 (FIG. 8C, right). Both ligands were upregulated on monocytes cultured with sCD28, suggesting one possible way in which sCD28 might circumvent the effects of anti-PD-1 immunotherapy.

Example 3: Soluble Human CD28 is Found in the Plasma of Cancer Patients

Figure 9A:
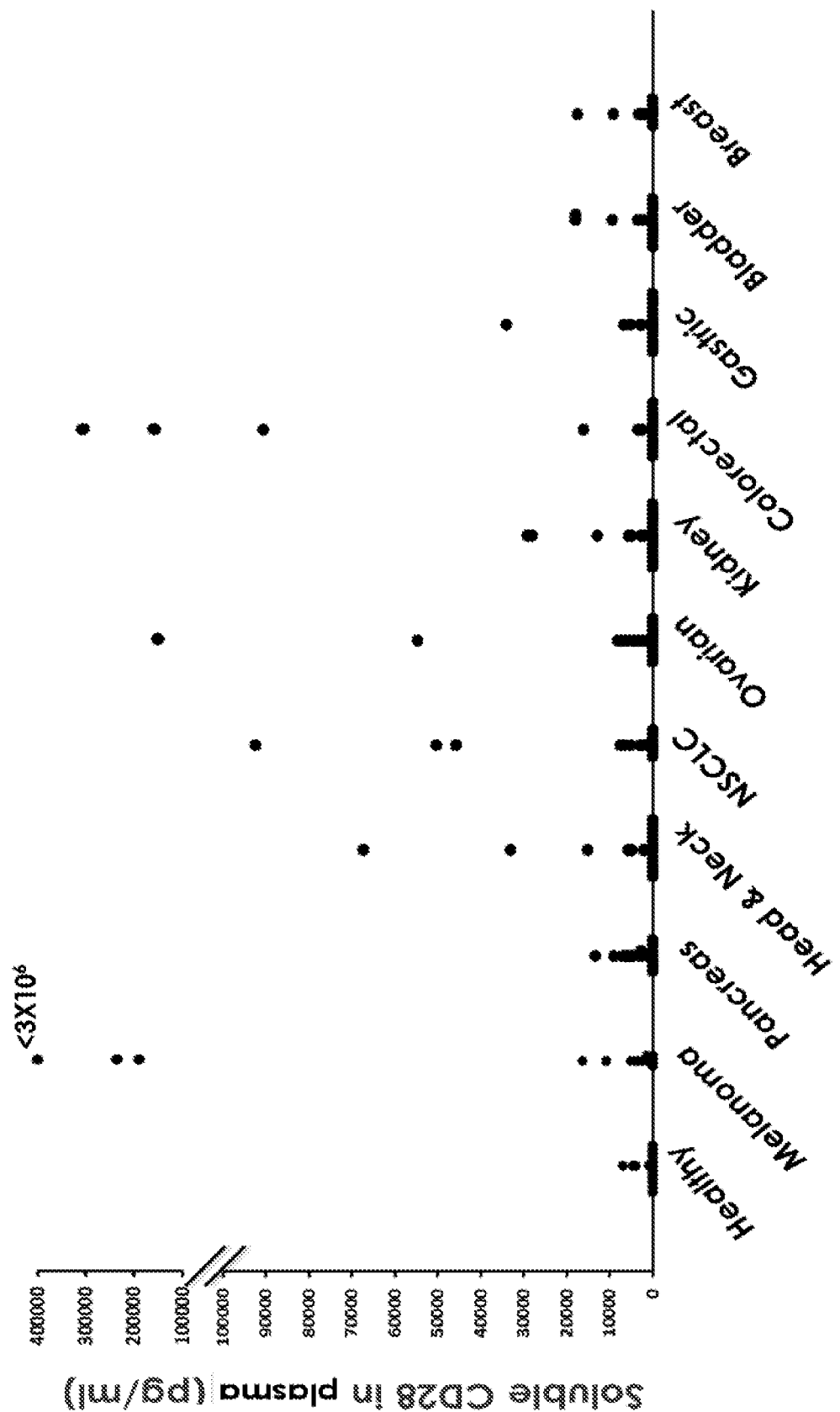
FIGS. 9A-9C. Soluble CD28 in cancer patients. (9A) A dot plot showing 20 plasma samples in each of 10 cancer indications and healthy donors surveyed for the presence of soluble human CD28. Samples with high content of soluble CD28 were examined repeatedly with several dilution factors. The concentration of human CD28 in the supernatants was quantified with a standardized sandwich ELISA calibrated internally to accommodate readings from human plasma samples. (9B) Bar charts of IFN gamma secretion as measured by sandwich ELISA from SEB stimulated PBMC of cancer patients (a sarcoma patient-upper left, a kidney cancer patient-upper right, and two different head and neck cancer patients-lower) in the presence of sCD28, MK-3475 and a combination of the two. (9C) Bar charts of cancer cell SCC-25 viability and proliferation either alone, with IL-6, in coculture with monocytes or in coculture with monocytes and sCD28.

The levels of sCD28 in cancer has only been shown in a small number of breast cancer patients and were found to be only slightly elevated above what is observed in healthy individuals (Isitmangil, G., In vivo, 2016). Although the authors suggest that sCD28 might be used as a marker for breast cancer, no functional relationship is suggested. Now knowing that soluble CD28 may actually enhance cancer evasion of the immune system, a survey of 220 samples covering 10 different cancer indications and 20 samples from healthy donors was conducted. The survey found high sCD28 levels in several cancers, levels that were at times orders of magnitude higher than what was seen in healthy controls or even breast cancer patients (FIG. 9A). Indeed, when viewed in comparison to the sCD28 levels found in some melanoma, colorectal, ovarian, NSCLC and head and neck cancer patients, the levels in breast cancer patients appear to be comparable to healthy individuals.

Figure 9B:
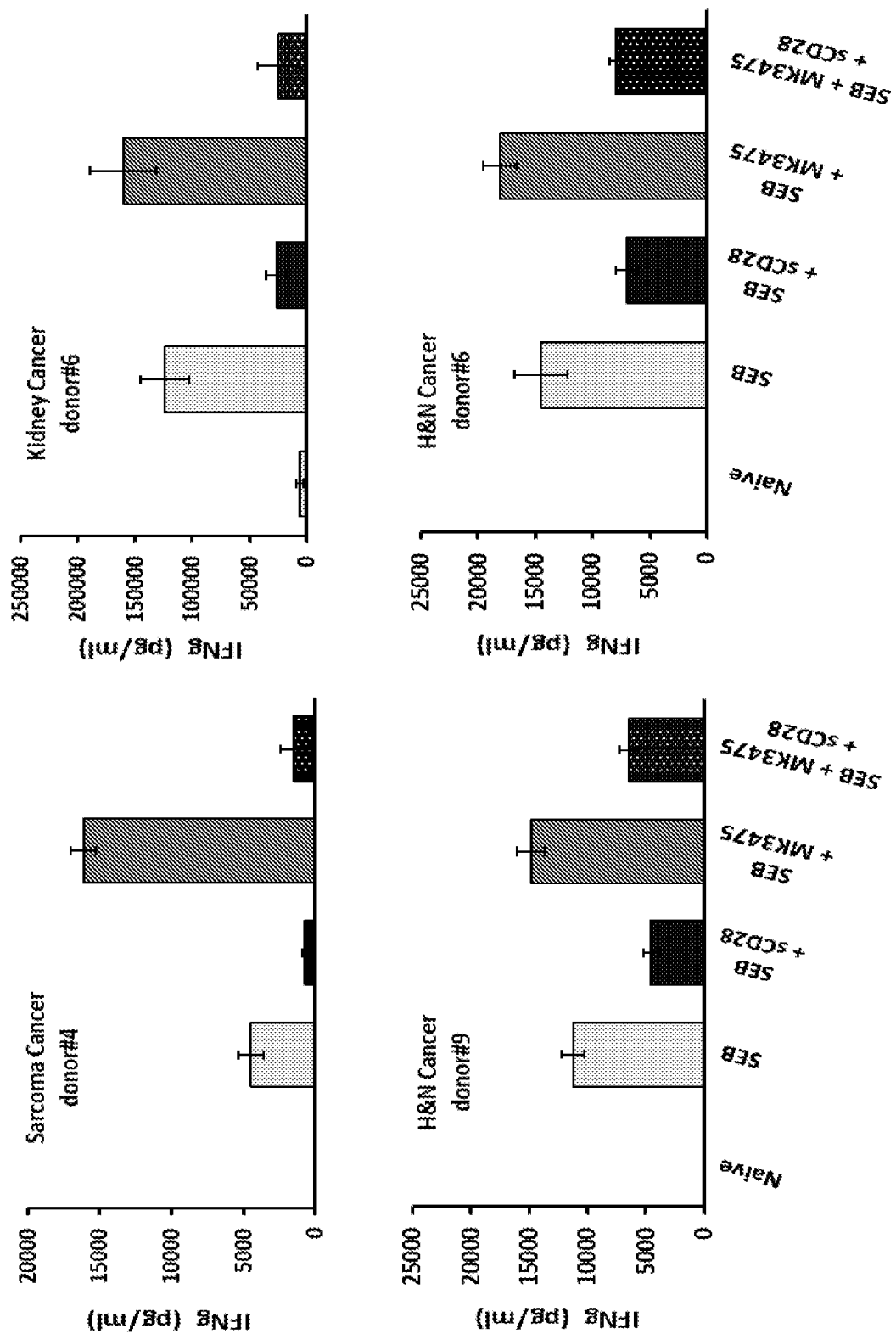

In order to further elucidate the role of sCD28 in cancer PBMCs were isolated from cancer patients with different indications. The cells were stimulated with SEB (5 ng/mL) for 3 days either, alone, with MK-3475, with recombinant human sCD28, or with a combination of both molecules. The concentration of human IFN gamma in the supernatant from the cells from all donors was greatly reduced in the presence of sCD28, even when MK-3475 was present (FIG. 9B). Indeed, sCD28 rendered the effect of MK-3475 non-existent.

Figure 9C:
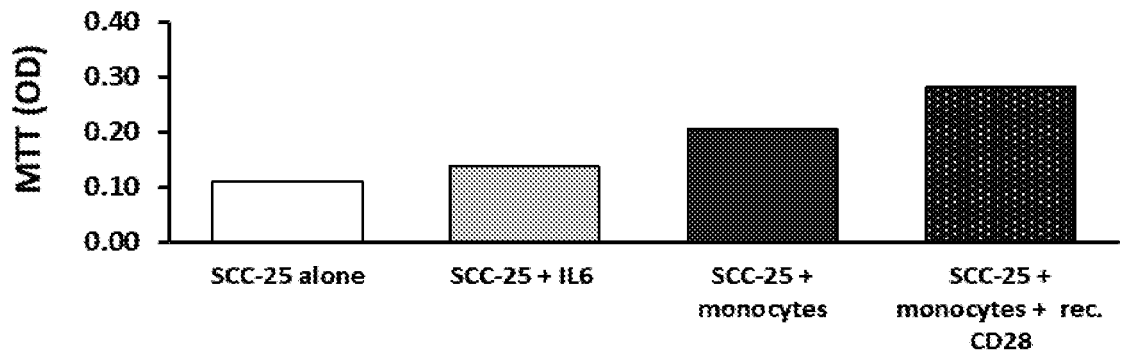
Figure 9C:
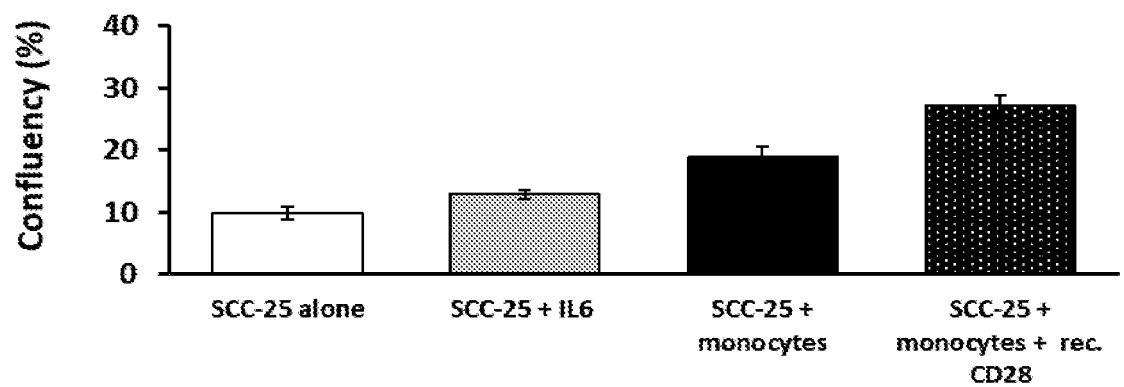

Next, cells of the head and neck cancer cell line SCC-25 were incubated either alone or with monocytes in a trans-well assay. SCC-25 cells grown alone were administered IL-6 as a positive control, and indeed cell proliferation, as measured by MTT (FIG. 9C, upper) and as measured by % confluency (FIG. 9C, lower), was increased. Growing the cancer cells in the presence of the monocytes also increased proliferation, but by far the greatest increase was observed when the coculture included sCD28. This data further supports that sCD28 has a pro-cancer effect.

Example 4: sCD28 Inhibits CD80-Fc Efficacy

Figure 10A:
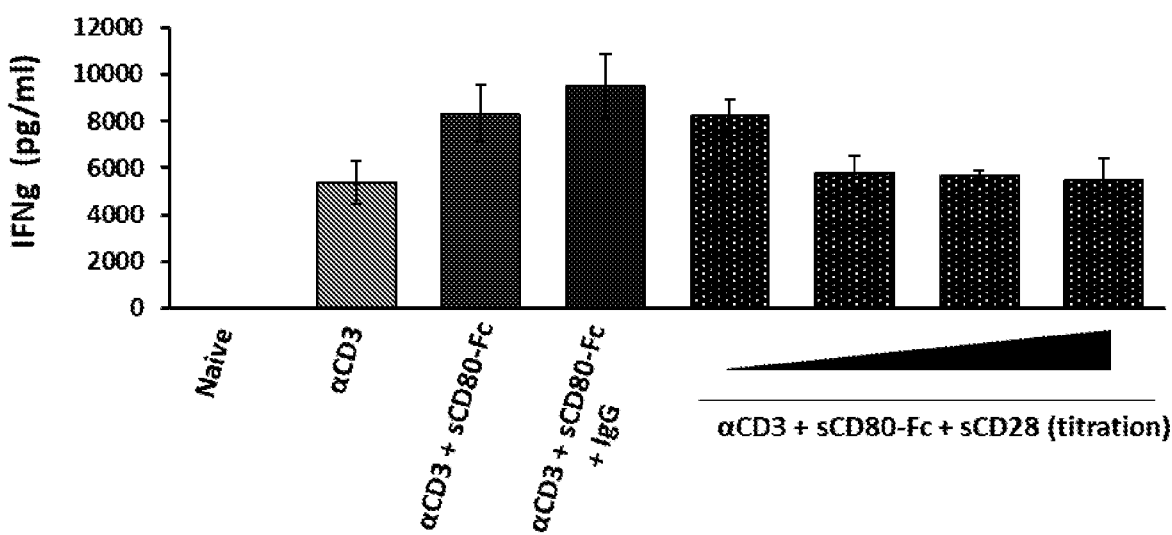
FIGS. 10A-10B. (10A) Bar graphs of IFN gamma secretion from isolated CD3 T cells stimulated with anti-CD3 in the presence of constant CD80-Fc levels and titration of soluble CD28. (10B) Isolated PBMC stimulated with CMV in the presence of constant sCD28 levels and CD80-Fc titrations.
Figure 10B:
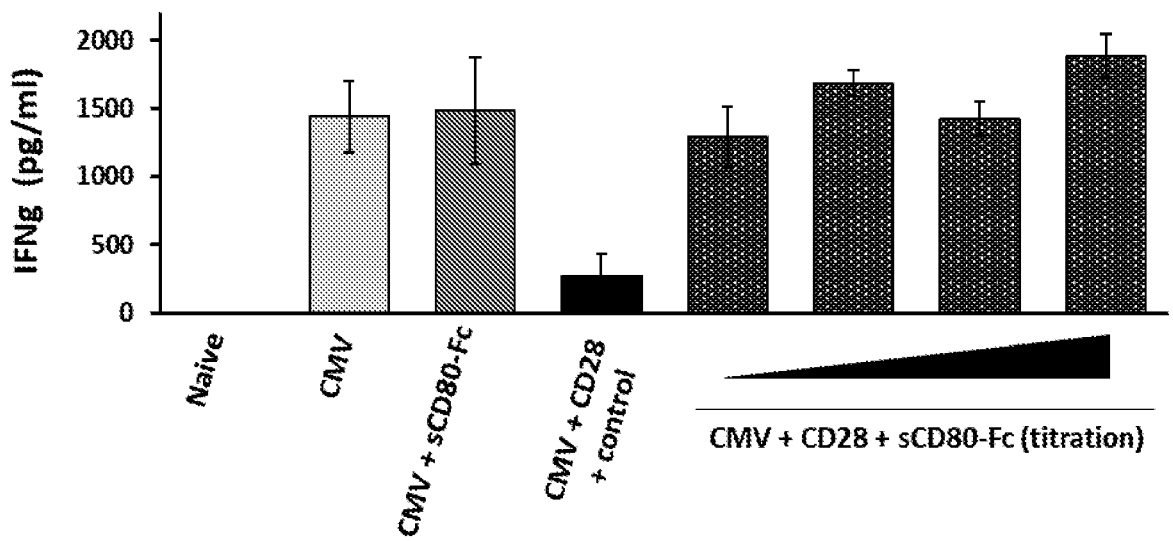

CD80 is one of the two main ligands for mCD28 along with CD86. The extracellular domain of CD80 fused to an Fc moiety has been used as an immune stimulatory molecule and is under investigation as a cancer therapy. In order to examine the effect of sCD28 on CD80-Fc efficacy, isolated CD3 human T cells were stimulated with plate bound anti-CD3 antibody (OKT3, 2 μg/mL) in the presence of 2 μg/mL soluble recombinant human CD80-Fc. As expected, CD80-Fc increased IFN gamma secretion. Addition of sCD28 however, counteracted the secondary activation effect of the CD80-Fc (FIG. 10A). Similarly, when isolated PBMCs were stimulated with CMV peptide for 3 days and then incubated with sCD28 an increased amount of CD80-Fc was required to generate the expected immune response (FIG. 10B).

Example 5: Effect of sCD28 on Cancer In Vivo

Figure 11A:
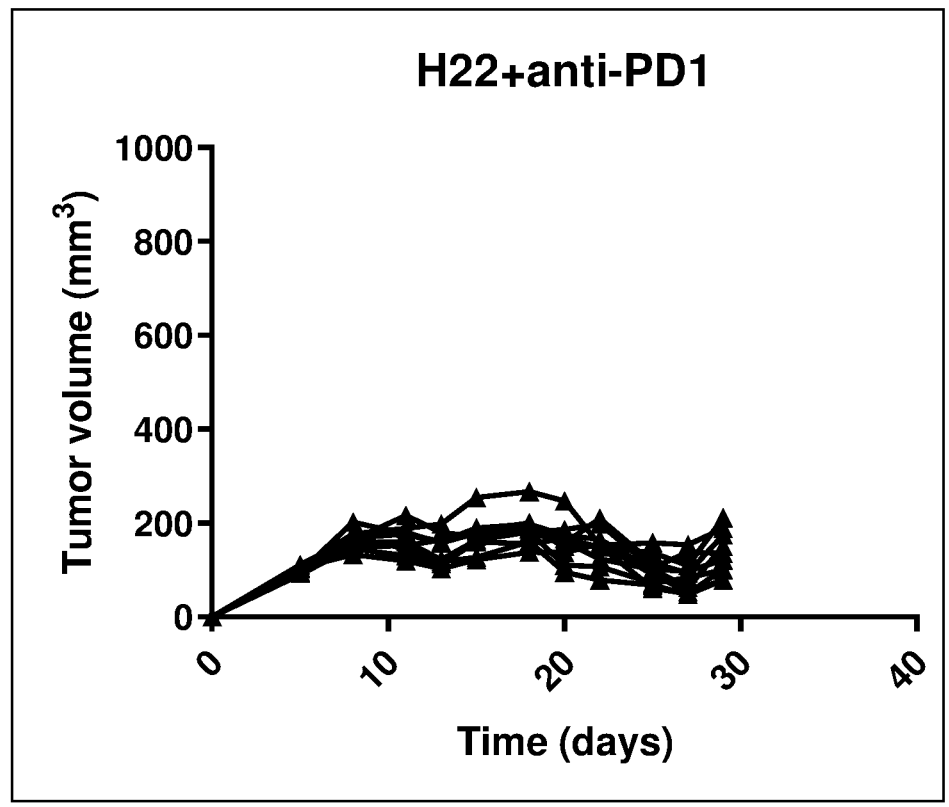
FIGS. 11A-11B. (11A-B) Line graphs of tumor volume of inoculated H22 cells in an immunocompetent mouse treated with anti-PD-1 antibody without (11A) and with (11B) the administration of recombinant mouse CD28.
Figure 11B:
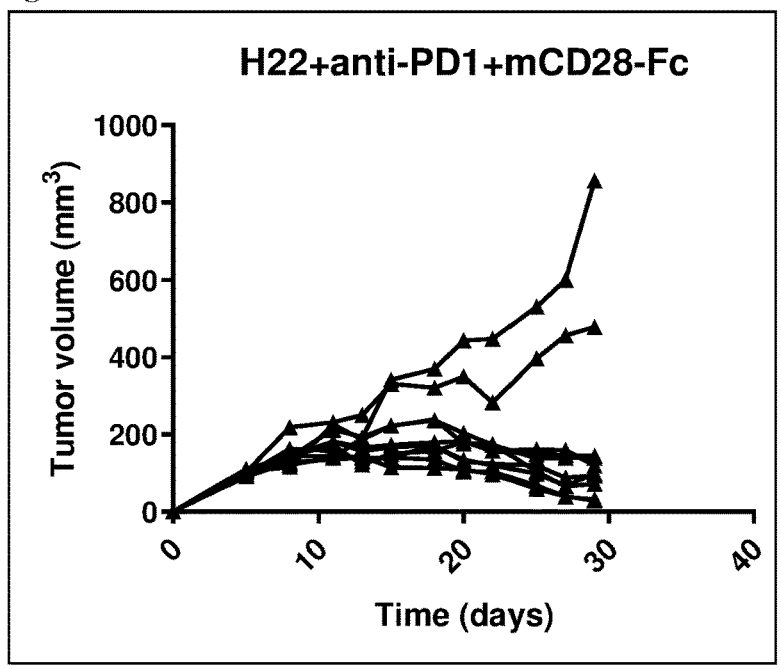

Because mice do not cleave mCD28, the effect of sCD28 cannot be easily examined in a mouse model. The closest option is to administer recombinant sCD28 to mice to mimic a situation of elevated sCD28 levels. This was investigated in a H22 syngeneic mouse model. Balb/c fully immunocompetent mice received an allograft of H22 hepatocellular carcinoma cells. The cells grew even in the fully immunocompetent mice, and addition of anti-PD-1 therapy nearly completely abolished tumor growth (FIG. 11A). When recombinant human sCD28 was added the effect of the anti-PD-1 therapy was nearly completely abrogated in two of the mice (FIG. 11B). This suggests that in some subjects, increased sCD28 levels can have a highly deleterious effect on cancer progression.

Example 6: Characterization of Anti-Shedding Antibody-Based Agents

The finding that human CD28 undergoes a proteolytic process by ADAM10 and ADAM17 prompted the inspection of its polypeptide sequence for candidate regions showing potential susceptibility for proteolytic shedding. Studies have suggested that ADAM10 and ADAM17 prefer leucine, valine and aromatic residues at the P1' site. The most attractive sequence region in human CD28 is the stalk section, ranging from Histidine 134 to Proline 152 (SEQ ID NO: 10 (HVKGKHLCPSPLFPGPSKP)), connecting the globular IgV domain to the transmembrane region. This region holds 3 total leucine and valine residues, as well as a phenylalanine residue and is predicted to be devoid of any secondary structure elements that might hinder access of the proteases. Notably, the stalk region also contains Cysteine 141 that forms the inter-disulfide bond that facilitates the homo-dimerization of CD28. With the aim of generating an antibody or antibody fragments that specifically bind the CD28 stalk region and potentially block access of different proteases to shed CD28 while avoiding any compromising of CD28 oligomeric structure and function, CD1 mice were immunized with a dimeric peptide mimicking the CD28 stalk region. The peptide sequence used for immunization was SEQ ID NO: 29, GKHLCPSPLFPGPSKPK, the C-terminal Lysine was added in order to have a free amino group to allow KLH or BSA conjugation using hydrazide chemistry. The conjugations were performed between the hydrazide-terminated CD28 peptide and S-4FB modified BSA, which generates free aldehydes for site-specific conjugation. Dimerization was confirmed by running the peptide on a non-denaturing gel.

Figure 12A:
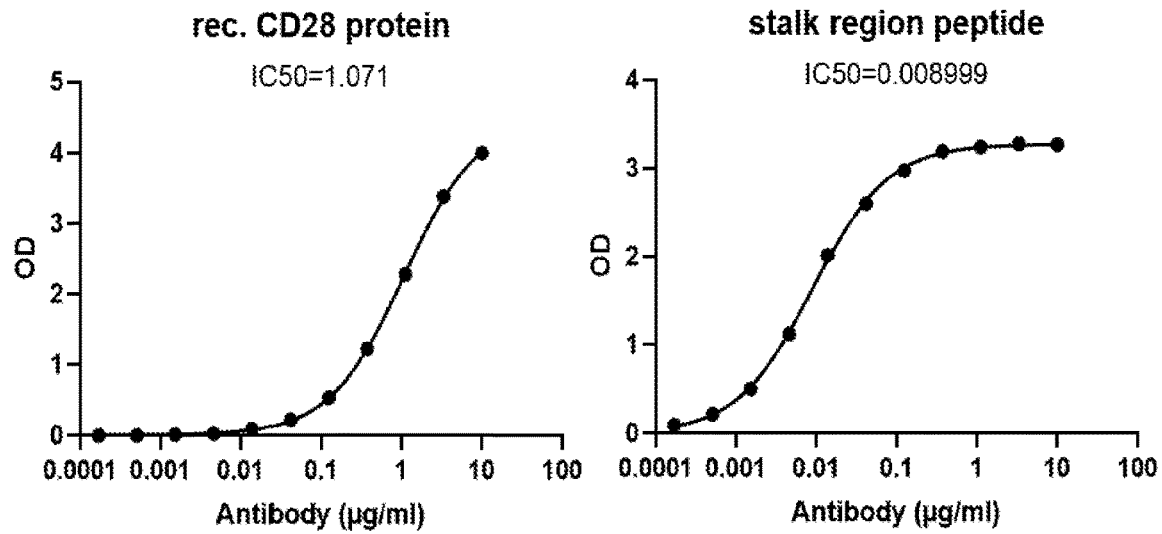
FIGS. 12A-12C. (12A) Line graphs showing antigen binding by serial dilution of clone M9 to the BSA conjugated CD28 stalk region dimeric peptide (right) and recombinant human CD28 protein (left). Antigens were immobilized on maxisorp ELISA plates. A dilution series of clone M9 was preformed and detection of bound antibody was done with donkey anti mouse IgG (H&L)-HRP and development with TMB. (12B) Bar graphs of ELISA detection of recombinant human sCD28 (left) and sCD28 shed from human PBMCs activated with SEB (right). The ELISA used antibody #3 as a positive control (2 µg/mL, grey bars), irrelevant antibody M39 as a negative control (10 µg/mL, dark grey bars) and anti-cleavage antibody M9 (10 µg/mL, black bar). Detection of recombinant CD28 or shed CD28 was done by using ELISA kit detection antibody conjugated to HRP (0.5 µg/mL). (12C) Histograms showing binding of antibody M9 (upper) and control antibody CD28.2 (lower) at fixed concentration of 10 µg/ml (black histograms) to human CD28 expressed in mouse HEK293 cells. Polyclonal mouse IgG was used as negative control (10 µg/ml) and is depict in grey histograms. Detection was done by secondary incubation of Alexa Fluor 647-conjugated goat anti-mouse.
Figure 12B:
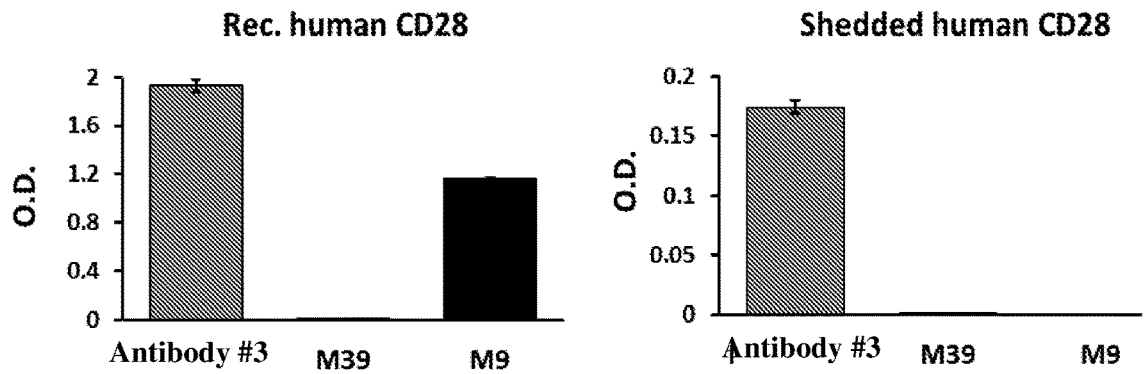

An antibody with high binding affinity for recombinant human CD28 as measured by direct CD28 EIA was found. This antibody is designated M9 and sequences of this antibody are provided hereinabove. Serial dilution of antibody M9 was used to confirm its specific binding to recombinant human sCD28 and to the stalk region peptide (FIG. 12A). Interestingly, while the antibody was able to detect recombinant human sCD28 it was not able to detect sCD28 actually shed from immune cells (FIG. 12B). This strongly suggests that the antibody binds at the cleavage site, and the deisotope to which it binds is incomplete in the cleaved form.

Figure 12C:
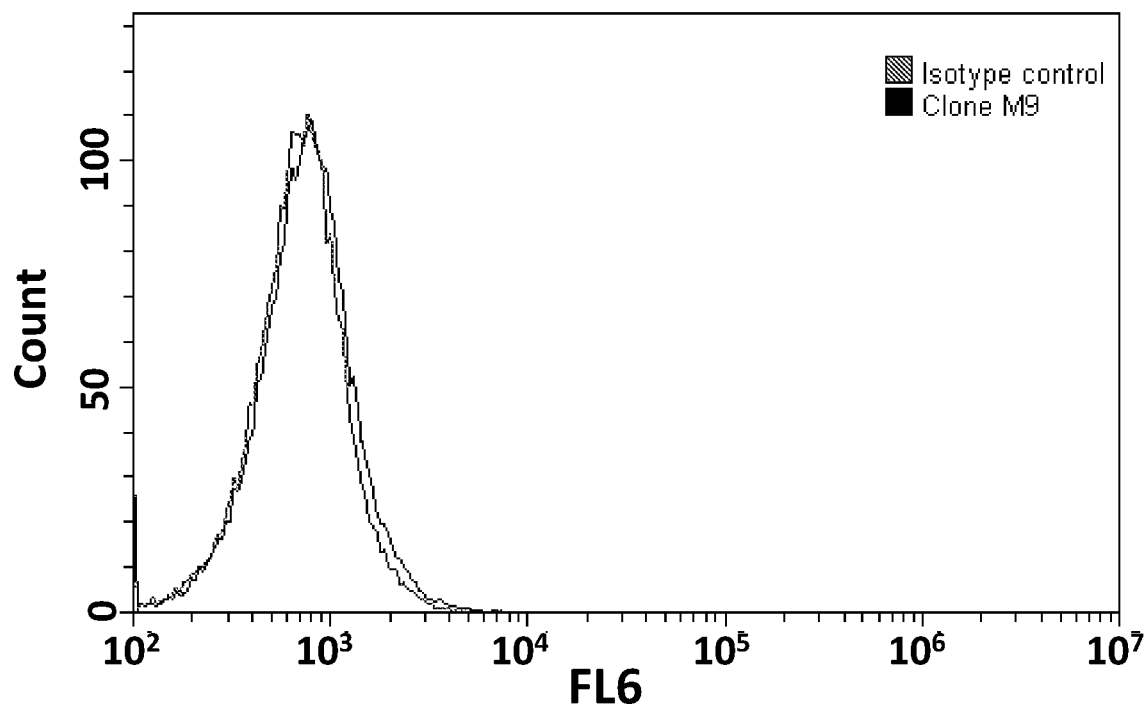
Figure 12C:
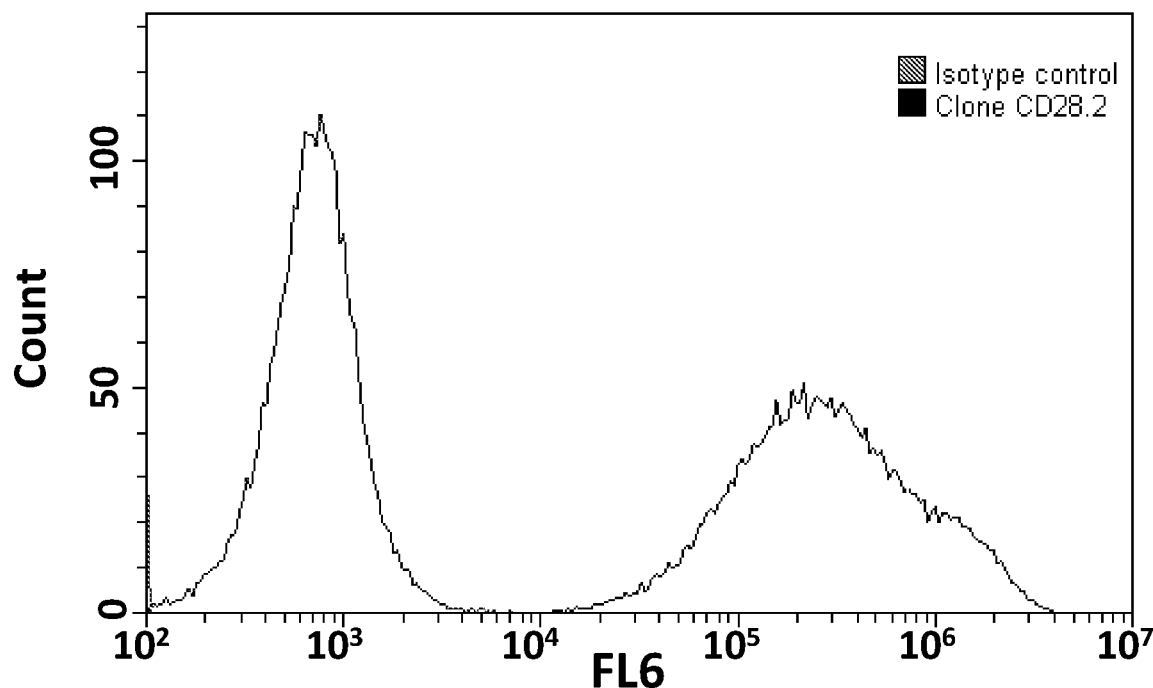
Figure 13:
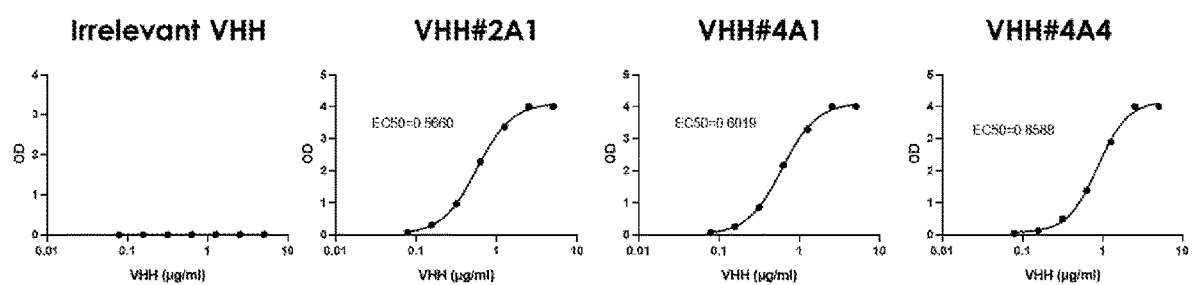
FIG. 13. Binding to Human CD28 stalk region sequence by ELISA. Analysis of antigen binding by serial dilution of different VHH clones. Biotin conjugated CD28 stalk region dimeric peptide serving as antigen was immobilized on neutravidin coated ELISA maxi-sorb plates. Serial dilution of VHH clones was preformed and detection of bound VHH was done with anti His tag-HRP conjugated antibody and development was done with TMB.
Figure 14:
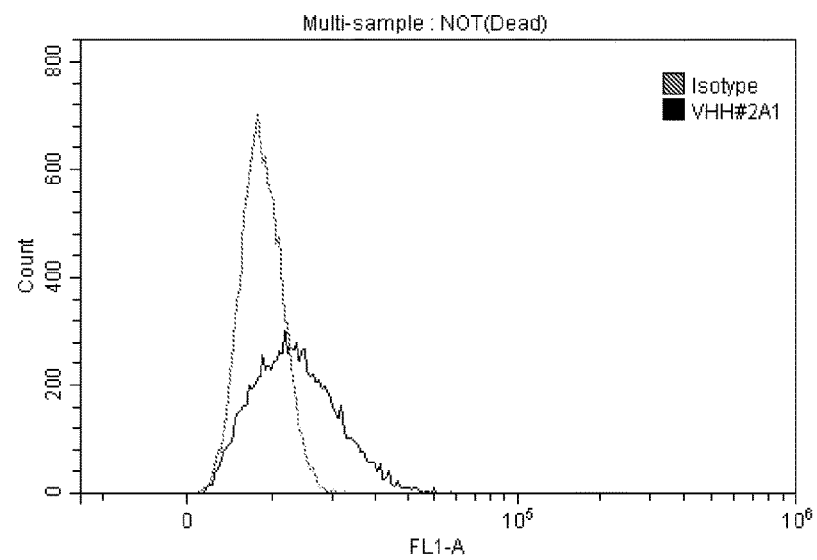
FIG. 14. Binding of VHH #2A1 to membranal human CD28. FITC conjugated VHH clone 2A1 (50 µg/mL, black histogram) and FITC conjugated isotype control (mIgG, 50 µg/mL, grey histogram) were incubated with HEK cells overexpressing human CD28. Binding was evaluated by FACS analysis.
Figure 15:
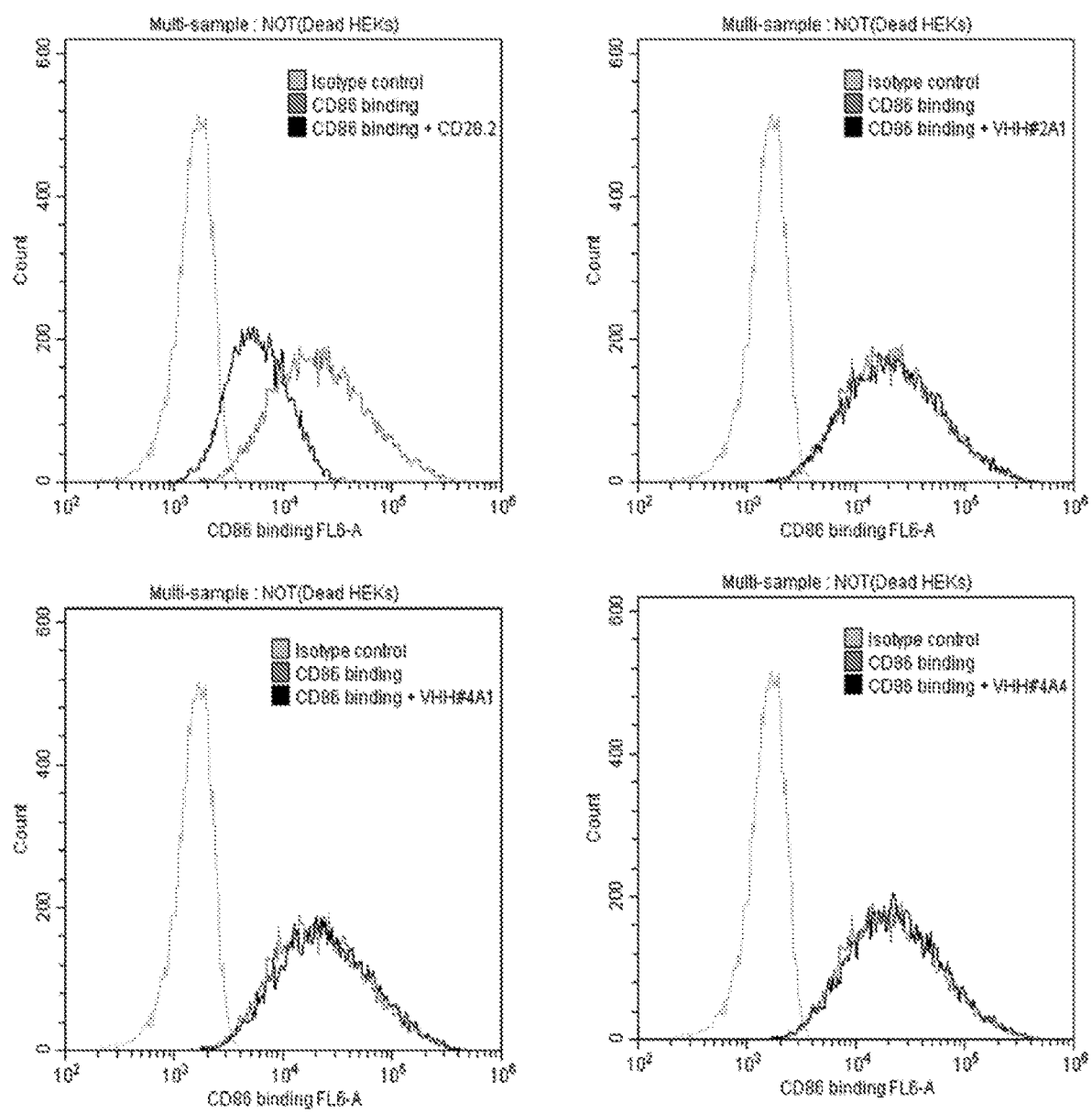
FIG. 15. Anti CD28 stalk region VHH clones do not block ligand binding to membranal CD28. HEK293 cells over expressing human CD28 were monitored by flow-cytometry for CD86-Fc (2 µg/mL) binding using secondary anti human Fc antibody conjugated to AlexaFlour 647. Addition of anti CD28 VHH clones to CD86-Fc (30 µg/mL, black histogram) did not change the magnitude of CD86 binding while addition of commercial antibody clone CD28.2 (10 µg/mL, upper left chart, black histogram) diminished binding significantly.
Figure 16:
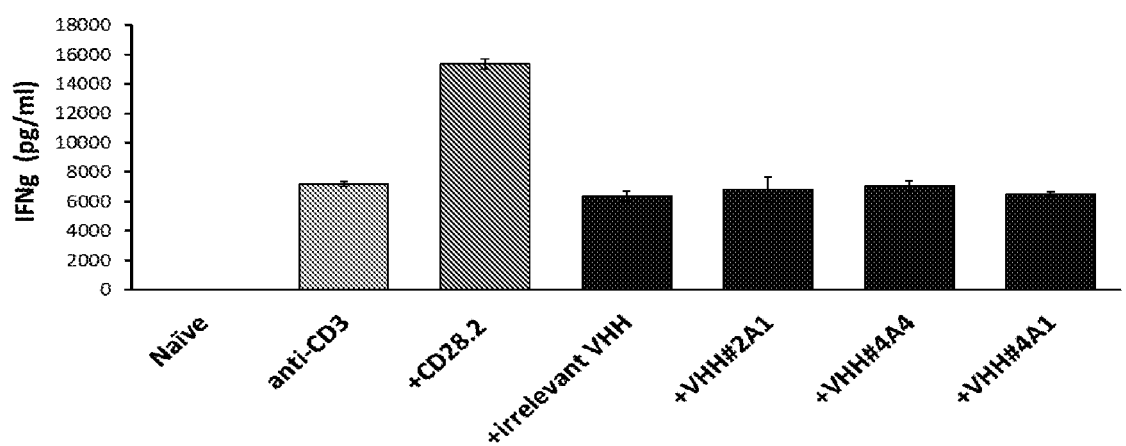
FIG. 16. Agonist effect evaluation of anti-CD28 VHH clones. Human isolated CD3 cells were stimulated for 2 days with plate bound anti-CD3 (OKT3, 2 µg/mL, light grey bar) in the presence of anti-CD28 agonist antibody clone 28.2 (2 µg/mL, dark grey bar) serving as positive control, anti-CD28 stalk region VHHs or an irrelevant VHH clone (20 µg/mL, black bars). The concentration of human IFN gamma secreted into the supernatant was quantified with standardized sandwich ELISA (Biolegend).
Figure 17:
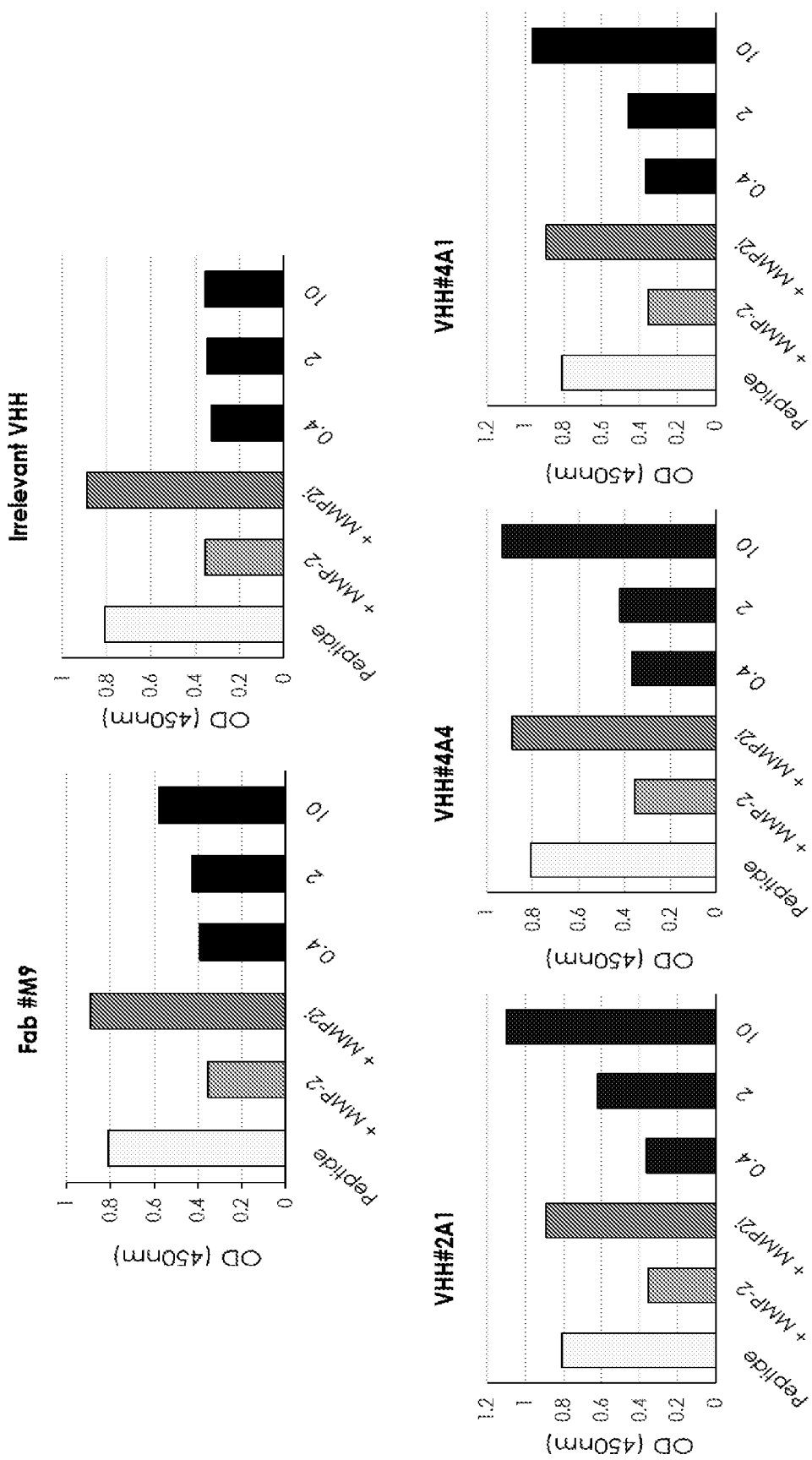
FIG. 17. In-vitro blocking of the MMP-2-mediated cleavage of human CD28 stalk region by VHH clones. A c-Myc conjugated and biotinylated human CD28 stalk region dimeric peptide (1 μM) was incubated with 50 ng rhMMP-2 in the presence of an MMP-2 inhibitor (TMI-1, 50 nM), M9 Fab or indicated VHH clones at various concentrations (0.4-10 μg/mL) for 5 hours. The mixtures were loaded on neutravidin coated ELISA maxi-sorb plates followed by extensive wash and detection of intact peptide by anti-cMyc HRP-conjugated antibody and development was carried out with TMB.
Figure 18:
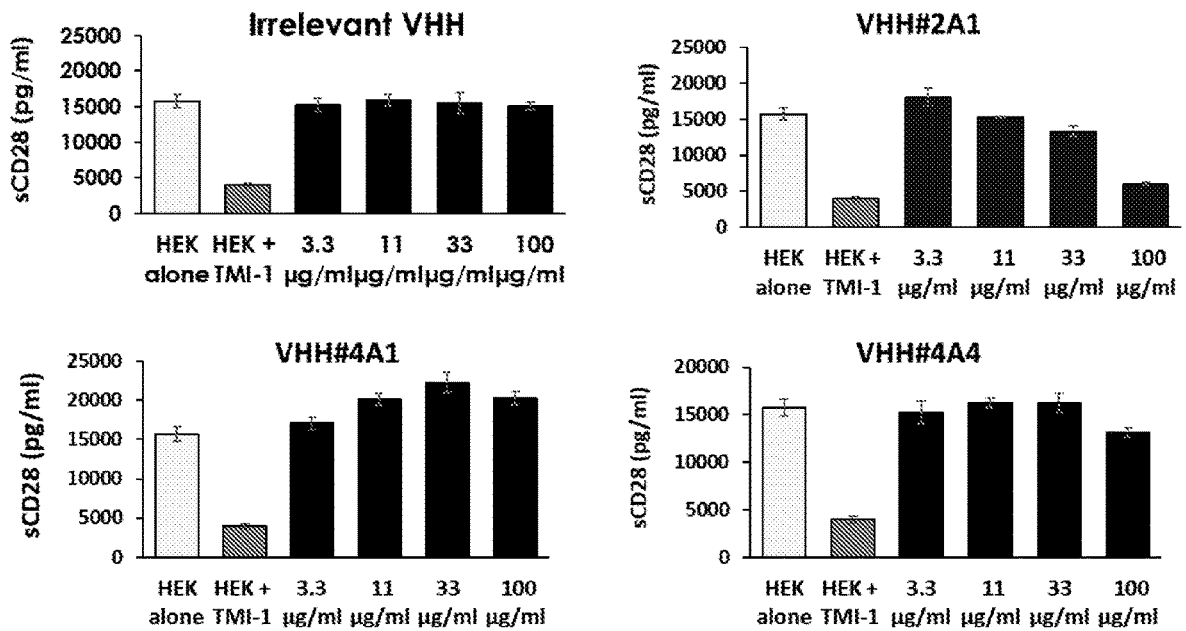
FIG. 18. Anti-CD28 stalk region VHH clones 2A1 and 4A4 inhibit CD28 shedding in HEK cells overexpressing human CD28. Levels of soluble CD28 were measured in culture media of HEK cells stably expressing human CD28 after 48 hr incubation. The effect of different treatments of MMP inhibitor (TMI-1, 1 μM, dark grey bars), negative control of irrelevant VHH (top left chart, black bars) or anti-CD28 stalk region VHH clones (black bars) at various concentrations (3.3-100 μg/mL) on the level of soluble CD28 is depicted. The levels of soluble human CD28 in the supernatant were quantified with standardized sandwich ELISA (R&D system).
Figure 19:
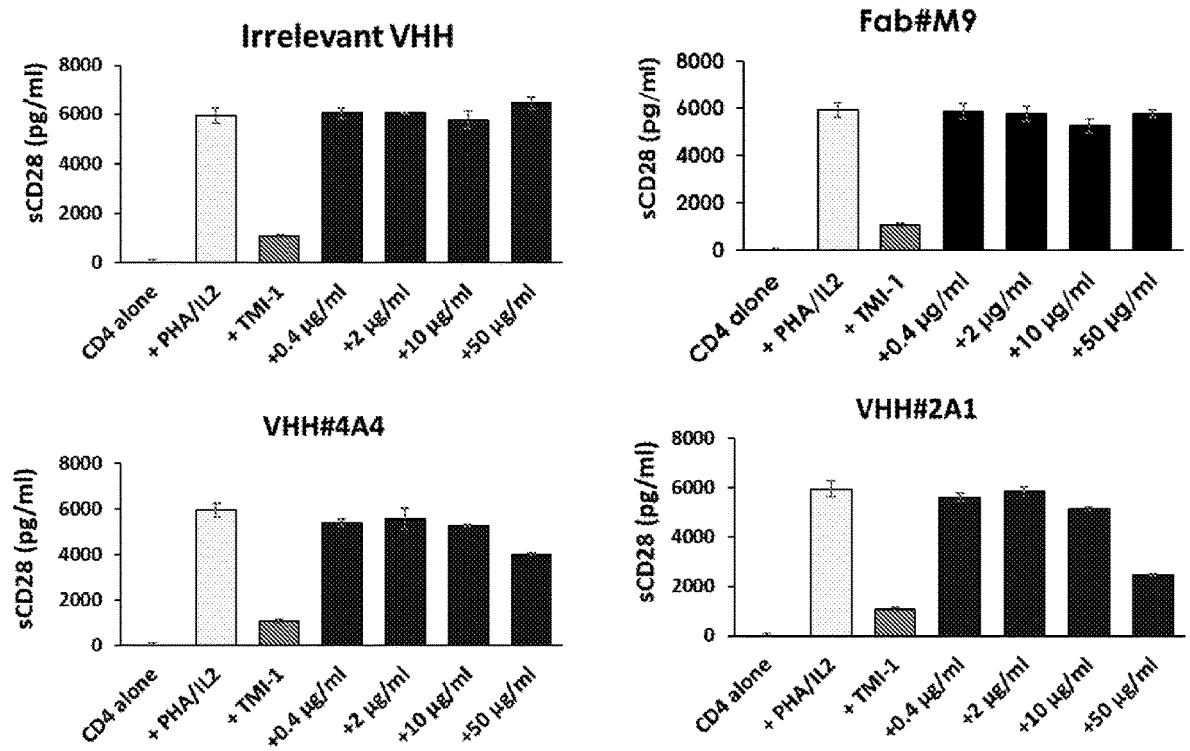
FIG. 19. Anti-CD28 stalk region VHH clones 2A1 and 4A4 inhibit CD28 shedding in isolated CD4 T cells activated by PHA and IL2. Levels of soluble CD28 were measured in culture media of isolated human CD4 T cells stimulated with 5 μg/mL PHA and 200 IU/mL IL-2 (light grey bar). The effect of different treatments of MMP inhibitor (TMI-1, 1 dark grey bars), negative control of irrelevant VHH (top left chart, black bars), anti-CD28 stalk region VHH clones or Fab format of antibody M9 clone (black bars) at various concentrations (0.4-50 μg/mL) on amount of soluble CD28 is depicted. The levels of soluble human CD28 in the supernatant were quantified with standardized sandwich ELISA (R&D system).
Figure 20:
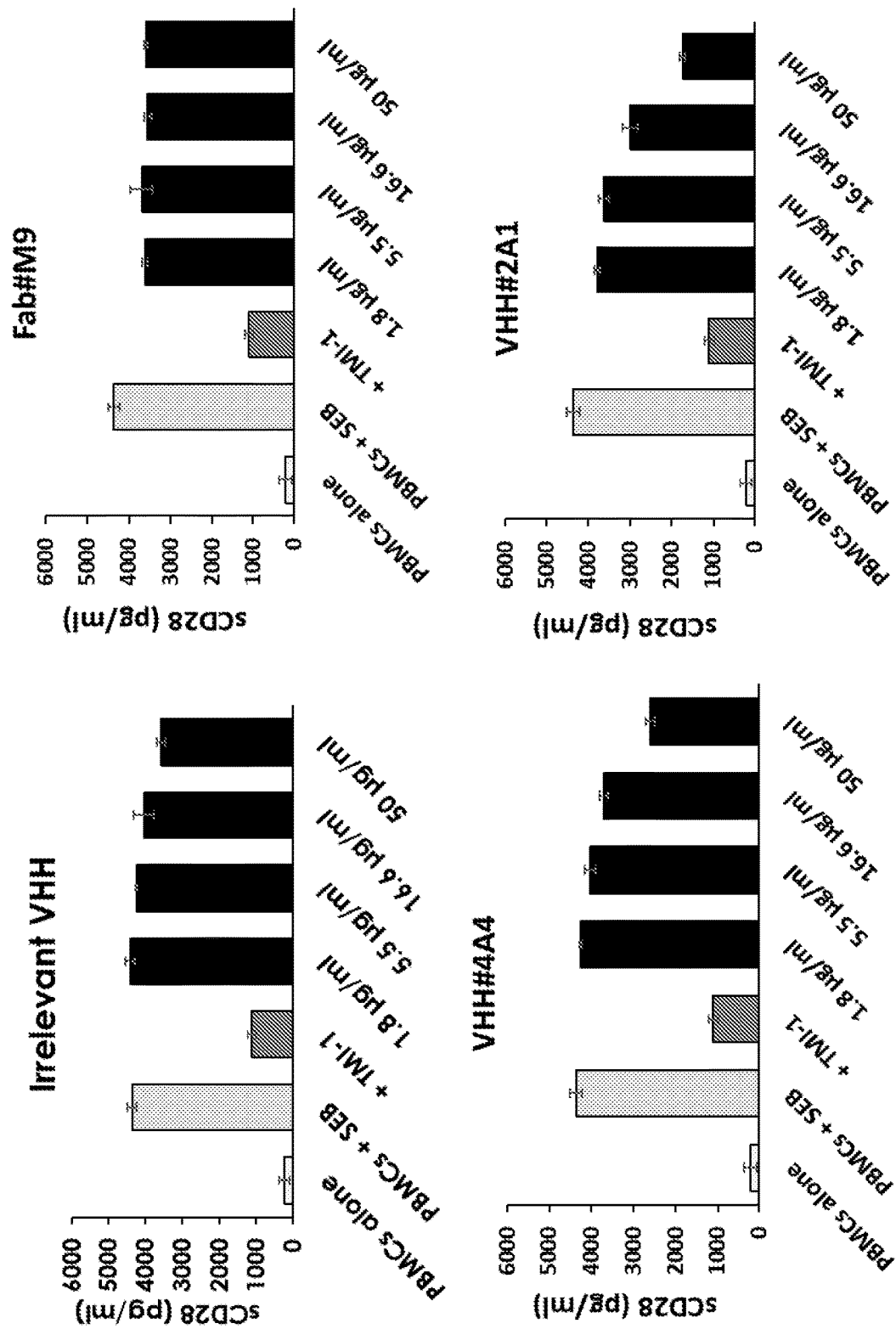
FIG. 20. Anti-CD28 stalk region VHH clones 2A1 and 4A4 inhibit CD28 shedding in PBMC activated by superantigen. Levels of soluble CD28 were measured in culture media of isolated PBMC stimulated with 1 ng/mL SEB (light grey bar). The effect of different treatments of MMP inhibitor (TMI-1, 1 dark grey bars), negative control of irrelevant VHH (top left chart, black bars), anti-CD28 stalk region VHH clones or Fab format of M9 clone (black bars) at various concentrations (0.4-50 μg/mL) on amount of soluble CD28 is depicted. The levels of soluble human CD28 in the supernatant were quantified with standardized sandwich ELISA (R&D system).
Figure 21:
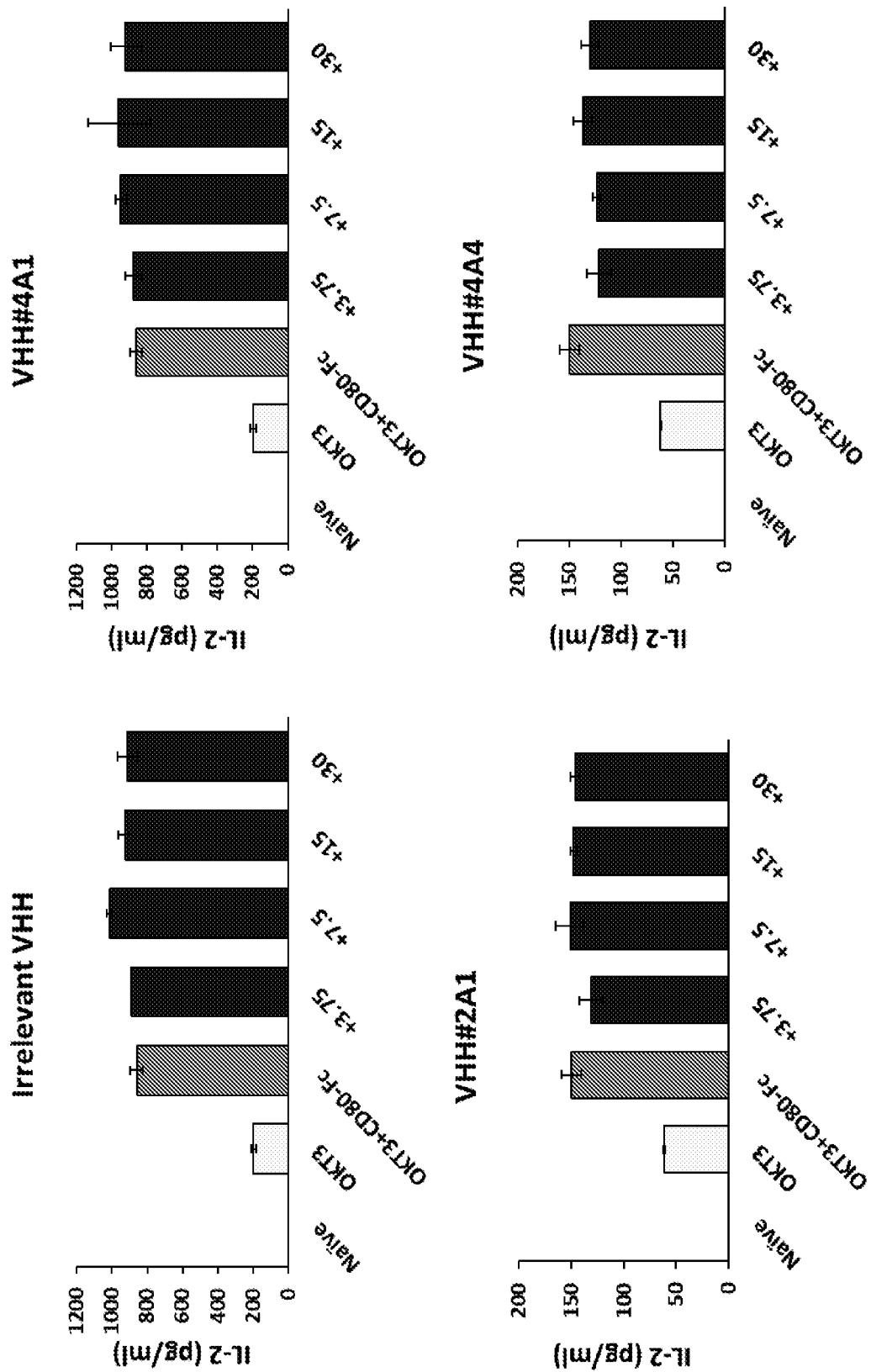
FIG. 21. Antagonist effect evaluation of anti-CD28 VHH clones. Human isolated CD3 cells were stimulated for 24 hours with plate bound anti-CD3 (OKT3, 2 μg/mL, light grey bar) in the presence of recombinant CD80-Fc protein (5 μg/mL, dark grey bar) serving as ligand for CD28 co-stimulation. An irrelevant VHH clone (top left chart) or the anti-CD28 stalk region VHHs were added at various concentrations (3.75-30 μg/mL, black bars). The concentration of human IL-2 in the supernatant was quantified with standardized sandwich ELISA (Biolegend).
Figure 22:
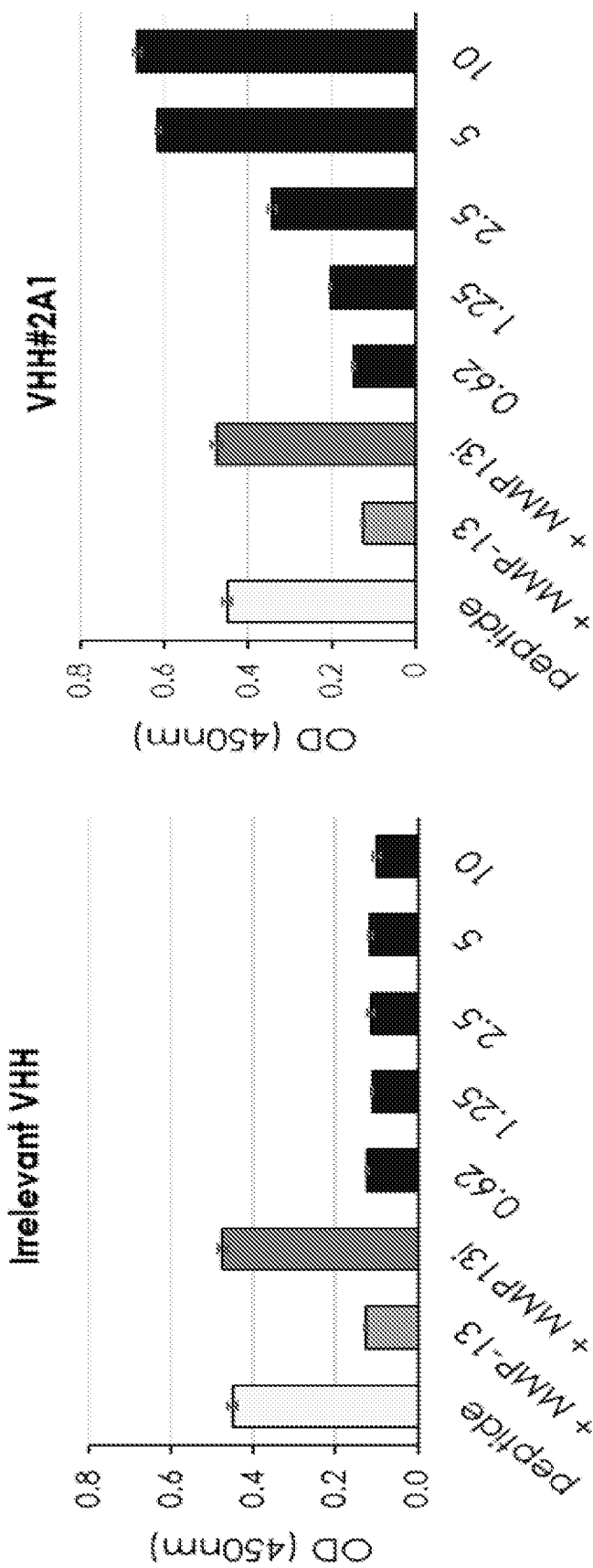
FIG. 22. In-vitro blocking activity of VHH clone 2A1 for the cleavage of human CD28 stalk region by MMP-13. A c-Myc and a biotinylated human CD28 stalk region dimeric peptide (1 μM) was incubated with 50 ng rhMMP-13 (light grey bar) in the presence of MMPi (TMI-1, 50 nM, dark grey bars), an irrelevant VHH clone (black bars in left chart), or VHH clone 2A1 (black bars in right chart) at various concentrations (0.62-10 μg/mL) for 5 hours. The mixtures were loaded on neutravidin coated ELISA maxi-sorb plates followed by extensive wash and detection of intact peptide by anti cMyc-HRP conjugated antibody and development was carried out with TMB.
Figure 23:
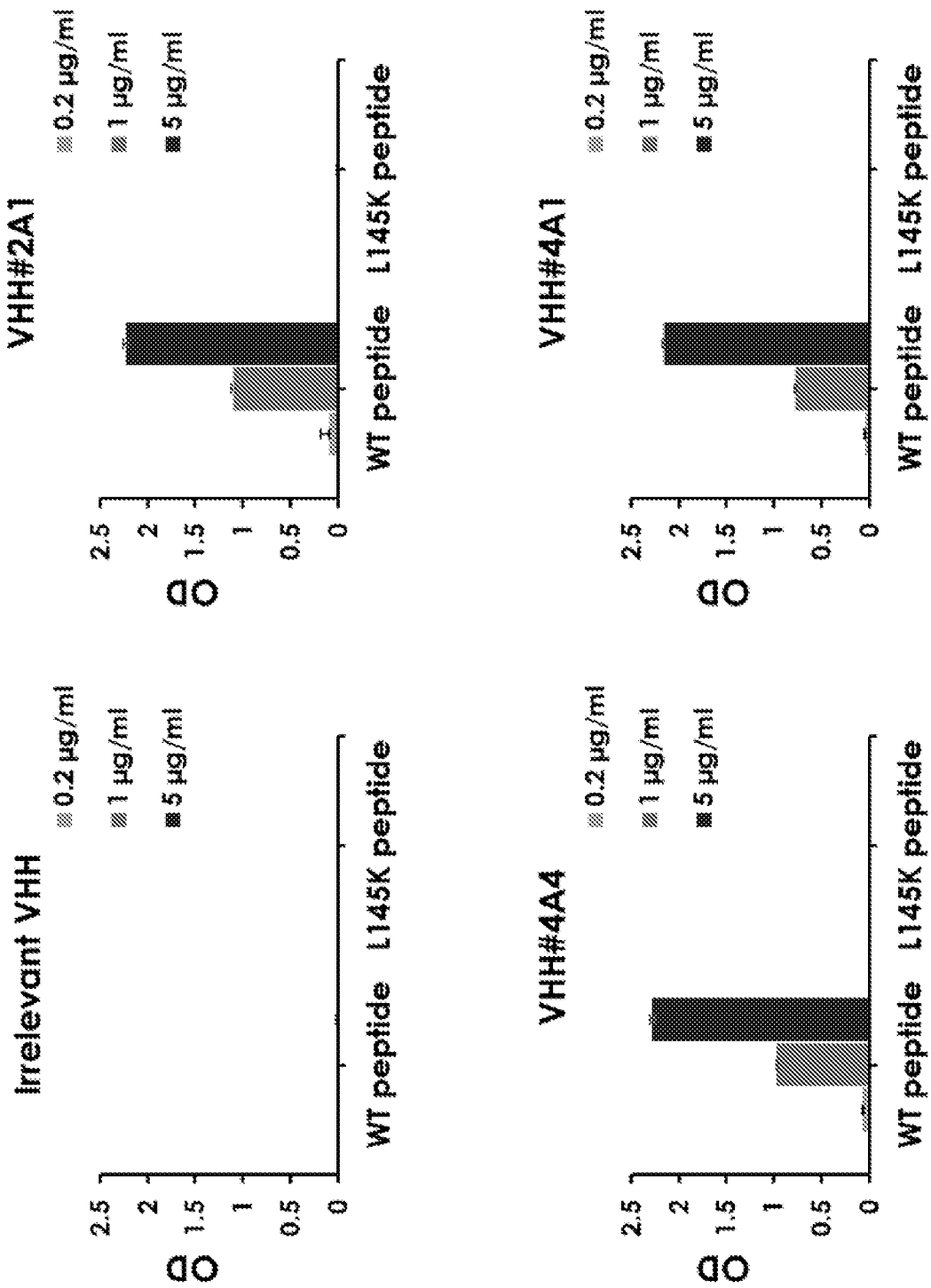
FIG. 23. Anti CD28 stalk region VHH clones 2A1, 4A1 and 4A4 bind specifically to MMP cleavage site of human CD28. Comparison of the specific binding of VHH clones either to human CD28 stalk region WT sequence or to L145K mutated sequence by direct ELISA. Biotin conjugated wild-type or L145K CD28 stalk region dimeric peptides were immobilized on neutravidin coated ELISA maxi-sorb plates. A dilution series of VHH clones (0.2-5 μg/mL) and an irrelevant VHH clone (top left chart) was performed and detection of bound VHH was done with anti His tag-HRP conjugated antibody and development was done with TMB.

Next the ability of the antibody to bind mCD28 on a cell surface was investigated. In order to reduce shedding of sCD28 from a cell the antibody would need to actually bind on the membranal form of the protein and not just recombinant protein in solution. HEK293 cells overexpressing human full-length CD28 were analyzed. Mouse CD28 does not appear to be cleaved into a soluble form (activated murine spleenocytes do not appear to produce sCD28) and so the human protein must be investigated. Cells were analyzed by flow cytometry using the M9 antibody and the CD28.2 antibody as a positive control. Surprisingly, M9 did not appear to bind to surface mCD28 (FIG. 12C). This is likely due to steric hinderance and limited access to the stalk region when it is membrane adjacent.

Example 7: Single-Domain Antibodies Inhibit sCD28 Shedding from the Cell Surface Small agents capable of binding mCD28 on the surface of a cell and blocking shedding of sCD28 were designed. While full size antibodies are about 150 kDa in size, Fab fragments derived from antibodies have a size of about 50 kDa, while single chain antibodies (also called single chain variable fragments, scFvs) have a size of about 25 kDa and single domain antibodies (also called VHH antibodies, scFvs, and DARPins) have a size of only 12-15 kDa.

Single domain antibodies were isolated using a phage library of naïve llama derived VHH. The library was composed of VHH sequences that were taken from naïve non-immunized Llama, i.e., extracting B cells and sequencing the whole available repertoire of VHH CDRs. These CDRs were implemented into phage to generate a library. Using ELISA and flow cytometry, the library was screened against recombinant CD28 extracellular domain and the dimeric stalk region peptide to find antibodies that specifically bind the stalk region of human CD28. The VHH sequences found to specifically bind the stalk region of human CD28 are: EVQLVESGGGLVQAGESLRLSCAASGSIASI-NAMGWYRQAPGSQRELVAAISGGGDTY YADSVKGRFTISRDNAKTTVYLQMNSLRPED-TAVYYCVVDLYGSDYWDWGQGTQVT VSSAAAHHHHHH (SEQ ID NO: 45, clone 2A1); EVQLVESGGGLVQAGGSLRLSCAASGSLFSI-NAMAWYRQAPGKQRELVAAITSSGSTN YANS-VKGRFTVSRDNAKNTMYLQMNSLKPED-TAVYYCVVDEYGSDYWIWGQGTQV TVSSAAAHHHHHH (SEQ ID NO: 46, clone 4A4); and QVQLVESGGGLVQAGGSLRLSCAASGSIFSI-NAMGWYRQAPGKQRERVAAITSGGSTN YADSVKGRFTISRDNAKNTVYLQMNN-LEPRDAGVYYCVVDLYGEDYWIWGQGTQVT VSSAAAHHHHHH (SEQ ID NO: 47, clone 4A1). The VHHs were produced as recombinant proteins in CHO cells and then evaluated for cellular binding and anti-shedding activity as described below. A His-tag at the C-terminus was used for purification and was linked via triple alanine repeat. The CDRs of the three investigated clones are provided in Table 1.

TABLE 1

| VHH Clone | CDR1 (SEQ ID) | CDR2 (SEQ ID) | CDR3 (SEQ ID) |
|---|---|---|---|
| 2A1 | INAMG (33) | AISGGGDTYY ADSVKG (34) | DLYGSDYWD (35) |
| 4A4 | INAMA (36) | AITSSGSTNY ANSVKG (37) | DEYGSDYWI (38) |
| 4A1 | INAMG (33) | AITSGGSTNY ADSVKG (39) | DLYGEDYWI (40) |

Binding of the VHH clones to the human CD28 stalk region sequence was first confirmed with ELISA using serial dilution of VHH clones (FIG. 13). Binding to membranal human CD28 on the cellular level was confirmed with FACS analysis using labeled VHH clone and HEK cells overexpressing CD28 (FIG. 14). Membranal CD28 binding demonstrates access to the CD28 membrane proximal region. Previous experimentation has shown that the size of the agent is critical to access this region, as full-size antibodies that could bind to the CD28 stalk region peptides could not bind to the CD28 stalk region on cells. Notably, VHH clones were not capable of binding human CD28 stalk region sequence with a L-K substitution at amino acid residue 145, located within the MMP cleavage site (FIG. 23).

Anti-shedding activity was confirmed both on the peptide and the cellular level. ELISA techniques were used to detect intact human CD28 stalk region dimeric peptide to confirm that the VHH clones block the cleavage of human CD28 stalk region by MMP-2 (FIG. 17), and MMP-13 (FIG. 22) While M9 Fab exhibited the ability to block CD28 stalk region peptide cleavage by MMP-2, as described above it could not bind the CD28 stalk region on cells and could not inhibit CD28 shedding from cell membranes. On the cellular level, standard sandwich ELISA was used to confirm the efficacy of the VHH clones in inhibiting sCD28 shedding by measuring the levels of human sCD28 in the supernatant of HEK cells overexpressing human CD28 (FIG. 18), isolated CD4 T cells activated by PHA and IL-2 (FIG. 19) and PBMC activated by a superantigen (FIG. 20). As expected, M9 Fab did not decrease sCD28 levels in supernatant, further emphasizing the importance of size and architecture of the blocking agent on its ability to actually block shedding.

Critically, the VHH clones were found to not impair human CD28 functionality. Using flow-cytometry, it was found that the VHH clones do not change the magnitude of CD86 binding to membrane CD28 (FIG. 15). Standard sandwich ELISA was used to show the VHH clones do not agonize CD28 as measured by the secreted levels of the inflammatory cytokine interferon gamma (FIG. 16). Activating antibody CD28.2 was used as a positive control. Similarly, standard sandwich ELISA was used to show that the VHH clones do not antagonize CD80-Fc stimulation through CD28, as measured by the secreted levels of the cytokine IL-2 (FIG. 21).

Example 8: Designing Other Small Agents to Inhibit sCD28 Shedding from the Cell Surface Fab fragment generation is performed using a commercial kit, or commercially available service. The CDR regions of antibody M9 are used for Fab generation as they have been shown to bind to the proper deisotope. Efficacy of the resultant Fab fragment is tested first by binding assays to recombinant human CD28 and the dimeric stalk region peptide to confirm that this binding is retained. Binding to surface mCD28 is assayed by FACS to mouse cells expressing human CD28 and to human immune cells. Antibody CD28.2 is used as a positive control. Direct inhibition of sCD28 shedding is tested in immune cell culture after stimulation. sCD28 in the culture media is measured by sandwich ELISA when the cells are in the presence and absence of the Fab fragments. Fab fragments with shedding inhibitory action are assayed for their effect on CD28 signaling. First, agonism is tested by assaying the ability of the Fab fragments to induce secretion of a proinflammatory cytokine, e.g. interferon gamma, from T cells. Second, the ability to block binding of CD80-Fc (an agonist) is used to test antagonistic properties of the Fab fragments.

Single chain antibody generation using the M9 CDRs is performed by standard methods using a commercial service, or by inserting the CDRs into a scFv backbone. Purification is performed and the resultant antibodies are assessed by the same assays as described for Fab fragments.

Single domain antibodies are produced by one of two strategies. 1) Naïve library—usage of phage library of naïve Llama derived VHH—the library is composed of VHH sequences that were taken from naïve Llama spleens, i.e., extracting B cells and sequencing the whole available repertoire of VHH CDRs. These CDRs where implemented into phage to generate a library. The library is screened against recombinant CD28 extracellular domain and the dimeric stalk region peptide to find antibodies that specifically bind sCD28. 2) Immune library—immunizing llama or other camelid or shark with cells overexpressing CD28. After cell immunization the spleens are extracted and the available repertoire of VHH CDRs are sequenced. Hybridomas are made from the extracted splenic B cells. The resultant antibodies are implemented into phage to generate a library and the library is screened against recombinant CD28 extracellular domain and the dimeric stalk region peptide to find antibodies that specifically bind sCD28. Single domain antibodies with specific binding are assessed for shedding blocking and agonism/antagonism as is done for the Fab fragments and single chain antibodies.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. A single domain antibody comprising three CDRs, wherein:
   CDR1 comprises the amino acid sequence set forth in SEQ ID NO: 33 (INAMG), CDR2 comprises the amino acid sequence set forth in SEQ ID NO: 34 (AIS-GGGDTYYADSVKG), CDR3 comprises the amino acid sequence set forth in SEQ ID NO: 35 (DLYGSDYWD);
   CDR1 comprises the amino acid sequence set forth in SEQ ID NO: 36 (INAMA), CDR2 comprises the amino acid sequence set forth in SEQ ID NO: 37 (AITSSG-STNYANSVKG), CDR3 comprises the amino acid sequence set forth in SEQ ID NO: 38 (DEYGSDYWI); or
   CDR1 comprises the amino acid sequence set forth in SEQ ID NO: 33 (INAMG), CDR2 comprises the amino acid sequence set forth in SEQ ID NO: 39 (AITSGG-STNYADSVKG), CDR3 comprises the amino acid sequence set forth in SEQ ID NO: 40 (DLYGEDYWI).

2. The antibody of claim 1, wherein said antibody comprises a sequence selected from a group consisting of:

a.
   (SEQ ID NO: 30)
   EVQLVESGGGLVQAGESLRLSCAASGSIASINAMGWY

RQAPGSQRELVAAISGGGDTYYADSVKGRFTISRDNA

KTTVYLQMNSLRPEDTAVYYCVVDLYGSDYWDWGQGT

QVTVSS;

b.
   (SEQ ID NO: 31)
   EVQLVESGGGLVQAGGSLRLSCAASGSLFSINAMAWY

RQAPGKQRELVAAITSSGSTNYANSVKGRFTVSRDNA

KNTMYLQMNSLKPEDTAVYYCVVDEYGSDYWIWGQGT

QVTVSS;
   and c.
   (SEQ ID NO: 32)
   QVQLVESGGGLVQAGGSLRLSCAASGSIFSINAMGWY

RQAPGKQRERVAAITSGGSTNYADSVKGRFTISRDNA

KNTVYLQMNNLEPRDAGVYYCVVDLYGEDYWIWGQGT

QVTVSS.

3. The antibody of claim 1, wherein said antibody is not a CD28 agonist, not a CD28 antagonist, neither degrades membranal CD28 (mCD28) nor inhibits mCD28-mediated immune cell activation or a combination thereof.

4. The antibody of claim 1, wherein said antibody binds within the stalk region of CD28 and wherein the stalk region comprises the amino acid sequence GKHLCPSPLFPGPSKP (SEQ ID NO:9) or KGKHLCPSPLFPGPS (SEQ ID NO: 27) or consists of the amino acid sequence (SEQ ID NO: 10)
HVKGKHLCPSPLFPGPSKP.

5. The antibody of claim 1, wherein said antibody binds at a cleavage site for at least one protease, inhibits proteolytic cleavage by said at least one protease or both.

6. The antibody of claim 5, wherein said at least one protease is MMP-2, MMP-13, or a combination thereof.

7. A method of decreasing soluble CD28 (sCD28) levels, in a subject in need thereof, the method comprising administering to said subject an antibody of claim 5, thereby decreasing sCD28 levels in a subject.

8. The method of claim 7, wherein said subject's blood before said administering comprises at least 5 ng/ml sCD28.

9. A method of improving PD-1/PD-L1 based immunotherapy in a subject suffering from cancer, the method comprising administering to said subject an antibody of claim 1, wherein said cancer is selected from melanoma, head and neck cancer, non-small cell lung cancer, ovarian cancer, kidney cancer, gastric cancer and colorectal cancer, thereby improving PD-1/PD-L1 based immunotherapy in subject suffering from cancer.

10. A method of treating cancer in a subject in need thereof, the method comprising administering to said subject an antibody of claim 1, wherein said cancer is selected from melanoma, head and neck cancer, non-small cell lung cancer, ovarian cancer, kidney cancer, gastric cancer and colorectal cancer, thereby treating cancer in a subject in need thereof.

11. A pharmaceutical composition comprising the antibody of claim 1, and a pharmaceutically acceptable carrier, excipient or adjuvant.

12. A method of treating cancer in a subject in need thereof, the method comprising administering to said subject the pharmaceutical composition of claim 11, wherein said cancer is selected from melanoma, head and neck cancer, non-small cell lung cancer, ovarian cancer, kidney cancer, gastric cancer and colorectal cancer, thereby treating cancer in a subject.

13. A method of improving PD-1/PD-L1 based immunotherapy in a subject suffering from cancer, the method comprising administering to said subject the pharmaceutical composition of claim 11, wherein said cancer is selected from melanoma, head and neck cancer, non-small cell lung cancer, ovarian cancer, kidney cancer, gastric cancer and colorectal cancer, thereby improving PD-1/PD-L1 based immunotherapy in a subject suffering from cancer.

14. A method of decreasing sCD28 levels in a subject in need thereof, the method comprising administering to said subject the pharmaceutical composition of claim 11, thereby decreasing sCD28 levels in a subject.

15. A kit comprising at least one antibody of claim 1 and at least one of:
  a. an anti-PD-1 and/or PD-L1 immunotherapy; and
  b. a label stating the agent of the invention is for use with a PD-1 and/or PD-L1 based immunotherapy.

16. The antibody of claim 1, wherein said antibody is a camelid or shark antibody.

17. A method of generating a single domain antibody that inhibits proteolytic cleavage of mCD28 on a surface of a cell, comprising:
  I.
    a. obtaining a single domain antibody that binds to a CD28 extracellular domain or fragment thereof by:
      i. immunizing a shark or camelid with said CD28 extracellular domain or fragment thereof and collecting antibodies from said immunized organism; or
      ii. screening a library of single domain antibodies for binding to a CD28 extracellular domain or fragment thereof and selecting a single domain antibody that binds;
    b. testing binding of said obtained single domain antibody to mCD28 on a cell surface;
    c. selecting a single domain antibody that binds cell surface mCD28;
    d. testing an ability of said selected single domain antibody to block cleavage by a protease of mCD28 on a cell surface; and
    e. selecting a single domain antibody that blocks cleavage by said protease;
    or
  II.
    culturing a host cell comprising one or more vectors comprising a nucleic acid sequence encoding a single domain antibody, wherein the nucleic acid sequence encoding said single domain antibody was selected by:
      i. obtaining a single domain antibody that binds to a CD28 extracellular domain or fragment thereof;
      ii. testing binding of said obtained single domain antibody to mCD28 on a cell surface;
      iii. selecting a single domain antibody that binds cell surface mCD28;
      iv. testing an ability of selected said single domain antibody to block cleavage by a protease of mCD28 on a cell surface; and
      v. selecting a single domain antibody that blocks cleavage by said protease;
    thereby generating a single domain antibody that inhibits proteolytic cleavage of mCD28 on a surface of a cell.

18. The method of claim 17, wherein said protease is selected from MMP-2 and MMP-13.

19. The method of claim 17, further comprising assaying mCD28 downstream signaling in the presence of said obtained single domain antibody and selecting at least one single domain antibody that neither substantially agonizes nor substantially antagonizes mCD28 signaling.

20. A single domain antibody produced by the method of claim 17.

* * * * *